(12) United States Patent
Nakahara et al.

(10) Patent No.: US 8,547,142 B2
(45) Date of Patent: Oct. 1, 2013

(54) POWER SEMICONDUCTOR DEVICE AND OPERATION METHOD THEREOF

(75) Inventors: Akihiro Nakahara, Kanagawa (JP); Sakae Nakajima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 116 days.

(21) Appl. No.: 13/317,029

(22) Filed: Oct. 7, 2011

(65) Prior Publication Data

US 2012/0098587 A1    Apr. 26, 2012

(30) Foreign Application Priority Data

Oct. 25, 2010   (JP) ................. 2010-238981
Oct. 25, 2010   (JP) ................. 2010-239020
Oct. 25, 2010   (JP) ................. 2010-239065
Aug. 24, 2011   (JP) ................. 2011-183036

(51) Int. Cl.
    *H03K 3/00*    (2006.01)
(52) U.S. Cl.
    USPC ................. 327/108; 327/112; 361/91.2
(58) Field of Classification Search
    USPC ................. 327/108, 112; 361/91.2
    See application file for complete search history.

(56) References Cited

U.S. PATENT DOCUMENTS

| 7,046,073 B2 * | 5/2006 | Mayama et al. ............... 327/434 |
| 7,088,126 B2 * | 8/2006 | Nakahara et al. .............. 326/26 |
| 8,373,494 B2 * | 2/2013 | Soma et al. ................... 327/427 |
| 2002/0140466 A1 | 10/2002 | Nakahara et al. |

FOREIGN PATENT DOCUMENTS

| JP | 6-097375 A | 4/1994 |
| JP | 2002-290221 A | 10/2002 |

* cited by examiner

*Primary Examiner* — Kenneth B. Wells
(74) *Attorney, Agent, or Firm* — McGinn IP Law Group, PLLC

(57) ABSTRACT

A power semiconductor device has: an output transistor connected between a power-supply terminal and an output terminal; a gate charge-discharge circuit configured to charge/discharge a first node connected to a gate of the output transistor to ON/OFF control the output transistor; a short switch circuit connected between the first node and the output terminal; and a short control circuit configured to control the short switch circuit. In the turn-ON period, the ON period and the turn-OFF period, the short control circuit cuts off electrical connection between the first node and the output terminal through the short switch circuit. In the OFF period, the short control circuit electrically connects the first node and the output terminal through the short switch circuit.

20 Claims, 48 Drawing Sheets

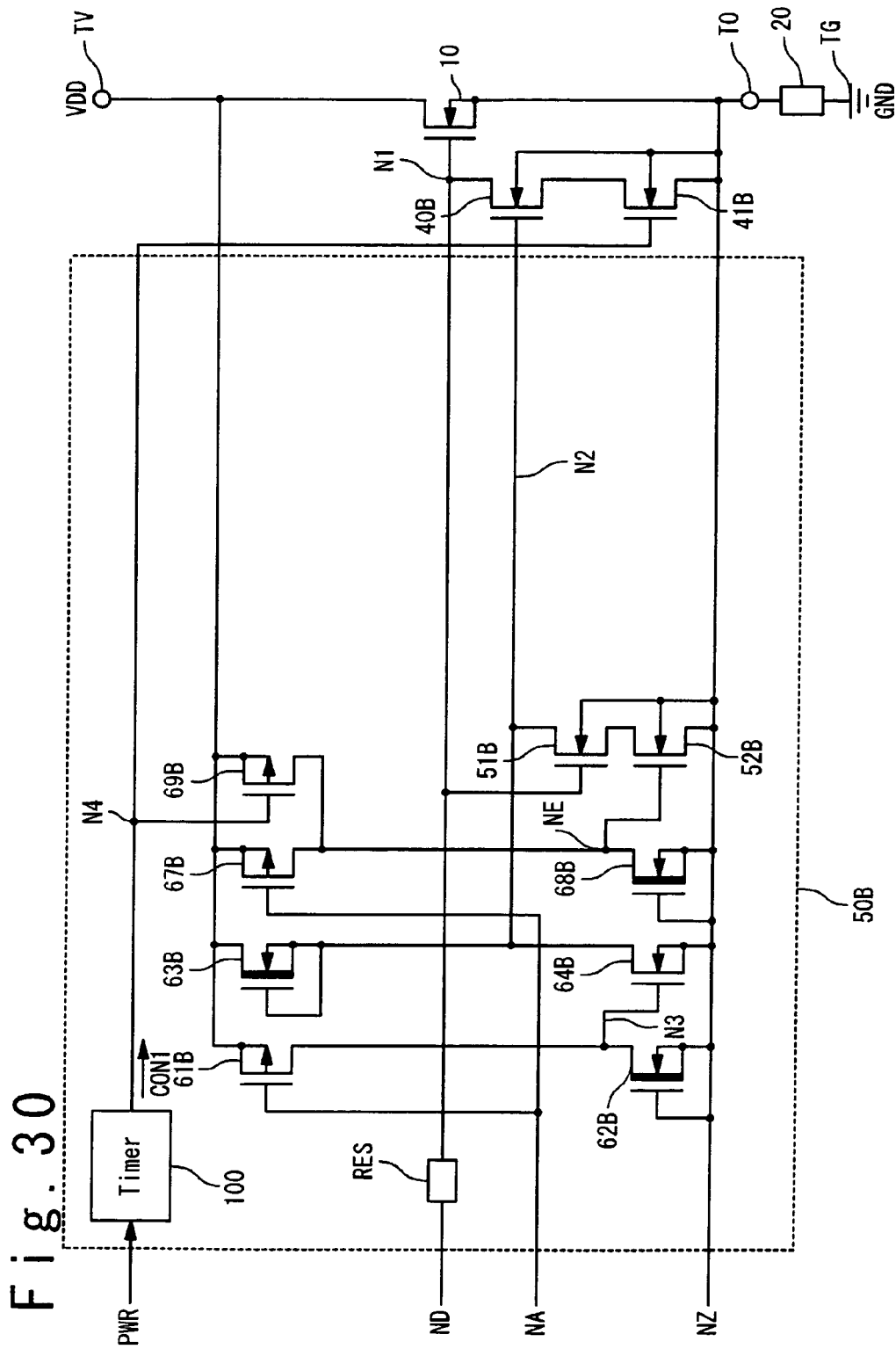

POWER SEMICONDUCTOR DEVICE AND OPERATION METHOD THEREOF

This application is based upon and claims the benefit of priority from Japanese patent applications No. 2010-238981 filed on Oct. 25, 2010, No. 2010-239020 filed on Oct. 25, 2010, No. 2010-239065 filed on Oct. 25, 2010 and No. 2011-183036 filed on Aug. 24, 2011, the disclosure of which is incorporated herein in its entirety by reference.

BACKGROUND OF THE INVENTION

1. Field of the Invention

The present invention relates to a power semiconductor device and an operation method thereof.

2. Description of Related Art

A power semiconductor device for supplying power to a load is known. For example, a power semiconductor device called IPD (Intelligent Power Device) is used in an electronic control system of a vehicle and controls electric power supply to a headlight and the like in accordance with an instruction from a microcomputer. In such a power semiconductor device, a high-side switch is typically used (for example, refer to Patent Literature 1 (Japan Patent Publication JP-H06-97375) and Patent Literature 2 (Japan Patent Publication JP-2002-290221)).

FIG. 1 shows a configuration of a power semiconductor device described in Patent Literature 1. The power semiconductor device has a power-supply terminal TV, an input terminal TI, an output terminal TO, an output transistor 10 and a gate charge-discharge circuit 30. A power-supply voltage VDD is supplied to the power-supply terminal TV. A power-ON signal PWR is supplied to the input terminal TI. In response to activation of the power-ON signal PWR, the power semiconductor device outputs power from the output terminal TO.

The output transistor 10 is connected between the power-supply terminal TV and the output terminal TO. More specifically, the output transistor 10 is an N-channel MOSFET and its gate, drain and source are respectively connected to a node ND, the power-supply terminal TV and the output terminal TO. The output terminal TO is connected to one end of a load 20, and the other end of the load 20 is connected to a ground terminal TG. In this manner, the output transistor 10 is so connected as to function as a high-side switch.

The gate charge-discharge circuit 30 charges and discharges the node ND and thereby ON/OFF controls the output transistor 10. More specifically, the gate charge-discharge circuit 30 has a control input circuit 31, a booster circuit 32, a discharge transistor (discharge switch) 33 and diodes 34 and 35. The control input circuit 31 controls the booster circuit 32 and the discharge transistor 33 depending on the power-ON signal PWR. The booster circuit 32 charges the node ND to a high voltage higher than the power-supply voltage VDD. The discharge transistor 33 is an N-channel MOSFET and its gate, back gate, source and drain are respectively connected to a node NA, a node NB, a node NC and the node ND. An anode and a cathode of the diode 34 are respectively connected to the node NC and a ground terminal. An anode and a cathode of the diode 35 are respectively connected to the node NC and the output terminal TO.

When the power-ON signal PWR is activated, the control input circuit 31 activates the booster circuit 32 and also supplies a Low-level signal to the node NA to turn OFF the discharge transistor 33. The booster circuit 32 charges the node ND to the high voltage higher than the power-supply voltage VDD. As a result, the output transistor 10 is turned ON and power is supplied to the load 20.

When the power-ON signal PWR is deactivated, the control input circuit 31 deactivates the booster circuit 32 and also supplies a High-level signal to the node NA. Thus, the booster circuit 32 stops operation and the discharge transistor 33 is turned ON. As a result, the node ND is discharged and the output transistor 10 is turned OFF. It should be noted that when a voltage of the node ND becomes a voltage that is higher than the ground voltage GND by a forward voltage drop (VF) of the diode 34 or the diode 35, the discharging through the discharge transistor 33 stops.

CITATION LIST

[Patent Literature 1] Japan Patent Publication JP-H06-97375
[Patent Literature 2] Japan Patent Publication JP-2002-290221

SUMMARY

The inventor of this application has recognized the following problem. That is, in a case where the power semiconductor device as mentioned above is formed on a single semiconductor substrate, thermal breakdown of the output transistor 10 may be caused due to surge voltage externally applied. This problem is described below in more detail.

In the power semiconductor device as mentioned above, it is desirable that ON resistance of the output transistor 10 (power MOSFET) is sufficiently low. For that purpose, a sufficiently high driving voltage needs to be applied to the node ND connected to the gate of the output transistor 10. Since such the high voltage is applied to the node ND, a high-voltage MOSFET is usually used as the discharge transistor 33. FIG. 2 shows a cross-sectional structure of an example of the output transistor 10 and the discharge transistor 33. The discharge transistor 33 has a high-voltage MOSFET structure.

The discharge transistor 33 has a vertical-type parasitic bipolar transistor as shown in FIG. 2. FIG. 3 shows a circuit configuration including the parasitic bipolar transistor. As shown in FIG. 3, the drain and the back gate of the discharge transistor 33 are respectively connected to the node ND and the node NB, and a collector, an emitter and a base of the parasitic bipolar transistor Q1 are respectively connected to the power-supply terminal TV, the node ND and the node NB. Moreover, a parasitic capacitor (collector-base capacitor) C1 is formed between the power-supply terminal TV and the node NB.

Here, let us consider a case where steep rise in the power-supply voltage VDD occurs at a time when the power semiconductor device (output transistor 10) is in the OFF state. In the OFF state, the node NB (the back gate of the discharge transistor 33) is in a high-impedance state. Therefore, when steep rise in the power-supply voltage VDD occurs, a voltage of the node NB (base voltage of the parasitic bipolar transistor Q1) rises through the parasitic capacitor C1. As a result, the parasitic bipolar transistor Q1 is turned ON. At this time, if a collector-emitter voltage VCE is higher than a breakdown voltage BVCEO, a breakdown current flows. FIG. 4 shows current-voltage characteristics of the parasitic bipolar transistor Q1. It can be seen that a breakdown current flows if the collector-emitter voltage VCE exceeds the breakdown voltage BVCEO.

Due to the breakdown current, the voltage of the node ND connected to the gate of the output transistor 10 rises and accordingly the output transistor 10 is turned ON. However, at this time, the output transistor 10 is turned ON with a high ON resistance (half ON). In this case, overmuch power is applied to the output transistor 10, which may cause thermal breakdown.

For example, the power-supply terminal TV of the power semiconductor device installed in a vehicle is connected to a battery. In this case, the steep rise in the power-supply voltage VDD is exemplified by "dump surge" as shown in FIG. 5. The dump surge is surge that is generated at the power-supply terminal TV when the battery is disconnected during electric power generation by an alternator. If the dump surge is applied to the power-supply terminal TV, the parasitic bipolar transistor Q1 operates due to the above-mentioned reasons and thus the thermal breakdown of the output transistor 10 may be caused.

As described above, if steep rise in the power-supply voltage occurs when the power semiconductor device is in the OFF state, the half ON and hence the thermal breakdown of the output transistor may be caused. A technique is desired that can prevent the output transistor from being turned ON, even if steep rise in the power-supply voltage occurs when the power semiconductor device is in the OFF state.

In an aspect of the present invention, a power semiconductor device is provided. The power semiconductor device has: an output transistor connected between a power-supply terminal and an output terminal; a gate charge-discharge circuit configured to charge and discharge a first node connected to a gate of the output transistor to ON/OFF control the output transistor; a short switch circuit connected between the first node and the output terminal; and a short control circuit configured to control the short switch circuit. A period when the output transistor is stably in an ON-state after the first node is charged is an ON period. A period when the output transistor is stably in an OFF-state after the first node is discharged is an OFF period. A transition period from the OFF period to the ON period is a turn-ON period. A transition period from the ON period to the OFF period is a turn-OFF period. In the turn-ON period, the ON period and the turn-OFF period, the short control circuit cuts off electrical connection between the first node and the output terminal through the short switch circuit. In the OFF period, the short control circuit electrically connects the first node and the output terminal through the short switch circuit.

According to the present invention, it is possible to prevent the output transistor from being turned ON, even if steep rise in the power-supply voltage occurs when the power semiconductor device is in the OFF state. Furthermore, the mechanism according to the present invention has no impact on characteristics relating to turning-ON/turning-OFF of the output transistor.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 30 is a circuit diagram showing a fourth example of a configuration of the short control circuit according to the second embodiment of the present invention;

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

<Basic Configuration>

Figure 6:
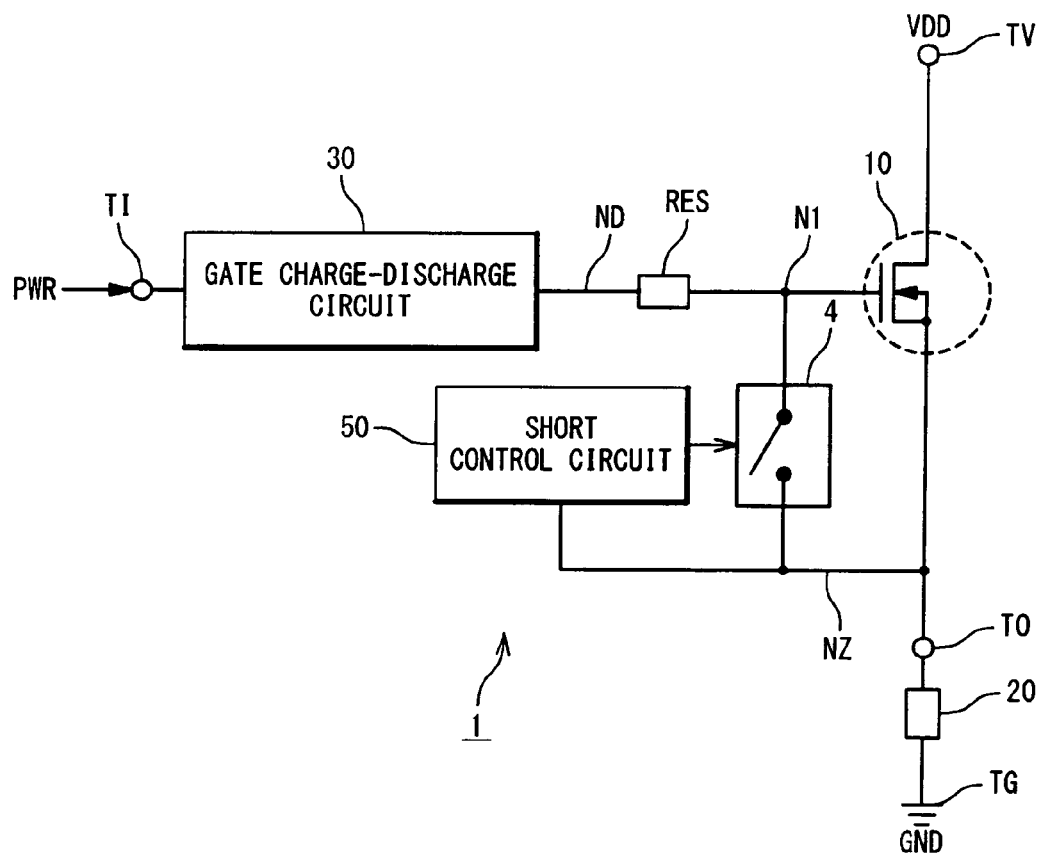
FIG. 6 is a block diagram schematically showing a power semiconductor device according to an embodiment of the present invention.

FIG. 6 is a block diagram schematically showing a configuration of a power semiconductor device 1 according to an embodiment of the present invention. The power semiconductor device 1 has a power-supply terminal TV, an input terminal TI and an output terminal TO. The output terminal TO is connected to one end of a load 20, and the other end of the load 20 is connected to a ground terminal TG. A power-supply voltage VDD is supplied to the power-supply terminal TV. A power-ON signal PWR is input to the input terminal TI. In response to activation of the power-ON signal PWR, the power semiconductor device 1 is turned ON and supplies power to the load 20 through the output terminal TO.

More specifically, the power semiconductor device 1 has an output transistor 10 and a gate charge-discharge circuit 30. The output transistor 10 is connected between the power-supply terminal TV and the output terminal TO. More specifically, the output transistor 10 is an N-channel MOSFET and its gate, drain and source are respectively connected to a first node N1, the power-supply terminal TV and the output terminal TO (output node NZ). It should be noted that the output node NZ has the same potential as that of the output terminal TO and is treated as being equivalent to the output terminal TO.

The first node N1 connected to the gate of the output transistor 10 is connected to a node ND through a resistance element RES. The node ND is connected to an output terminal of the gate charge-discharge circuit 30. That is, the output of the gate charge-discharge circuit 30 is connected to the first node N1 through the resistance element RES.

The gate charge-discharge circuit 30 charges and discharges the node ND namely the first node N1 and thereby ON/OFF controls the output transistor 10. For example, the gate charge-discharge circuit 30 has the same configuration as that shown in the foregoing FIG. 1. When the power-ON signal PWR is activated, the gate charge-discharge circuit 30 charges the node ND (i.e. the first node N1) to a high voltage higher than the power-supply voltage VDD. As a result, the output transistor 10 is turned ON and power is supplied to the load 20. On the other hand, when the power-ON signal PWR is deactivated, the gate charge-discharge circuit 30 discharges the node ND (i.e. the first node N1). As a result, the output transistor 10 is turned OFF.

The power semiconductor device 1 according to the present embodiment further has a short switch circuit 4 and a short control circuit 50. The short switch circuit 4 is provided for short-circuiting the gate and the source of the output transistor 10 as necessary. That is, the short switch circuit 4 is connected between the first node N1 and the output node NZ. By controlling the short switch circuit 4, it is possible to turn ON/OFF electrical connection between the first node N1 and the output node NZ through the short switch circuit 4. It is the short control circuit 50 that controls the short switch circuit 4.

<Basic Operation>

Figure 7:
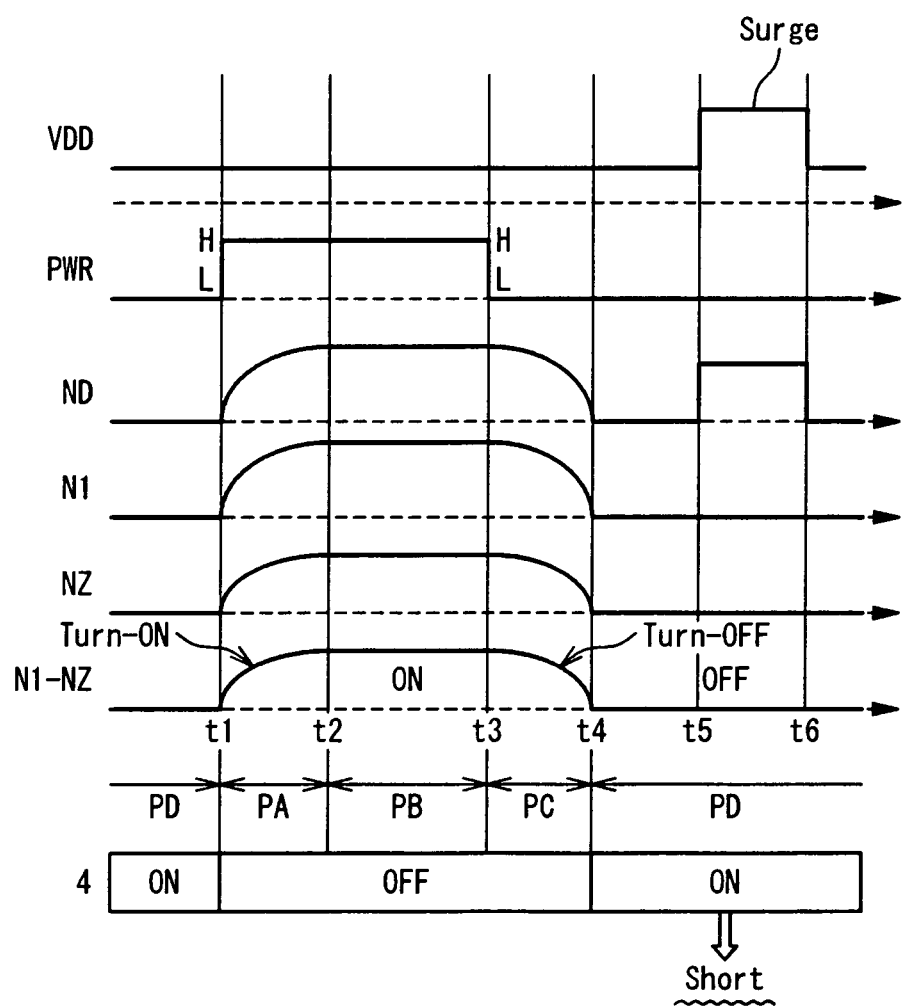
FIG. 7 is a timing chart showing an operation of the power semiconductor device according to the embodiment of the present invention.

FIG. 7 is a timing chart showing an operation of the power semiconductor device 1 according to the present embodiment. A basic operation of the power semiconductor device 1 will be described hereinafter with reference to FIGS. 6 and 7. In describing the operation, let us consider four periods (phases): a turn-ON period PA, an ON period PB, a turn-OFF period PC and an OFF period PD.

The turn-ON period PA and the ON period PB are periods when the power-ON signal PWR is being activated (PWR=High-level). When the power-ON signal PWR is activated, the first node N1 is charged, the output transistor 10 is turned ON and the output node NZ also is charged. The ON period PB is a period when voltages of the first node N1 and the output node NZ are stable and the output transistor 10 is stably in an ON-state. On the other hand, the turn-ON period PA is a period from the activation timing of the power-ON signal PWR to the ON period PB. In other words, the turn-ON period PA is a transition period from the OFF period PD to the ON period PB.

The turn-OFF period PC and the OFF period PD are periods when the power-ON signal PWR is being deactivated (PWR=Low-level). When the power-ON signal PWR is deactivated, the first node N1 is discharged, the output transistor 10 is turned OFF and the output node NZ also is discharged. The OFF period PD is a period when voltages of the first node N1 and the output node NZ are stable and the output transistor 10 is stably in an OFF-state. On the other hand, the turn-OFF period PC is a period from the deactivation timing of the power-ON signal PWR to the OFF period PD. In other words, the turn-OFF period PC is a transition period from the ON period PB to the OFF period PD.

(Turn-ON Period PA: from Time t1 to t2)

At a time t1, the power-ON signal PWR is activated and changed from the Low-level to the High-level. In response to that, the gate charge-discharge circuit 30 starts to charge the node ND and the first node N1. In the turn-ON period PA, the short control circuit 50 turns OFF (cuts off) electrical connection between the first node N1 and the output node NZ through the short switch circuit 4. The output transistor 10 is turned ON and thus a voltage of the output node NZ is increased gradually. It should be noted that in the turn-ON period PA, the first node N1 is charged to a high voltage higher than the power-supply voltage VDD.

(ON Period PB: from Time t2 to t3)

In the ON period PB, the short control circuit 50 maintains the OFF-state of the electrical connection between the first node N1 and the output node NZ through the short switch circuit 4. The voltage of the first node N1 is stable at the high voltage higher than the power-supply voltage VDD. The voltage of the output node NZ is stable at near the power-supply voltage VDD. The output transistor 10 is stably in the ON-state.

(Turn-OFF Period PC: from Time t3 to t4)

At a time t3, the power-ON signal PWR is deactivated and changed from the High-level to the Low-level. In response to that, the gate charge-discharge circuit 30 starts to discharge the node ND and the first node N1. Also in the turn-OFF period PC, the short control circuit 50 maintains the OFF-state of the electrical connection between the first node N1 and the output node NZ through the short switch circuit 4. Therefore, discharging through the short switch circuit 4 does not occur. That is, the discharging of the first node N1 is achieved only by the gate charge-discharge circuit 30, as in the conventional case. In response to decrease in the voltage of the first node N1, the voltage of the output node NZ also is gradually decreased and eventually becomes 0 V. The output transistor 10 is turned OFF.

(OFF Period PD: from Time t4)

In at least a part of the OFF period PD, the short control circuit 50 turns ON (activates) the electrical connection between the first node N1 and the output node NZ through the short switch circuit 4. Therefore, the first node N1 and the output node NZ are short-circuited, namely, the gate and the source of the output transistor 10 are short-circuited. The output transistor 10 is stably in the OFF-state.

In this manner, the short control circuit 50 turns ON (activates) the electrical connection between the first node N1 and the output node NZ through the short switch circuit 4, only in the OFF period PD. In the other periods PA to PC, the short control circuit 50 turns OFF (cuts off) the electrical connection between the first node N1 and the output node NZ through the short switch circuit 4. This period when the electrical connection between the first node N1 and the output node NZ through the short switch circuit 4 is turned OFF is not equal to a period when the power-ON signal PWR is activated. That is, the short control circuit 50 does not simply ON/OFF control the short switch circuit 4 in synchronization with the power-ON signal PWR. The short control circuit 50 maintains the OFF-state of the electrical connection between the first node N1 and the output node NZ through the short switch circuit 4, not only in the turn-ON period PA and the ON period PB but also in the turn-OFF period PC. As a result, discharging of the first node N1 through the short switch circuit 4 is prevented in the turn-OFF period PC. That is, the short switch circuit 4 and the short control circuit 50 according to the present embodiment have no impact on characteristics relating to the turning-OFF of the output transistor 10 (e.g. a time required for the turning-OFF).

<Operation at Time of Application of Dump Surge>

Next, let us consider a case where steep rise in the power-supply voltage VDD occurs in the OFF period PD, due to application of dump surge and the like. In the example shown in FIG. 7, dump surge is applied to the power-supply terminal TV from time t5 to t6 during the OFF period PD.

Figure 1:
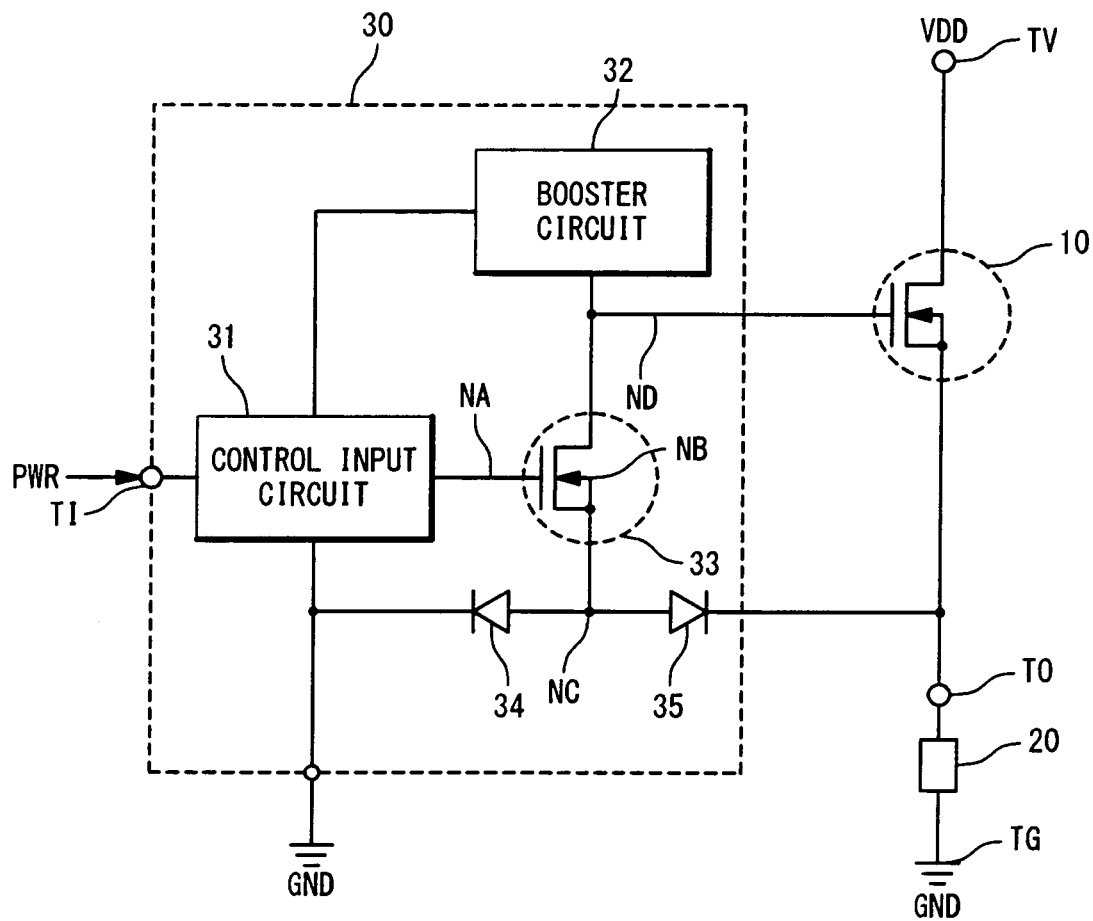
FIG. 1 is a circuit diagram showing a configuration of a power semiconductor device according to a related technique.
Figure 2:
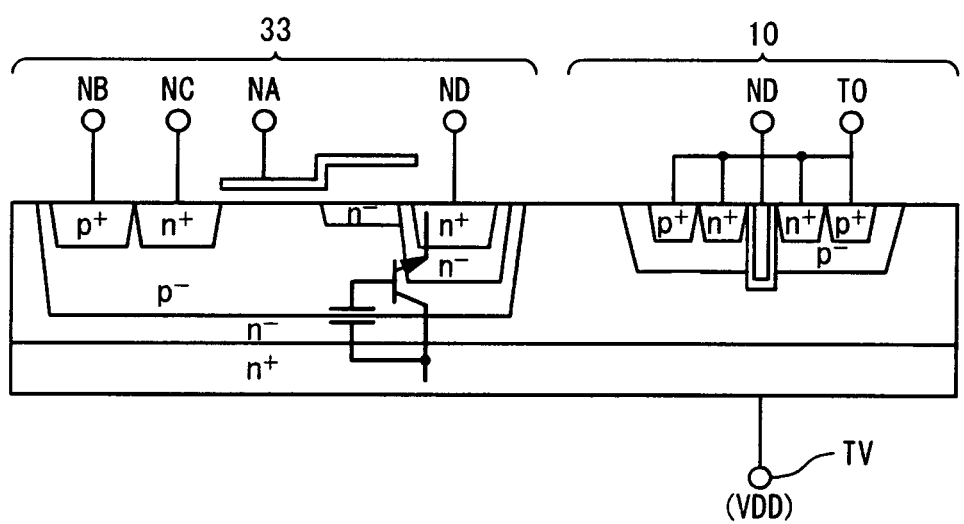
FIG. 2 is a schematic diagram showing a typical cross-sectional structure of an output transistor and a discharge transistor.
Figure 3:
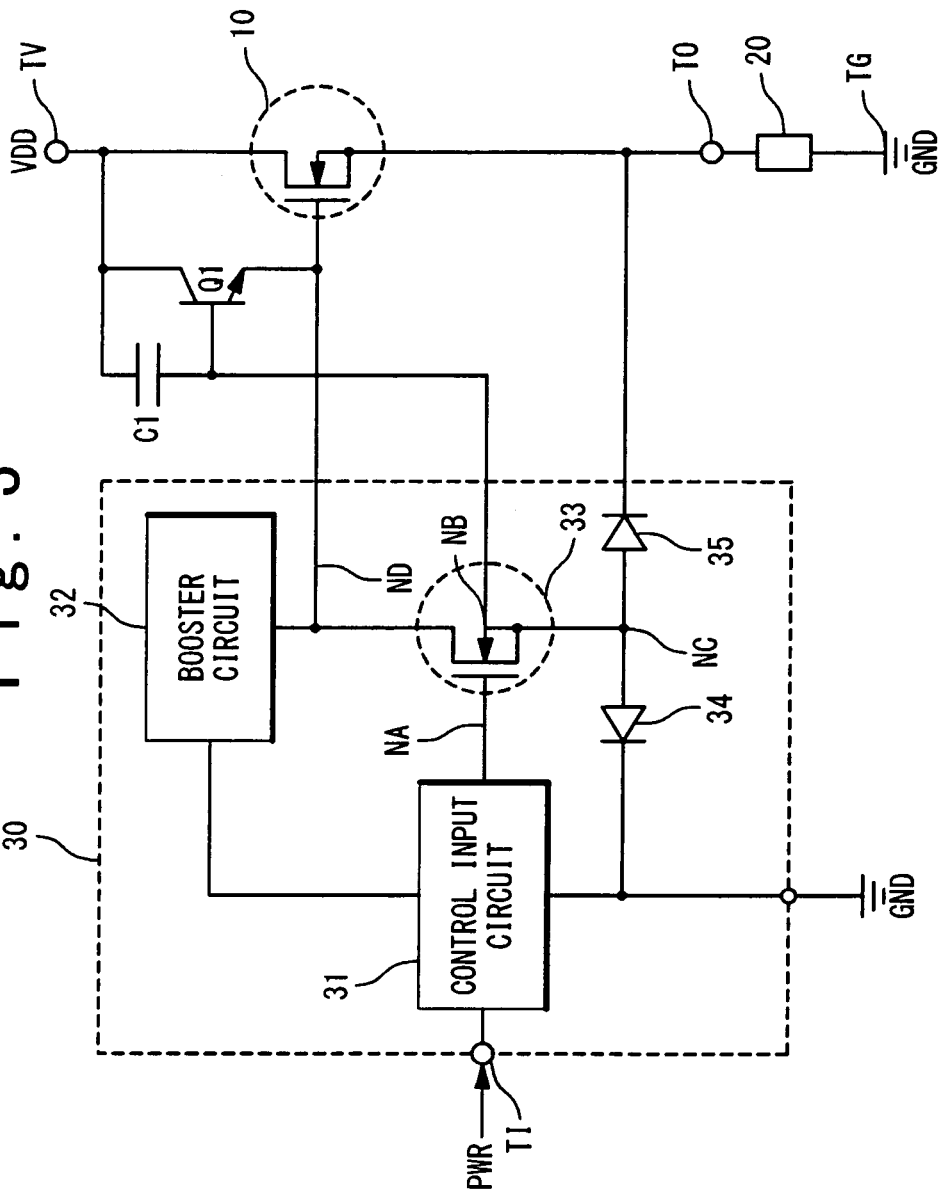
FIG. 3 is a circuit diagram showing a configuration of a power semiconductor device including a parasitic bipolar transistor.
Figure 4:
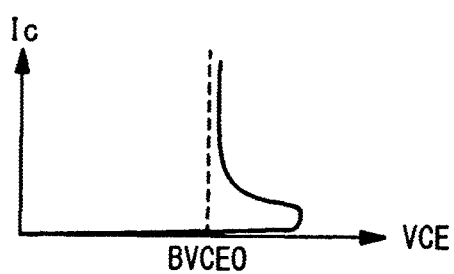
FIG. 4 is a graph showing current-voltage characteristics of the parasitic bipolar transistor.
Figure 5:
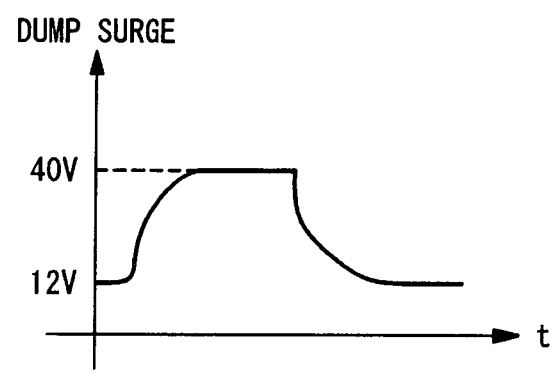
FIG. 5 is a conceptual diagram showing dump surge applied to a power-supply terminal of a power semiconductor device of a vehicle.
Figure 8:
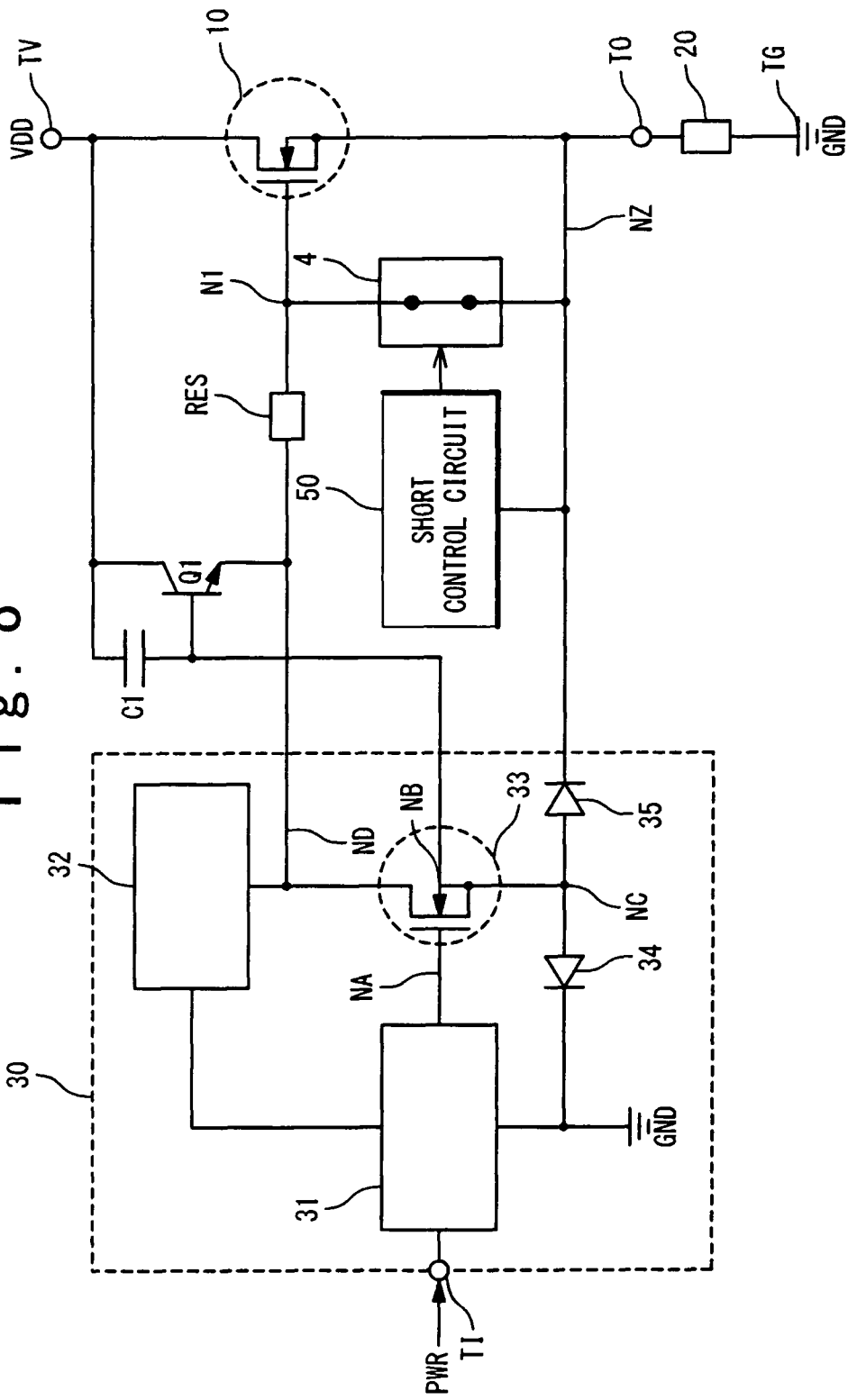
FIG. 8 is a circuit diagram for explaining an operation of the power semiconductor device at a time when dump surge is applied.

FIG. 8 shows a case where the gate charge-discharge circuit 30 has the same configuration as that shown in the foregoing FIGS. 1 and 3. The discharge transistor 33 of the gate charge-discharge circuit 30 has the parasitic bipolar transistor Q1, as described above. The collector, the emitter and the base of the parasitic bipolar transistor Q1 are respectively connected to the power-supply terminal TV, the node ND and the node NB. Moreover, the parasitic capacitor (collector-base capacitor) C1 is connected between the power-supply terminal TV and the node NB.

In the case where steep rise in the power-supply voltage VDD occurs during the OFF period PD, the parasitic bipolar transistor Q1 may be turned ON as described above. If the parasitic bipolar transistor Q1 is turned ON, the voltage of the node ND is increased. However, in the OFF period PD, the electrical connection through the short switch circuit 4 is turned ON, and thus the first node N1 and the output node NZ are short-circuited, namely, the gate and the source of the output transistor 10 are short-circuited. Since the gate-source voltage does not exceed a threshold voltage, the output transistor 10 maintains the OFF-state without being turned ON.

It should be noted that the resistance element RES is provided between the node ND and the first node N1. If the voltage of the node ND rises, a current flows from the node ND through the resistance element RES, the first node N1 and the short switch circuit 4 to the output node NZ. At this time, IR drop occurs at the resistance element RES and accordingly the voltage of the first node N1 is maintained at the Low-level. That is to say, using the resistance element RES makes it easier to maintain the voltage of the first node N1 at the Low-level.

<Effects>

According to the present embodiment, the electrical connection between the first node N1 and the output node NZ through the short switch circuit 4 is turned ON in the OFF period PD. As a result, the first node N1 and the output node NZ are short-circuited, namely, the gate and the source of the output transistor 10 are short-circuited. Therefore, even if steep rise in the power-supply voltage VDD occurs, the output transistor 10 is prevented from being turned ON. That is, thermal breakdown of the output transistor 10 can be prevented.

Moreover, according to the present embodiment, the electrical connection between the first node N1 and the output node NZ through the short switch circuit 4 is maintained in the OFF-state in the period other than the OFF period PD. Therefore, in the period other than the OFF period PD, the short switch circuit 4 and the short control circuit 50 do not affect the first node N1. In other words, the short switch circuit 4 and the short control circuit 50 have no impact on characteristics relating to turning-ON/turning-OFF of the output transistor 10 (e.g. times required for the turning-ON/turning-OFF). That is, according to the present embodiment, it is possible to prevent the thermal breakdown of the output transistor 10 without affecting the characteristics relating to turning-ON/turning-OFF.

Hereinafter, various embodiments of the present invention will be described.

1. First Embodiment

Figure 9:
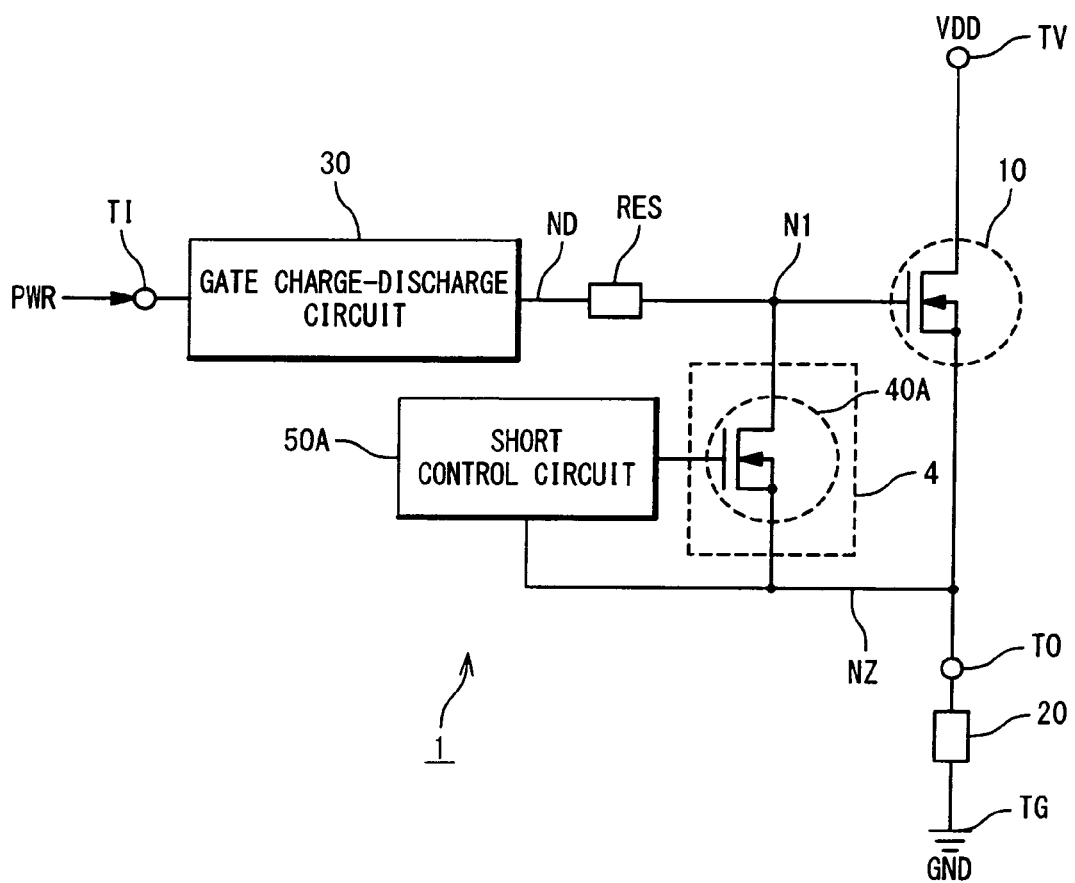
FIG. 9 is a block diagram schematically showing a configuration of a power semiconductor device according to a first embodiment of the present invention.

FIG. 9 is a block diagram schematically showing a configuration of the power semiconductor device 1 according to a first embodiment. In the first embodiment, the short switch circuit 4 includes a short switch 40A that is connected between the first node N1 and the output node NZ. The short control circuit 50 in the first embodiment is referred to as a short control circuit 50A. The short control circuit 50A can turn ON/OFF the electrical connection between the first node N1 and the output node NZ through the short switch circuit 4 by ON/OFF controlling the short switch 40A.

Figure 10:
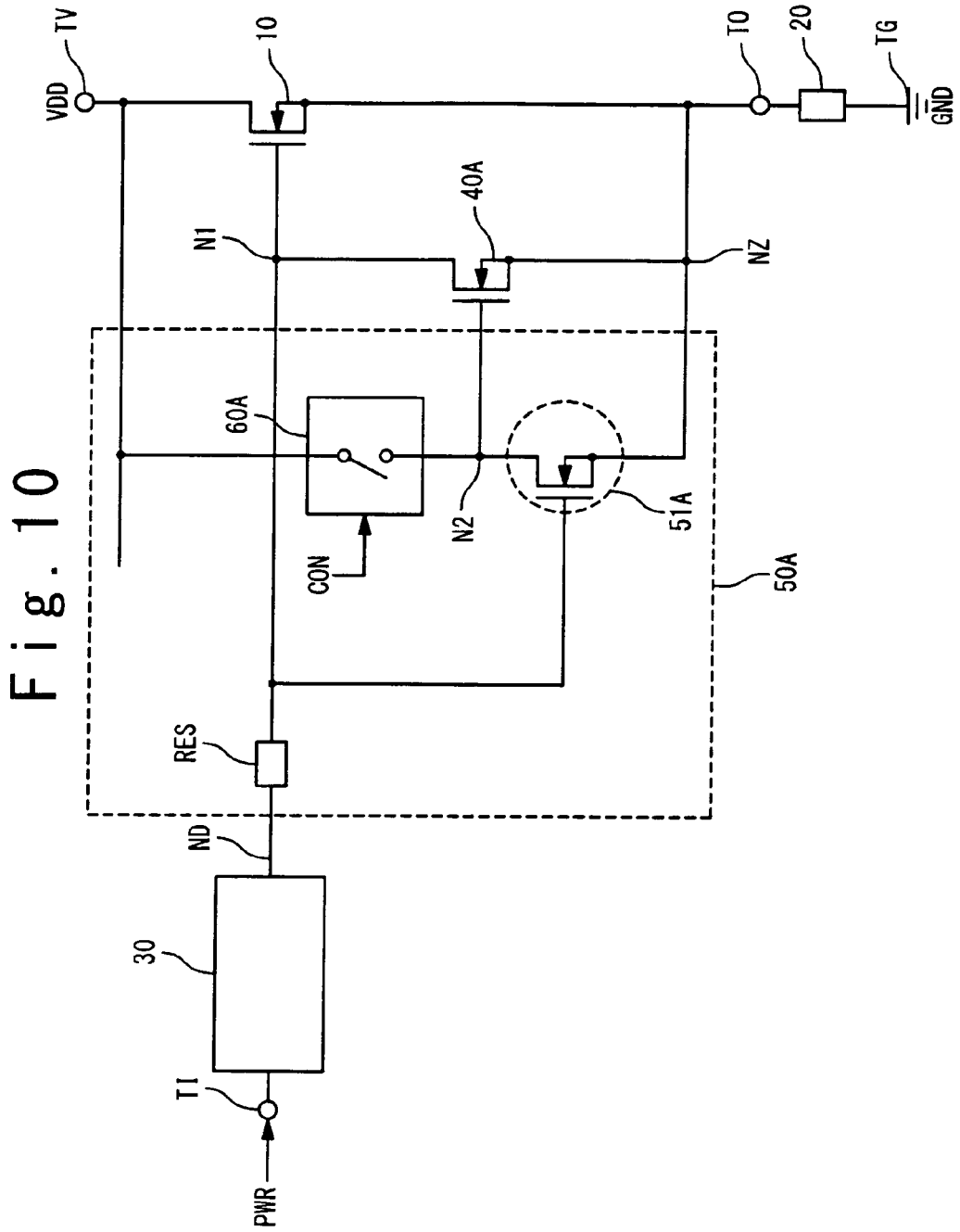
FIG. 10 is a circuit diagram schematically showing a configuration of a short control circuit according to the first embodiment of the present invention.

FIG. 10 schematically shows a configuration of the short switch 40A and the short control circuit 50A according to the first embodiment. For example, an N-channel MOSFET (hereinafter referred to as a "short transistor 40A") is used as the short switch 40A. A source, a drain and a gate of the short transistor 40A are respectively connected to the output node NZ, the first node N1 and a second node N2. It is possible to ON/OFF control the short transistor 40A by controlling a voltage of the second node N2.

The short control circuit 50A is connected to the second node N2 and controls the voltage of the second node N2. Specifically, the short control circuit 50A has a first switch 51A connected between the second node N2 and the output node NZ and a power-supply connection circuit 60A connected between the second node N2 and the power-supply terminal TV. The first switch 51A controls electrical connection between the second node N2 and the output node NZ. The power-supply connection circuit 60A controls electrical connection between the second node N2 and the power-supply terminal TV, depending on a control signal CON.

In the turn-ON period PA, the ON period PB and the turn-OFF period PC, the short control circuit 50A turns ON the first switch 51A. Accordingly, the second node N2 and the output node NZ are short-circuited, namely, the gate and the source of the short transistor 40A are short-circuited. As a result, the short transistor 40A is maintained in the OFF-state. On the other hand, in the OFF period PD, the short control circuit 50A turns OFF the first switch 51A to cut off the electrical connection between the second node N2 and the output node NZ. Moreover, the power-supply connection circuit 60A electrically connects the second node N2 and the power-supply terminal TV. As a result, the power-supply voltage VDD is applied to the second node N2 and the short transistor 40A is turned ON. In this manner, the above-mentioned ON/OFF control of the short transistor 40A can be achieved.

Figure 11:
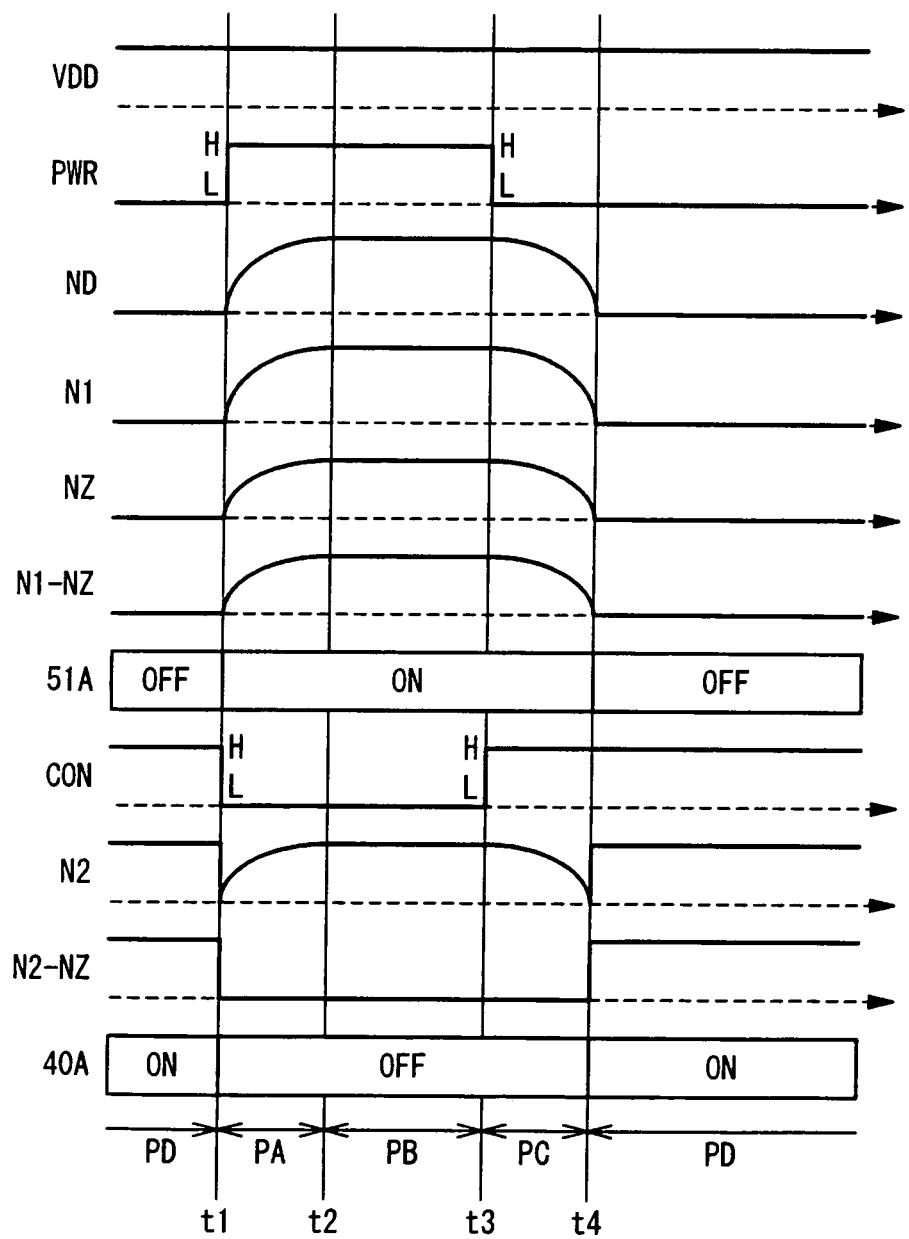
FIG. 11 is a timing chart showing an operation of the short control circuit according to the first embodiment of the present invention.

For example, an N-channel MOSFET as shown in FIG. 10 is used as the first switch 51A. A gate, a source and a drain of the N-channel MOSFET 51A are respectively connected to the first node N1, the output node NZ and the second node N2. An operation of the short control circuit 50A thus configured will be described with reference to FIG. 11. It should be noted that an overlapping description with the foregoing FIG. 7 will be omitted as appropriate.

(Turn-ON Period PA: from Time t1 to t2)

At a time t1, the power-ON signal PWR is activated and changed from the Low-level to the High-level. In response to that, the control signal CON is changed from the High-level to the Low-level. In a case where the control signal CON is at the Low-level, the power-supply connection circuit 60A cuts off the electrical connection between the second node N2 and the power-supply terminal TV. Meanwhile, the voltages of the first node N1 and the output node NZ increase gradually as mentioned above. The voltage of the first node N1 boosted by the booster circuit 32 is higher than the voltage of the output node NZ and a voltage difference (N1−NZ) is generated between the nodes. That is, a certain level of voltage is applied between the gate and the source of the N-channel MOSFET 51A and thus the N-channel MOSFET 51A is turned ON. As a result, the second node N2 and the output node NZ are electrically connected with each other and accordingly the short transistor 40A is turned OFF.

(ON Period PB: from Time t2 to t3)

The N-channel MOSFET 51A is maintained in the ON-state and the short transistor 40A is maintained in the OFF-state.

(Turn-OFF Period PC: from Time t3 to t4)

At a time t3, the power-ON signal PWR is deactivated and changed from the High-level to the Low-level. In response to that, the control signal CON is changed from the Low-level to the High-level. In a case where the control signal CON is at the High-level, the power-supply connection circuit 60A electrically connects the second node N2 and the power-supply terminal TV. However, even in the turn-OFF period PC, a certain level of voltage difference (N1−NZ) is present between the first node N1 and the output node NZ and thus the N-channel MOSFET 51A is maintained in the ON-state. That is, the second node N2 and the output node NZ are still electrically connected with each other. Since current capability of the N-channel MOSFET 51A is designed to be sufficiently high, a voltage difference (N2−NZ) between the gate and the source of the short transistor 40A is maintained sufficiently low. Therefore, the short transistor 40A is maintained in the OFF-state.

(OFF Period PD: from Time t4)

When the voltage difference (N1−NZ) between the first node N1 and the output node NZ becomes lower than a threshold voltage of the N-channel MOSFET 51A after the discharging of the first node N1 and the output node NZ has proceeded, the N-channel MOSFET 51A is turned OFF. That is, the electrical connection between the second node N2 and the output node NZ is cut off. As a result, the power-supply voltage VDD is applied to the node N2 and accordingly the short transistor 40A is turned ON.

In this manner, the above-mentioned ON/OFF control of the short transistor 40A can be achieved by using the N-channel MOSFET 51A whose gate is connected to the first node N1.

Hereinafter, various examples of the configuration of the short control circuit 50A according to the first embodiment will be described. It should be noted that an overlapping description with the above will be omitted as appropriate.

1-1. First Example

Figure 12:
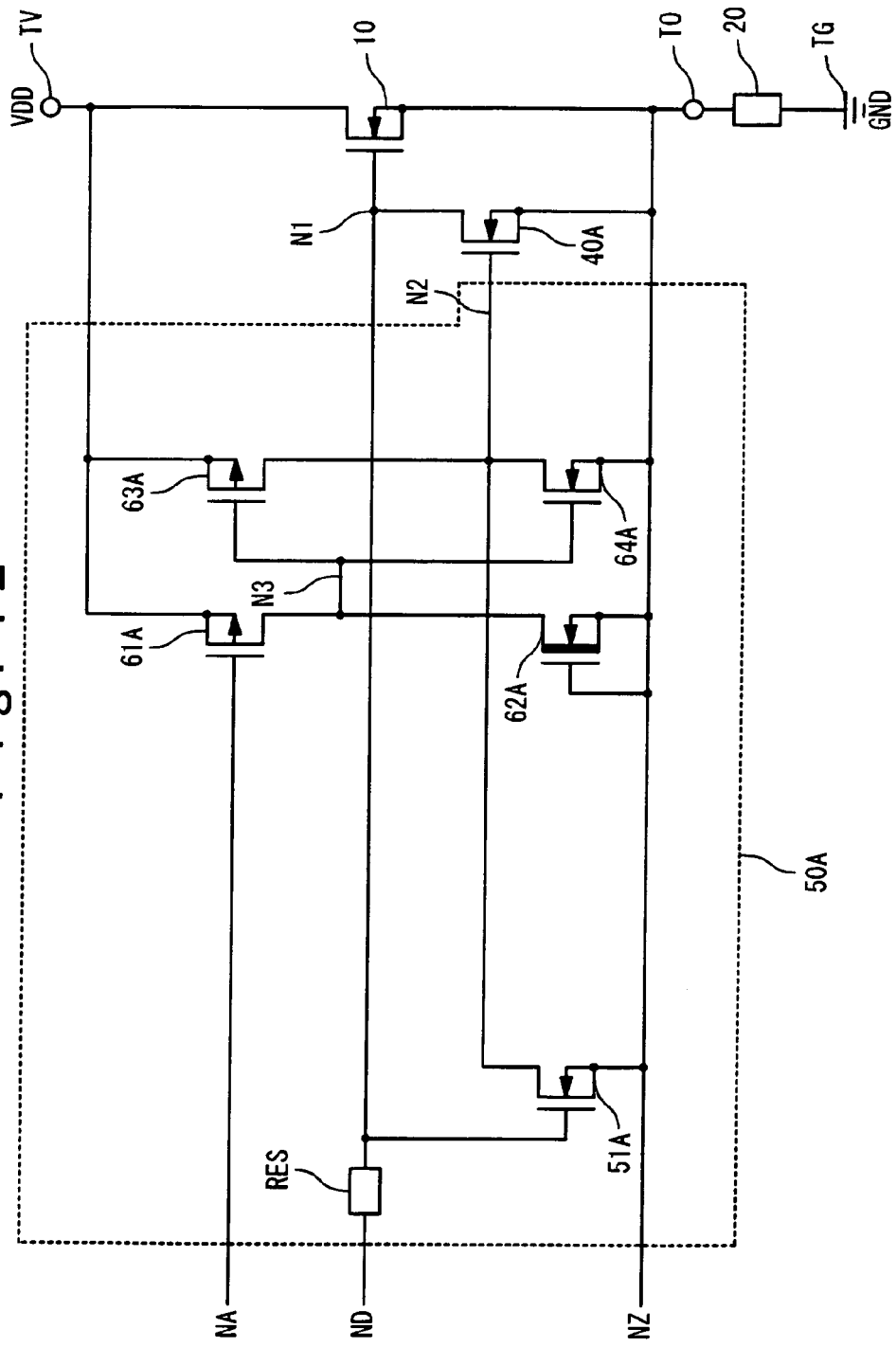
FIG. 12 is a circuit diagram showing a first example of a configuration of the short control circuit according to the first embodiment of the present invention.

FIG. 12 is a circuit diagram showing a first example. The power-supply connection circuit 60A has P-channel MOSFETs 61A and 63A and N-channel MOSFETs 62A and 64A.

The P-channel MOSFET 61A and the N-channel MOSFET 62A form a first inverter circuit. Specifically, a gate, a source and a drain of the P-channel MOSFET 61A are respectively connected to the node NA, the power-supply terminal TV and a third node N3. A gate, a source and a drain of the N-channel MOSFET 62A are respectively connected to the output node NZ, the output node NZ and the third node N3. Note that the N-channel MOSFET 62A is of depletion-type.

The P-channel MOSFET 63A and the N-channel MOSFET 64A form a second inverter circuit. Specifically, a gate, a source and a drain of the P-channel MOSFET 63A are respectively connected to the third node N3, the power-supply terminal TV and the second node N2. A gate, a source and a drain of the N-channel MOSFET 64A are respectively connected to the third node N3, the output node NZ and the second node N2.

These first and second inverter circuits control the electrical connection between the second node N2 and the power-supply terminal TV. Here, a signal at the node NA input to the first inverter circuit (a gate control signal for the discharge transistor 33 of the gate charge-discharge circuit) corresponds to the control signal CON shown in FIGS. 10 and 11.

In the turn-ON period PA and the ON period PB, the signal of the node NA (control signal CON) is at the Low-level. In this case, the P-channel MOSFET 61A is turned ON and the P-channel MOSFET 63A is turned OFF. Therefore, the electrical connection between the second node N2 and the power-supply terminal TV is cut off. The second node N2 is electrically connected to the output node NZ through at least the N-channel MOSFET 51A (first switch).

In the turn-OFF period PC and the OFF period PD, the signal of the node NA (control signal CON) is at the High-level. In this case, the P-channel MOSFET 61A and the N-channel MOSFET 64A are turned OFF and the P-channel MOSFET 63A is turned ON. Therefore, the second node N2 and the power-supply terminal TV are electrically connected with each other.

However, in the turn-OFF period PC, the N-channel MOSFET 51A also is turned ON as described above. In order to maintain the short transistor 40A in the OFF-state in the turn-OFF period PC, current capability of the N-channel MOSFET 51A is so designed as to be sufficiently higher than current capability of the P-channel MOSFET 63A.

In the OFF period PD, the N-channel MOSFET 51A is turned OFF and thus the electrical connection between the second node N2 and the output node NZ is cut off. Therefore, no current flows from the power-supply terminal TV to the output terminal TO through the short control circuit 50A. That is, consumption current during the OFF period is not caused.

It should be noted that back gates of the respective N-channel MOSFETs included in the short control circuit 50A are directly connected to the output node NZ. Therefore, the back gates are prevented from becoming high-impedance in the OFF period PD. Accordingly, in the OFF period PD, parasitic bipolar transistors of the N-channel MOSFETs are prevented from operating due to application of dump surge.

1-2. Second Example

Figure 13:
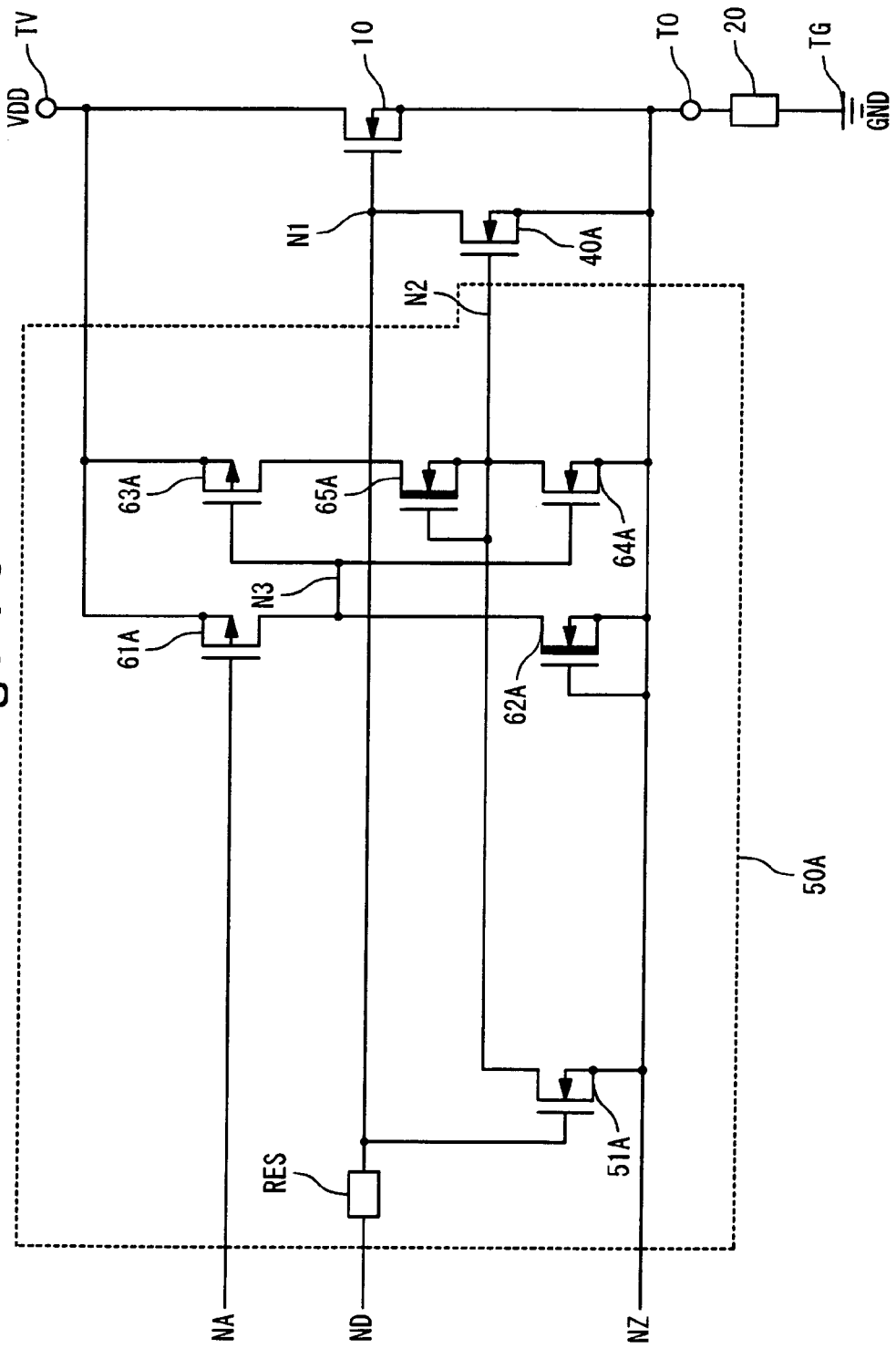
FIG. 13 is a circuit diagram showing a second example of a configuration of the short control circuit according to the first embodiment of the present invention.

FIG. 13 is a circuit diagram showing a second example. In the second example, a depletion-type N-channel MOSFET 65A is further added to the circuit configuration shown in FIG. 12. The depletion-type N-channel MOSFET 65A is provided between the P-channel MOSFET 63A and the second node N2 and functions as a constant current source.

As described in the first example, the turn-OFF period PC includes a period when the N-channel MOSFET 51A and the P-channel MOSFET 63A are concurrently turned ON. However, it is desirable to maintain the short transistor 40A in the OFF-state in the turn-OFF period PC. For that purpose, according to the first example, the current capability of the N-channel MOSFET 51A is so designed as to be sufficiently higher than the current capability of the P-channel MOSFET 63A. That is, it is necessary to pay sufficient attention to design of the current capability. According to the second example, the purpose can be easily achieved by reducing the constant current value (increasing impedance) of the N-channel MOSFET 65A serving as the constant current source. That is, the designing becomes easier as compared with the first example.

1-3. Third Example

Figure 14:
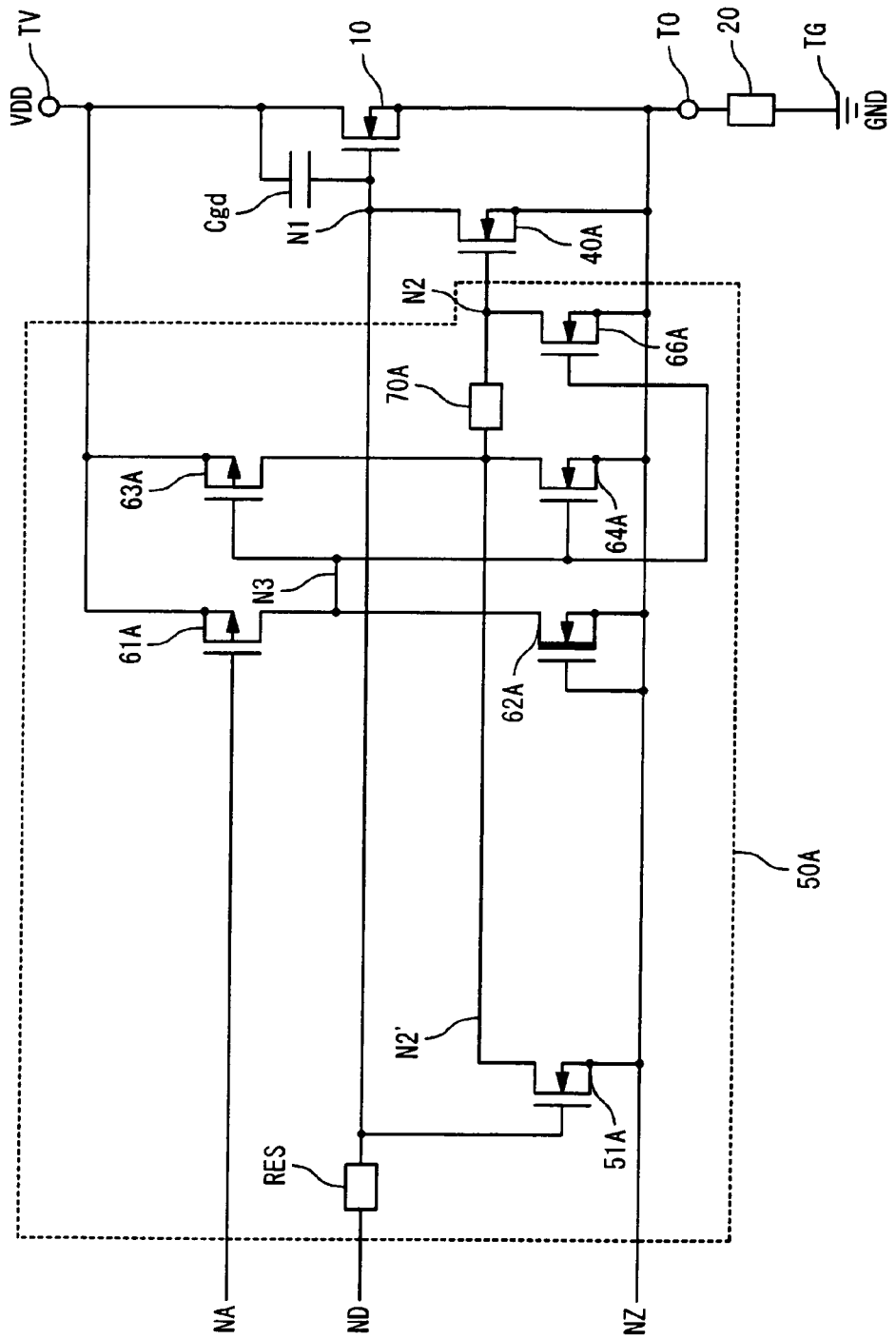
FIG. 14 is a circuit diagram showing a third example of a configuration of the short control circuit according to the first embodiment of the present invention.

FIG. 14 is a circuit diagram showing a third example. In the third example, a delay circuit 70A and a supplementary switch 66A are further added to the circuit configuration shown in FIG. 12. The drain of the N-channel MOSFET 51A is connected to a node N2' instead of the second node N2. The node N2' is connected to the second node N2 through the delay circuit 70A.

Figure 15:
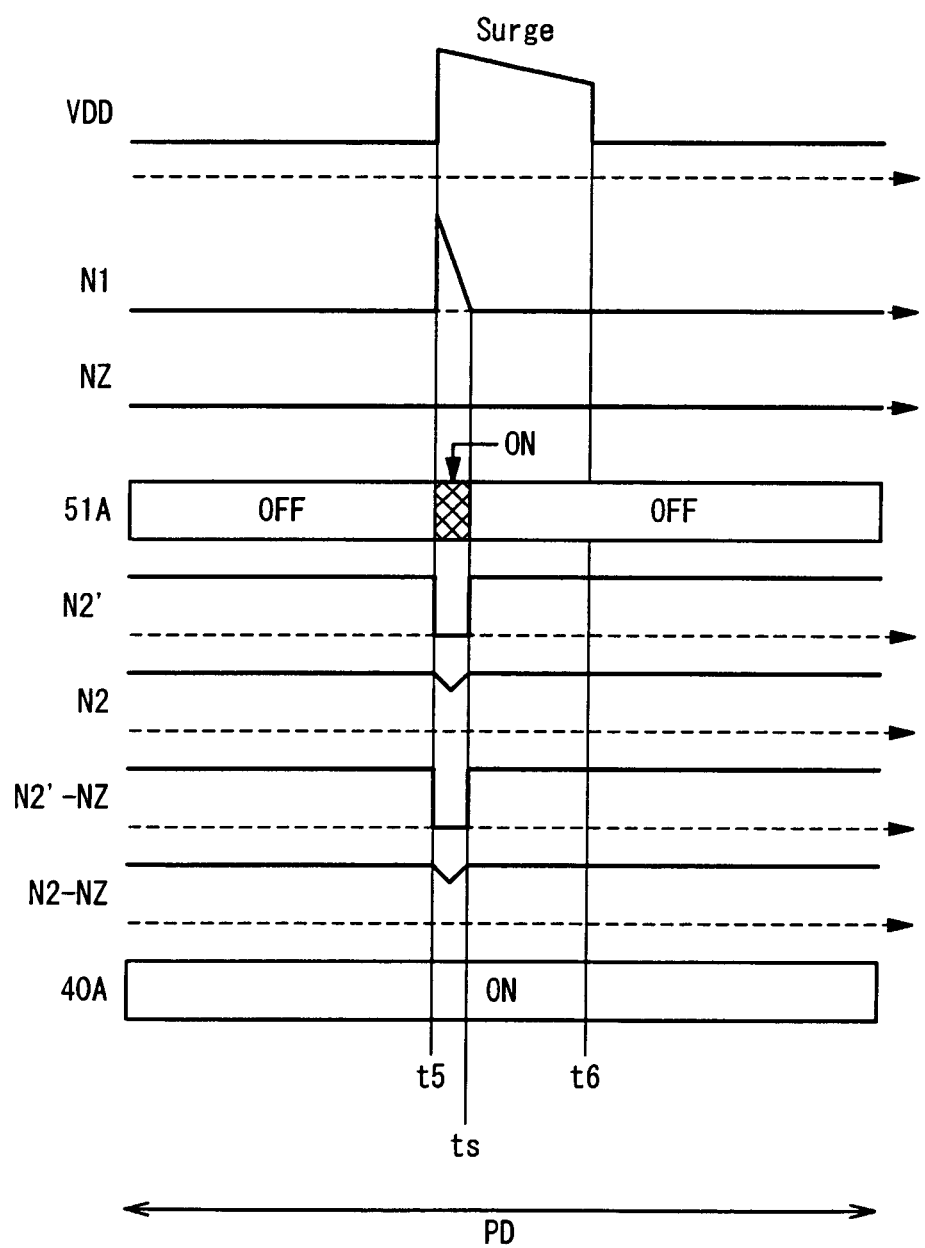
FIG. 15 is a timing chart showing an operation of the short control circuit shown in FIG. 14.

With reference to FIGS. 14 and 15, let us consider a case where dump surge is applied to the power-supply terminal TV during the OFF period PD. The output transistor 10 is often formed to have a large area and, in that case, parasitic capacitance Cgd between the gate and the drain (see FIG. 14) is not negligible. When the dump surge is applied at a time t5, the voltage of the first node N1 is increased due to the parasitic capacitance Cgd. After that, the first node N1 is discharged with a time constant that is determined depending on the parasitic capacitance Cgd and impedances of the resistance element RES and the discharge transistor 33.

If the voltage of the first node N1 is increased during the OFF period PD, the N-channel MOSFET 51A (first switch) is turned ON. In the example shown in FIG. 15, the N-channel MOSFET 51A is turned ON and the node N2' is discharged for a short period from time t5 to ts. If the delay circuit 70A does not exist, the second node N2 connected to the gate of the short transistor 40A also is discharged and the short transistor 40A is turned OFF. This means cancellation of the short between the gate and the source of the output transistor 10, which is not preferable.

Whereas, according to the present example, the delay circuit 70A is provided between the node N2' and the second node N2. Therefore, even if the node N2' is discharged, the voltage level of the second node N2 is maintained at the High-level for a certain period of time. In other words, the short transistor 40A is maintained in the ON-state in the period from time t5 to ts. In this manner, the short between the gate and the source of the output transistor 10 is prevented from being cancelled during the OFF period PD.

Figure 16A:
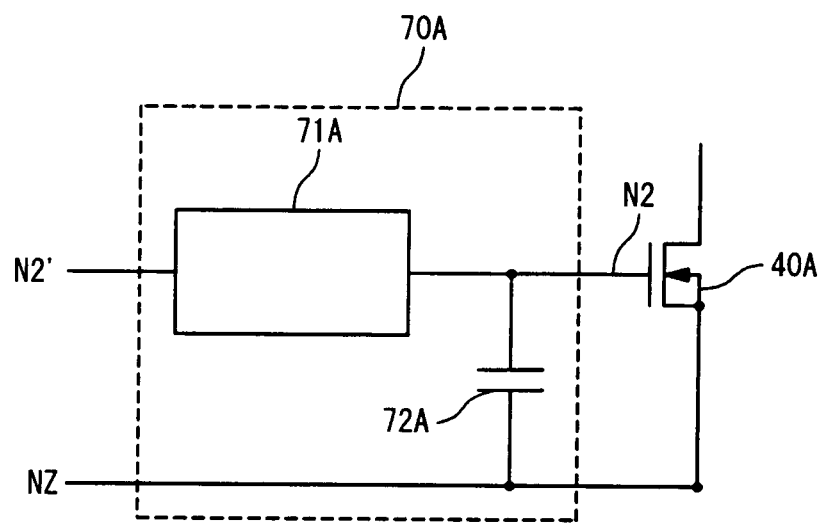
FIG. 16A is a circuit diagram showing a configuration example of a delay circuit in the short control circuit shown in FIG. 14.
Figure 16B:
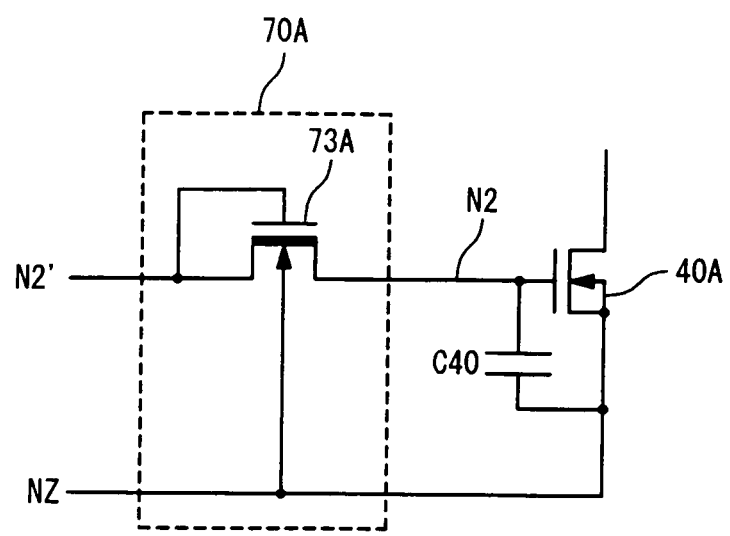
FIG. 16B is a circuit diagram showing another configuration example of a delay circuit in the short control circuit shown in FIG. 14.

FIGS. 16A and 16B show configuration examples of the delay circuit 70A. In the example shown in FIG. 16A, a resistance element 71A and a capacitance element 72A form the delay circuit 70A. In the example shown in FIG. 16B, a depletion-type N-channel MOSFET 73A serving as a constant current source and a parasitic capacitor C40A between the gate and the source of the short transistor 40A form the delay circuit 70A. In the OFF period PD, the capacitance element (72A or C40A) of the delay circuit 70A is charged to the power-supply voltage VDD. Even in the case where the node N2' is discharged due to the above-mentioned reason, the voltage level of the second node N2 can be maintained at the High-level until the capacitance element of the delay circuit 70A is discharged. Note that an electric discharge time constant of the delay circuit 70A is designed to be larger than an electric discharge time constant of the first node N1.

Meanwhile, it is required to rapidly discharge the second node N2 to turn OFF the short transistor 40A at the start (time t1: refer to FIG. 11) of the turn-ON period PA. In the present example, however, the delay circuit 70A is provided between the node N2' and the second node N2 and hence discharging through the N-channel MOSFETs 51A and 64A is delayed. The supplementary switch 66A is added in order to remove such the influence of the delay circuit 70A. The supplementary switch 66A is connected between the second node N2 and the output node NZ and is turned ON in the turn-ON period PA. As a result, at the start of the turn-ON period PA, the second node N2 is rapidly discharged through the supplementary switch 66A. That is, the influence of the delay circuit 70A on the turn-ON period PA is removed.

For example, the supplementary switch 66A is an N-channel MOSFET and its gate, source and drain are respectively connected to the third node N3, the output node NZ and the second node N2. In the turn-ON period PA, the power-supply voltage VDD is applied to the third node N3. The N-channel MOSFET 66A is turned ON until a voltage difference (N3−NZ) between the third node N3 and the output node NZ becomes lower than its threshold voltage. The N-channel MOSFET 66A is turned OFF in the period other than the turn-ON period PA. Accordingly, the above-mentioned purpose is achieved.

1-4. Fourth Example

Figure 17:
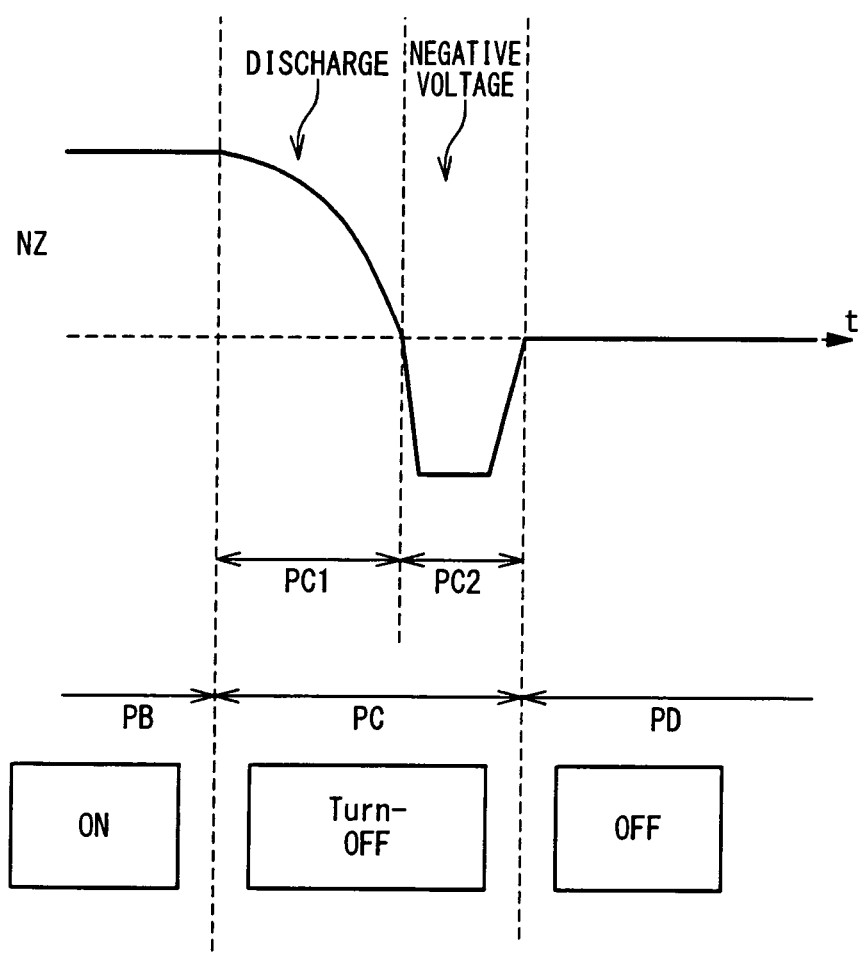
FIG. 17 is a conceptual diagram for explaining a case where a turn-OFF period includes a discharge period and a negative voltage period.

In a case where the load 20 connected to the output terminal TO is an inductive load, counter electromotive force (negative voltage) may be applied to the output terminal TO at the time of turning OFF. The similar phenomenon can be caused by an inductance component of an interconnection used for connecting the load 20. In this case, as shown in FIG. 17, the turn-OFF period PC includes not only a "discharge period PC1" when the first node N1 and the output node NZ are discharged but also a subsequent "negative voltage period PC2" when a negative voltage is applied to the output terminal TO (output node NZ).

In the foregoing examples, the turn-OFF period PC includes only the discharge period PC1. In the discharge period PC1, the first switch 51A is turned ON and thereby the second node N2 and the output node NZ are electrically connected with each other. As a result, the short transistor 40A is maintained in the OFF-state even in the discharge period PC1. However, the first switch 51A (N-channel MOSFET 51A) is not necessarily turned ON also in the negative voltage period PC2. Therefore, according to the fourth example, a second switch 52A that is connected between the second node N2 and the output node NZ and is turned ON in the negative voltage period PC2 is added.

Figure 18:
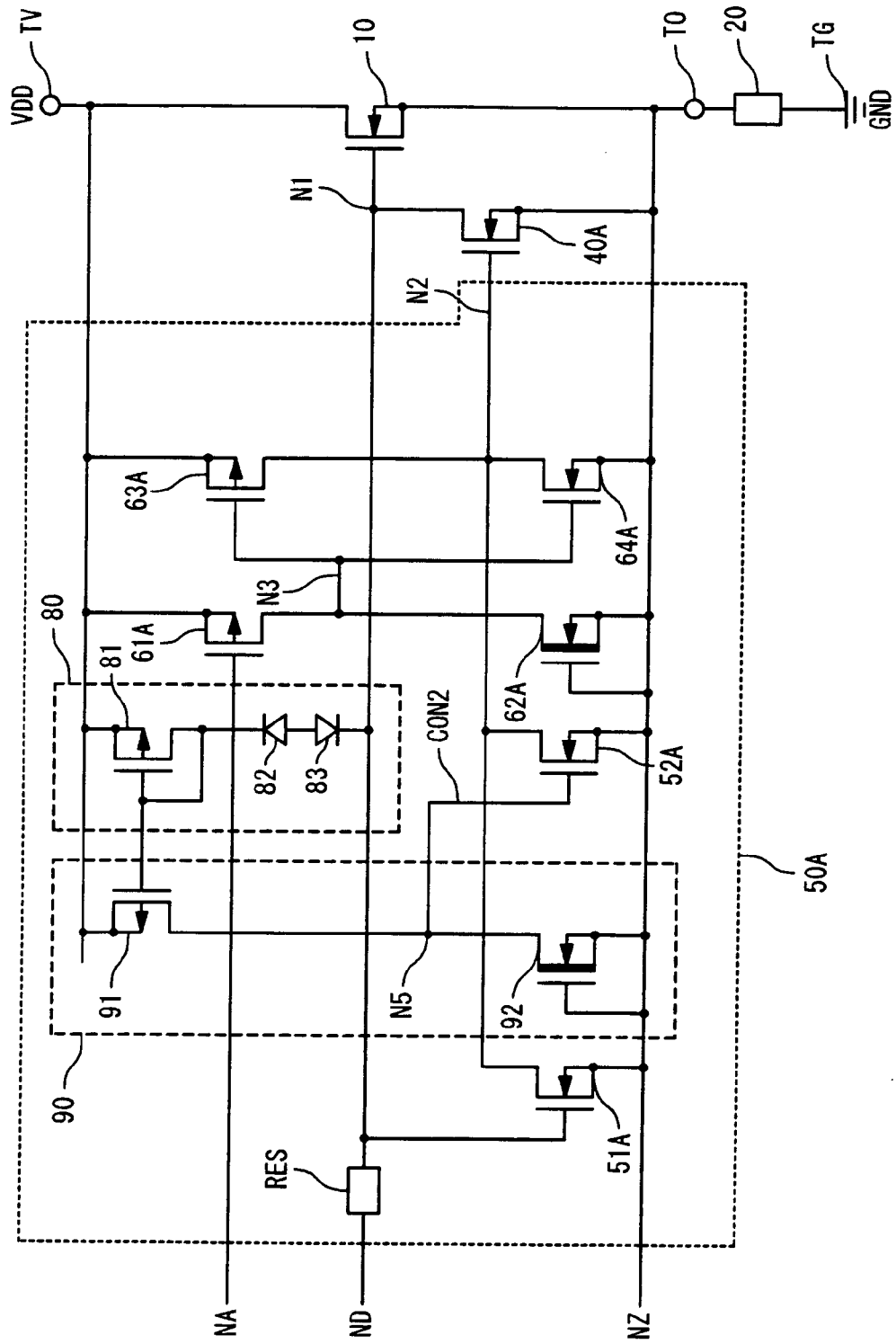
FIG. 18 is a circuit diagram showing a fourth example of a configuration of the short control circuit according to the first embodiment of the present invention.

FIG. 18 is a circuit diagram showing the fourth example. In the fourth example, an overvoltage protection circuit 80, a control circuit 90 and the second switch 52A are further added to the circuit configuration shown in FIG. 12.

The overvoltage protection circuit 80 (dynamic clamp circuit) is connected between the power-supply terminal TV and the first node N1. More specifically, the overvoltage protection circuit 80 has a P-channel MOSFET 81 and diodes 82 and 83. A source of the P-channel MOSFET 81 is connected to the power-supply terminal TV. A gate and a drain of the P-channel MOSFET 81 are connected to a cathode of the diode 82. An anode of the diode 82 is connected to an anode of the diode 83. A cathode of the diode 83 is connected to the first node N1. The overvoltage protection circuit 80 operates in the negative voltage period PC2.

The control circuit 90 has a P-channel MOSFET 91 and a depletion-type N-channel MOSFET 92. A gate, a source and a drain of the P-channel MOSFET 91 are respectively connected to the gate of the P-channel MOSFET 81, the power-supply terminal TV and a fifth node N5. A drain of the N-channel MOSFET 92 is connected to the fifth node N5 and a source and a gate thereof are connected to the output node NZ.

The P-channel MOSFETs 81 and 91 form a current mirror circuit. When the overvoltage protection circuit 80 operates, the fifth node N5 is charged and its voltage becomes the High-level. When the overvoltage protection circuit 80 is not operating, the voltage of the fifth node N5 is equivalent to the voltage of the output node NZ. The voltage of the fifth node N5 is used as a control signal CON2 for ON/OFF controlling the second switch 52A. That is, the control circuit 90 activates the control signal CON2 (CON2=High-level) only when the overvoltage protection circuit 80 is in operation.

The second switch 52A is connected between the second node N2 and the output node NZ. The second switch 52A is turned ON when the control signal CON2 is activated (CON2=High-level) and is turned OFF when it is deactivated. For example, the second switch 52A is an N-channel MOSFET and its gate, source and drain are respectively connected to the fifth node N5, the output node NZ and the second node N2. When the control signal CON2 is activated to be High-level, the N-channel MOSFET 52A is turned ON. As a result, the second node N2 and the output node NZ are electrically connected with each other.

Figure 19:
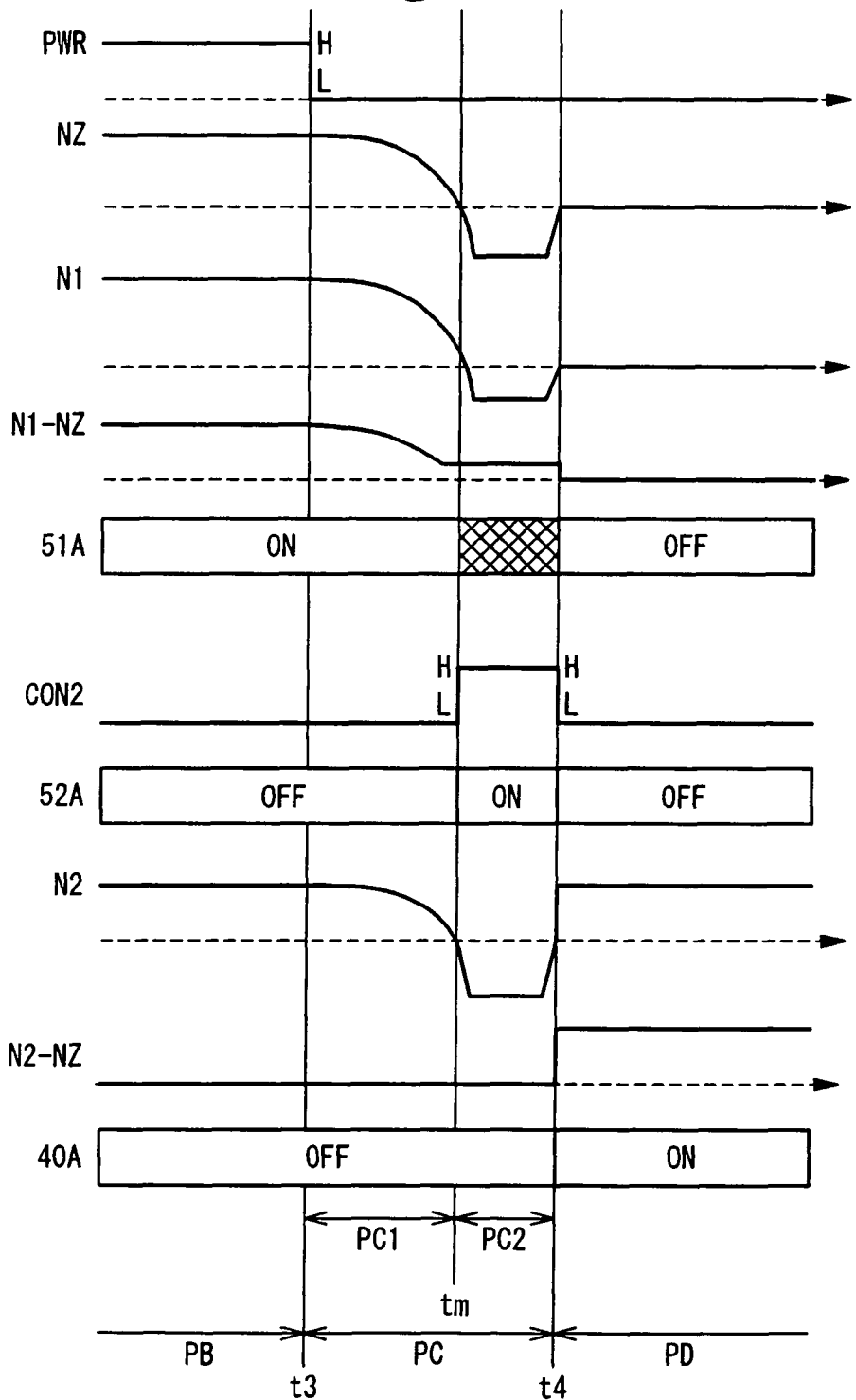
FIG. 19 is a timing chart showing an operation of the short control circuit shown in FIG. 18.

The turn-OFF period PC in the present example will be described with reference to FIGS. 18 and 19. The turn-OFF period PC includes the discharge period PC1 and the negative voltage period PC2.

(Discharge Period PC1: from Time t3 to tm)

As in the case of the foregoing examples, the first switch 51A is turned ON. Therefore, the second node N2 and the output node NZ are electrically connected with each other and thus the short transistor 40A is maintained in the OFF-state.

(Negative Voltage Period PC2: from Time tm to t4)

In order to normally operate the overvoltage protection circuit 80 in the negative voltage period PC2, it is necessary to turn ON the output transistor 10 with a low gate-source voltage. Therefore, it is not desirable that the short transistor 40A is turned ON and the first node N1 and the output node NZ are short-circuited. That is, it is necessary to maintain the short transistor 40A in the OFF-state also in the negative voltage period PC2. However, the first switch 51A may be turned OFF in the negative voltage period PC2. Therefore, the second switch 52A is provided for use in the negative voltage period PC2.

More specifically, when the negative voltage is applied to the output terminal TO, a current path is formed from the P-channel MOSFET 81 of the overvoltage protection circuit 80 to the output terminal TO through the diodes 82 and 83, the resistance element RES and the discharge transistor 33 of the gate charge-discharge circuit 30. Accordingly, a drain-source voltage of the output transistor 10 is clamped to a clamp voltage of the overvoltage protection circuit 80. When the overvoltage protection circuit 80 operates in this manner, the control circuit 90 activates the control signal CON2 (CON2=High-level) as described above. In response to that, the second switch 52A is turned ON and thus the second node N2 and the output node NZ are electrically connected with each other. As a result, the short transistor 40A is maintained in the OFF-state.

When the negative voltage period PC2 is ended, the second switch 52A is turned OFF.

As described above, the short transistor 40A and the short control circuit 50A according to the first embodiment have no impact also on characteristics (e.g. overvoltage protection) relating to the negative voltage period PC2.

1-5. Fifth Example

Figure 20:
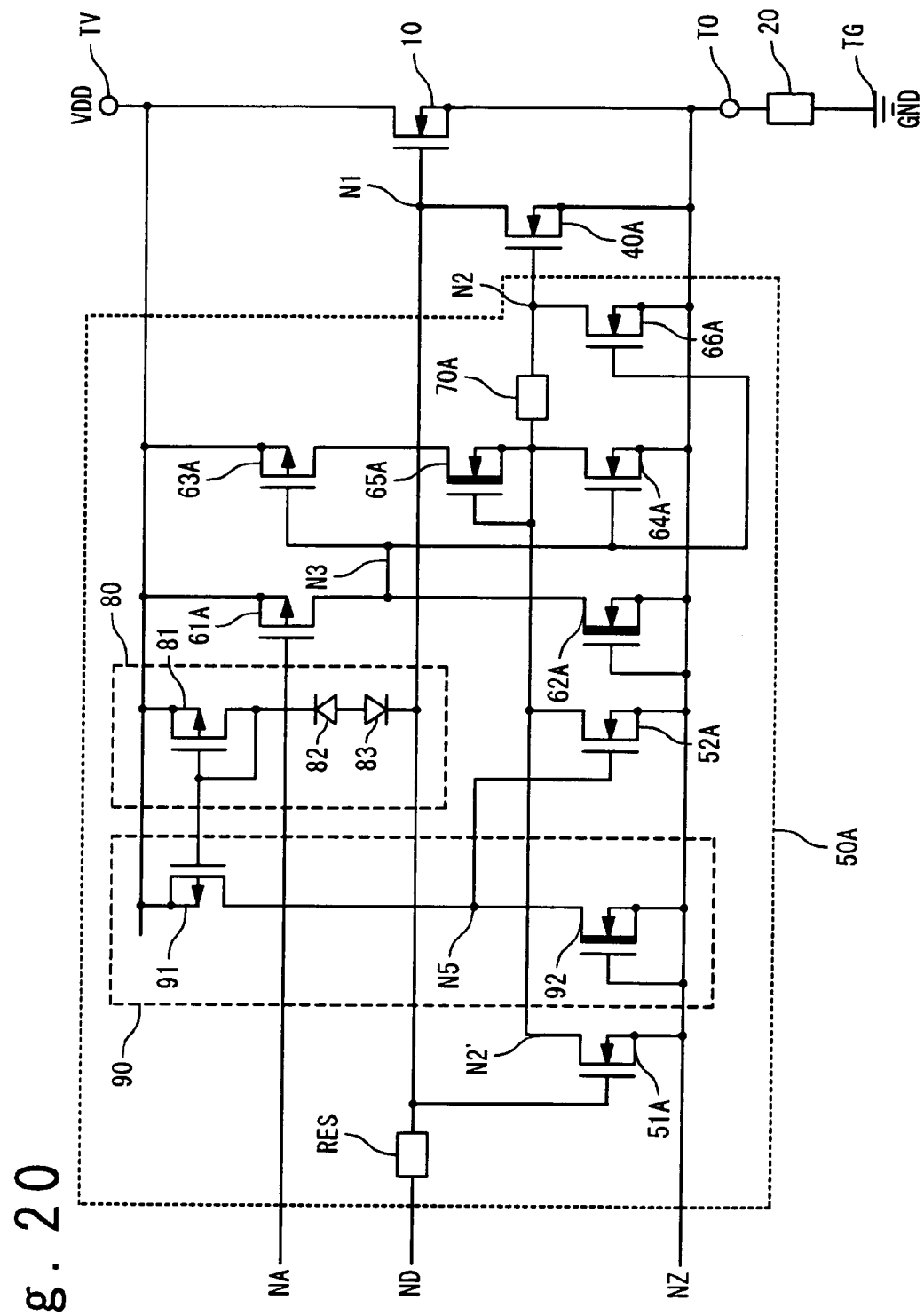
FIG. 20 is a circuit diagram showing a fifth example of a configuration of the short control circuit according to the first embodiment of the present invention.

Some of the above-described examples can be combined together. FIG. 20 shows a circuit configuration in a case where all of the first to fourth examples are combined together.

2. Second Embodiment

In a second embodiment, the short switch circuit 4 has a short switch 40B connected between the first node N1 and the output node NZ. The short control circuit 50 in the second embodiment is referred to as a short control circuit 50B. The short control circuit 50B can turn ON/OFF the electrical connection between the first node N1 and the output node NZ through the short switch circuit 4 by ON/OFF controlling the short switch 40B.

Figure 21:
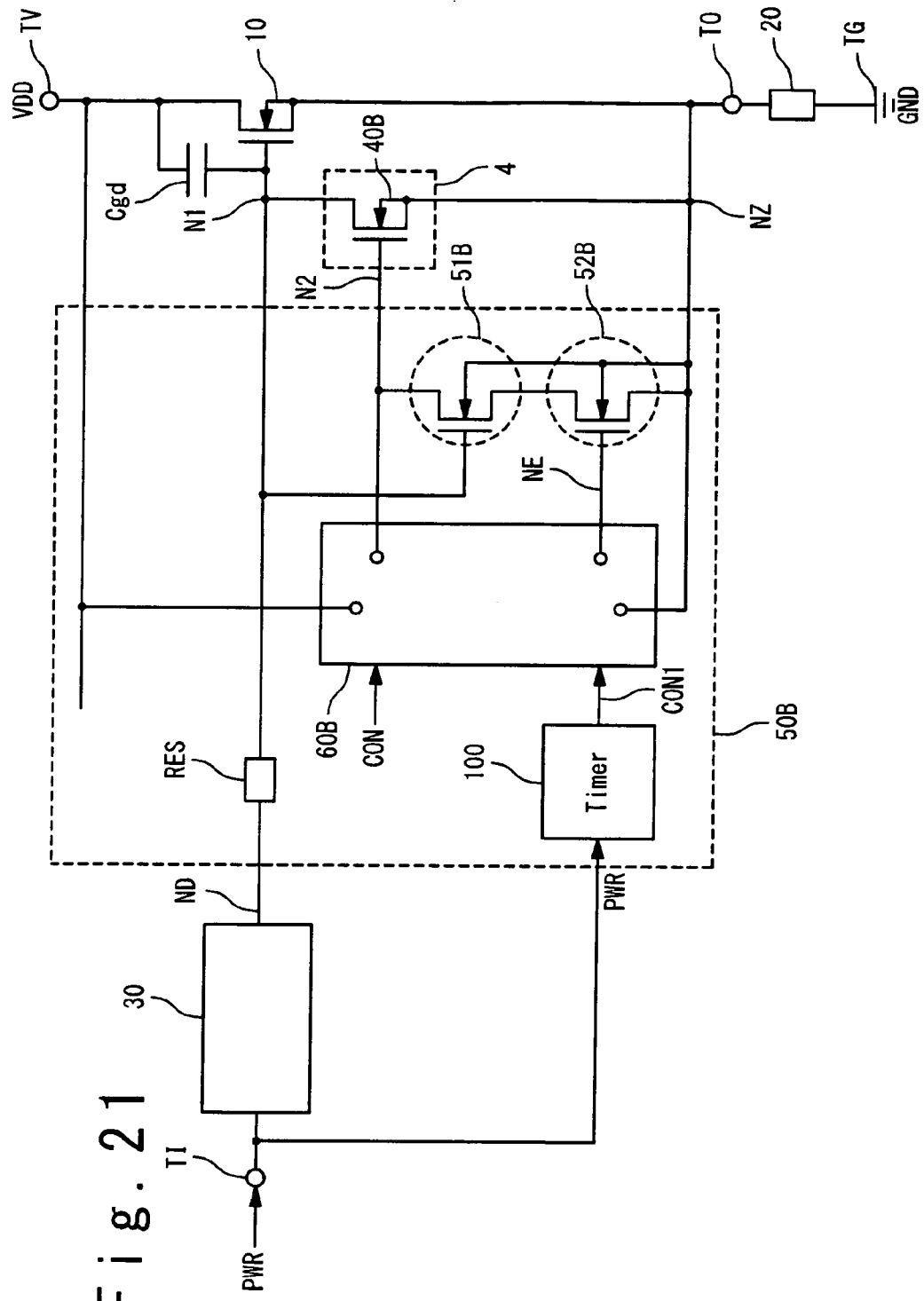
FIG. 21 is a circuit diagram schematically showing a configuration of a short control circuit according to a second embodiment of the present invention.

FIG. 21 schematically shows a configuration of the short switch 40B and the short control circuit 50B according to the second embodiment. For example, an N-channel MOSFET (hereinafter referred to as a "short transistor 40B") is used as the short switch 40B. A source, a drain and a gate of the short transistor 40B are respectively connected to the output node NZ, the first node N1 and a second node N2. It is possible to ON/OFF control the short transistor 40B by controlling a voltage of the second node N2.

The short control circuit 50B is connected to the second node N2 and controls the voltage of the second node N2. More specifically, the short control circuit 50B has a power-supply connection circuit 60B connected to the second node N2. The power-supply connection circuit 60B controls electrical connection between the second node N2 and the power-supply terminal TV and electrical connection between the second node N2 and the output node NZ, depending on a control signal CON.

Furthermore, the short control circuit 50B has a plurality of switches connected between the second node N2 and the output node NZ. The plurality of switches are used particularly for controlling the electrical connection between the second node N2 and the output node NZ. More specifically, the plurality of switches include at least a first switch 51B and a second switch 52B. The first switch 51B and the second switch 52B are connected in series between the second node N2 and the output node NZ.

An N-channel MOSFET as shown in FIG. 21 is used as the first switch 51B, for example. A gate, a source and a drain of the N-channel MOSFET 51B are respectively connected to the first node N1, the second switch 52B (output node NZ side) and the second node N2.

An N-channel MOSFET as shown in FIG. 21 is used as the second switch 52B, for example. A gate, a source and a drain of the N-channel MOSFET 52B are respectively connected to a node NE, the output node NZ and the first switch 51B (second node N2 side).

The power-supply connection circuit 60B is connected also to the node NE and ON/OFF controls the N-channel MOSFET 52B (second switch) by controlling a voltage of the node NE. That is, the power-supply connection circuit 60B controls electrical connection between the node NE and the power-supply terminal TV and electrical connection between the node NE and the output node NZ. In particular, the power-supply connection circuit 60B electrically connects the node NE and the power-supply terminal TV to turn ON the N-channel MOSFET 52B (second switch) for a "predetermined timer period PT".

Here, the predetermined timer period PT starts concurrently with timing (time t3) when the power-ON signal PWR is deactivated, namely, the start of the turn-OFF period PC. A length of the predetermined timer period PT is typically designed to be equal to or larger than a length of the turn-OFF period PC. However, if the turn-OFF period PC includes both the discharge period PC1 and the negative voltage period PC2 as will be described later in a second example (refer to FIG. 24), a length of the predetermined timer period PT just needs to be equal to or larger than a length of the discharge period PC1.

The predetermined timer period PT can be recognized based on a first control signal CON1 that is output from a timer circuit 100. Specifically, the timer circuit 100 activates the first control signal CON1 (CON1=Low-level) only for the predetermined timer period PT. In the period other than the predetermined timer period PT, the timer circuit 100 deactivates the first control signal CON1 (CON1=High-level).

An operation of the short control circuit 50B according to the second embodiment will be described with reference to FIGS. 21 and 22. An overlapping description with the foregoing FIG. 7 will be omitted as appropriate.

(Turn-ON Period PA: from Time t1 to t2)

At a time t1, the power-ON signal PWR is activated and changed from the Low-level to the High-level. In response to that, the control signal CON is changed from the High-level to the Low-level. In a case where the control signal CON is at the Low-level, the power-supply connection circuit 60B electrically connects the second node N2 and the output node NZ. As a result, the gate and the source of the short transistor 40B are short-circuited and the short transistor 40B is turned OFF.

Also, the voltages of the first node N1 and the output node NZ are increased gradually, as mentioned above. The voltage of the first node N1 boosted by the booster circuit 32 is higher than the voltage of the output node NZ and a voltage difference (N1−NZ) is generated between the nodes. That is, a certain level of voltage is applied between the gate and the source of the N-channel MOSFET 51B and thus the N-channel MOSFET 51B (first switch) is turned ON.

Moreover, the power-supply connection circuit 60B electrically connects the node NE and the power-supply terminal TV. As a result, the N-channel MOSFET 52B (second switch 52B) is turned ON. However, when the voltage of the output node NZ is increased to about the power-supply voltage VDD and a gate-source voltage (NE−NZ) of the N-channel MOSFET 52B becomes lower than its threshold voltage, the N-channel MOSFET 52B is turned OFF.

(ON Period PB: from Time t2 to t3)

The control signal CON is maintained at the Low-level, and the power-supply connection circuit 60B electrically connects the second node N2 and the output node NZ. Therefore, the short transistor 40B is maintained in the OFF-state. Also, the N-channel MOSFET 51B (first switch) is turned ON and the N-channel MOSFET 52B (second switch) is turned OFF.

(Turn-OFF Period PC: from Time t3 to t4)

At a time t3, the power-ON signal PWR is deactivated and changed from the High-level to the Low-level. In response to that, the control signal CON is changed from the Low-level to the High-level. In a case where the control signal CON is at the High-level, the power-supply connection circuit 60B cuts off the electrical connection between the second node N2 and the output node NZ. However, in the turn-OFF period PC, the first switch 51B and the second switch 52B both are turned ON as will be described below. Therefore, the electrical connection between the second node N2 and the output node NZ is still maintained through the first switch 51B and the second switch 52B, also in the turn-OFF period PC.

First, the first switch 51B is as follows. Even in the turn-OFF period PC, a certain level of voltage difference (N1−NZ) is present between the first node N1 and the output node NZ. Therefore, the N-channel MOSFET 51B (first switch 51B) is maintained in the ON-state.

Next, the second switch 52B is as follows. In response to the deactivation of the power-ON signal PWR, the above-mentioned timer period PT starts and the timer circuit 100 activates the first control signal CON1 (CON1=Low-level). In the timer period PT when the first control signal CON1 is being activated, the power-supply connection circuit 60B electrically connects the node NE and the power-supply terminal TV, thereby maintaining the N-channel MOSFET 52B (second switch) in the ON-state.

In this manner, the electrical connection between the second node N2 and the output node NZ is maintained by the first switch 51B and the second switch 52B, also in the turn-OFF period PC. Therefore, the short transistor 40B is maintained in the OFF state.

(OFF Period PD: from Time t4)

When the voltage difference (N1−NZ) between the first node N1 and the output node NZ becomes lower than a threshold voltage of the N-channel MOSFET 51B after the discharging of the first node N1 and the output node NZ has proceeded, the N-channel MOSFET 51B (first switch) is turned OFF. That is, the electrical connection between the second node N2 and the output node NZ is cut off. The power-supply connection circuit 60B electrically connects the second node N2 and the power-supply terminal TV. As a result, the short transistor 40B is turned ON.

It should be noted that, in the middle of the OFF period PD, the predetermined timer period PT ends and the timer circuit 100 deactivates the first control signal CON1 (CON1=High-level). In the OFF period PD after the first control signal CON1 is deactivated, the power-supply connection circuit 60B cuts off the electrical connection between the node NE and the power-supply terminal TV and electrically connects the node NE and the output node NZ. Thus, the N-channel MOSFET 52B (second switch) also is turned OFF.

In this manner, the above-mentioned ON/OFF control of the short transistor 40B can be achieved. It should be noted that the reason why the second switch 52B is provided in addition to the first switch 51B is as follows.

Let us consider a case where dump surge is applied to the power-supply terminal TV during the OFF period PD. The output transistor 10 is often formed to have a large area and, in that case, parasitic capacitance Cgd between the gate and the drain (see FIG. 21) is not negligible. When the dump surge is applied, the voltage of the first node N1 is increased due to the parasitic capacitance Cgd. After that, the first node N1 is discharged with a time constant that is determined depending on the parasitic capacitance Cgd and impedances of the resistance element RES and the discharge transistor 33.

In the example shown in FIG. 21, the first switch 51B is the N-channel MOSFET whose gate is connected to the first node N1. Therefore, if the voltage of the first node N1 is increased during the OFF period PD, the N-channel MOSFET 51B is turned ON. At this time, if the second switch 52B does not exist, the second node N2 and the output node NZ are electrically connected with each other and the short transistor 40B is turned OFF in the middle of the OFF period PD. This means cancellation of the short between the gate and the source of the output transistor 10, which is not preferable. In order to prevent such the phenomenon from occurring, the second switch 52B is provided separately from the first switch 51B.

Hereinafter, various examples of the configuration of the short control circuit 50B according to the second embodiment will be described. It should be noted that an overlapping description with the above will be omitted as appropriate.

2-1. First Example

Figure 23:
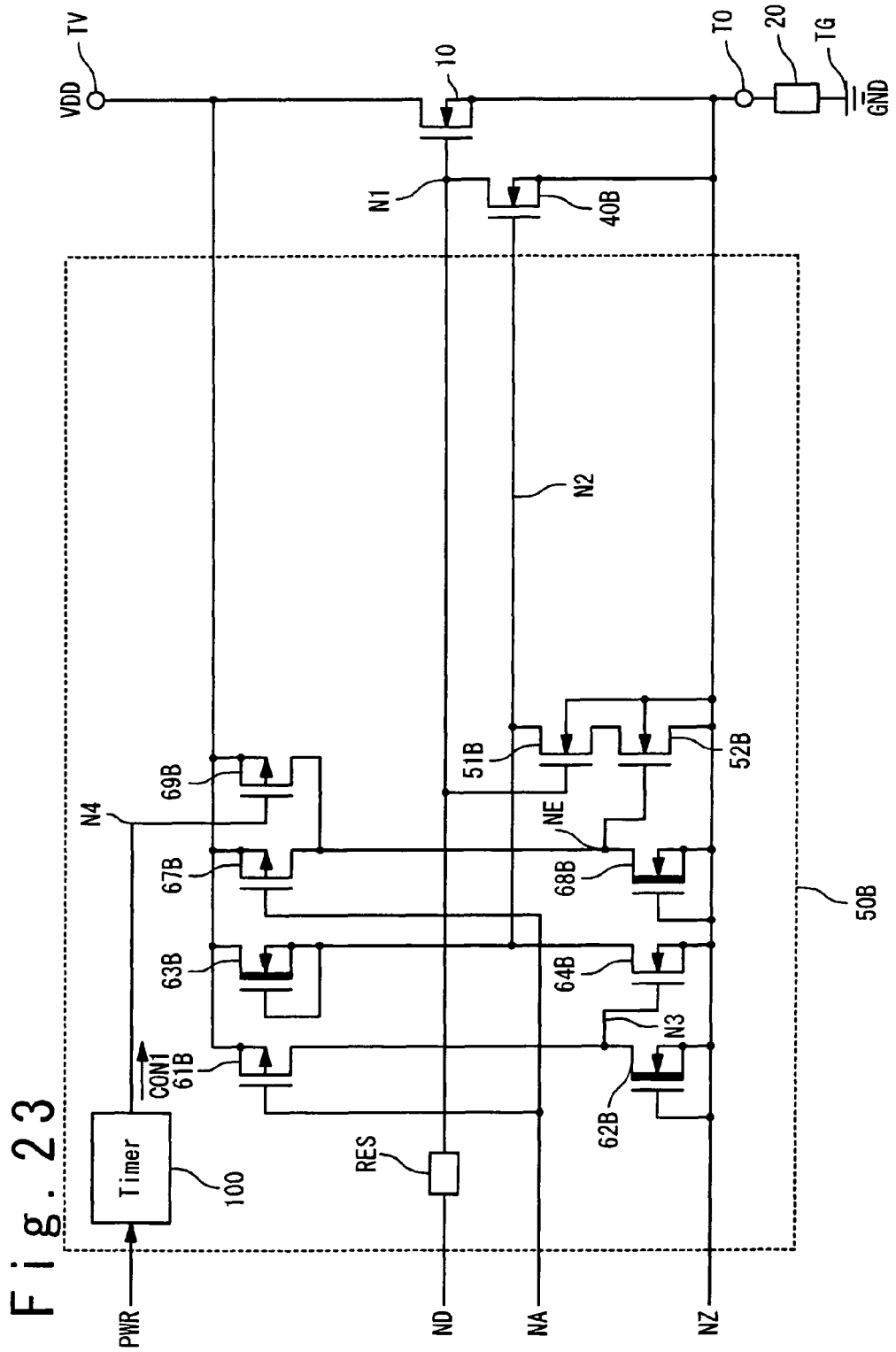
FIG. 23 is a circuit diagram showing a first example of a configuration of the short control circuit according to the second embodiment of the present invention.

FIG. 23 is a circuit diagram showing a first example. The power-supply connection circuit 60B has P-channel MOSFETs 61B, 67B and 69B and N-channel MOSFETs 62B, 63B, 64B and 68B.

The P-channel MOSFET 61B and the depletion-type N-channel MOSFET 62B form a first inverter circuit. Specifically, a gate, a source and a drain of the P-channel MOSFET 61B are respectively connected to the node NA, the power-supply terminal TV and a third node N3. A gate, a source and a drain of the N-channel MOSFET 62B are respectively connected to the output node NZ, the output node NZ and the third node N3.

The N-channel MOSFET 63B is of a depletion-type. The N-channel MOSFETs 63B and 64B form a second inverter circuit. Specifically, a gate, a source and a drain of the N-channel MOSFET 63B are respectively connected to the second node N2, the second node N2 and the power-supply terminal TV. A gate, a source and a drain of the N-channel MOSFET 64B are respectively connected to the third node N3, the output node NZ and the second node N2.

The P-channel MOSFET 67B and the depletion-type N-channel MOSFET 68B form a third inverter circuit. Specifically, a gate, a source and a drain of the P-channel MOSFET 67B are respectively connected to the node NA, the power-supply terminal TV and the node NE. A gate, a source and a drain of the N-channel MOSFET 68B are respectively connected to the output node NZ, the output node NZ and the node NE.

A gate, a source and a drain of the P-channel MOSFET 69B are respectively connected to a fourth node N4, the power-supply terminal TV and the node NE. The fourth node N4 is supplied with the first control signal CON1 from the timer circuit 100.

Figure 22:
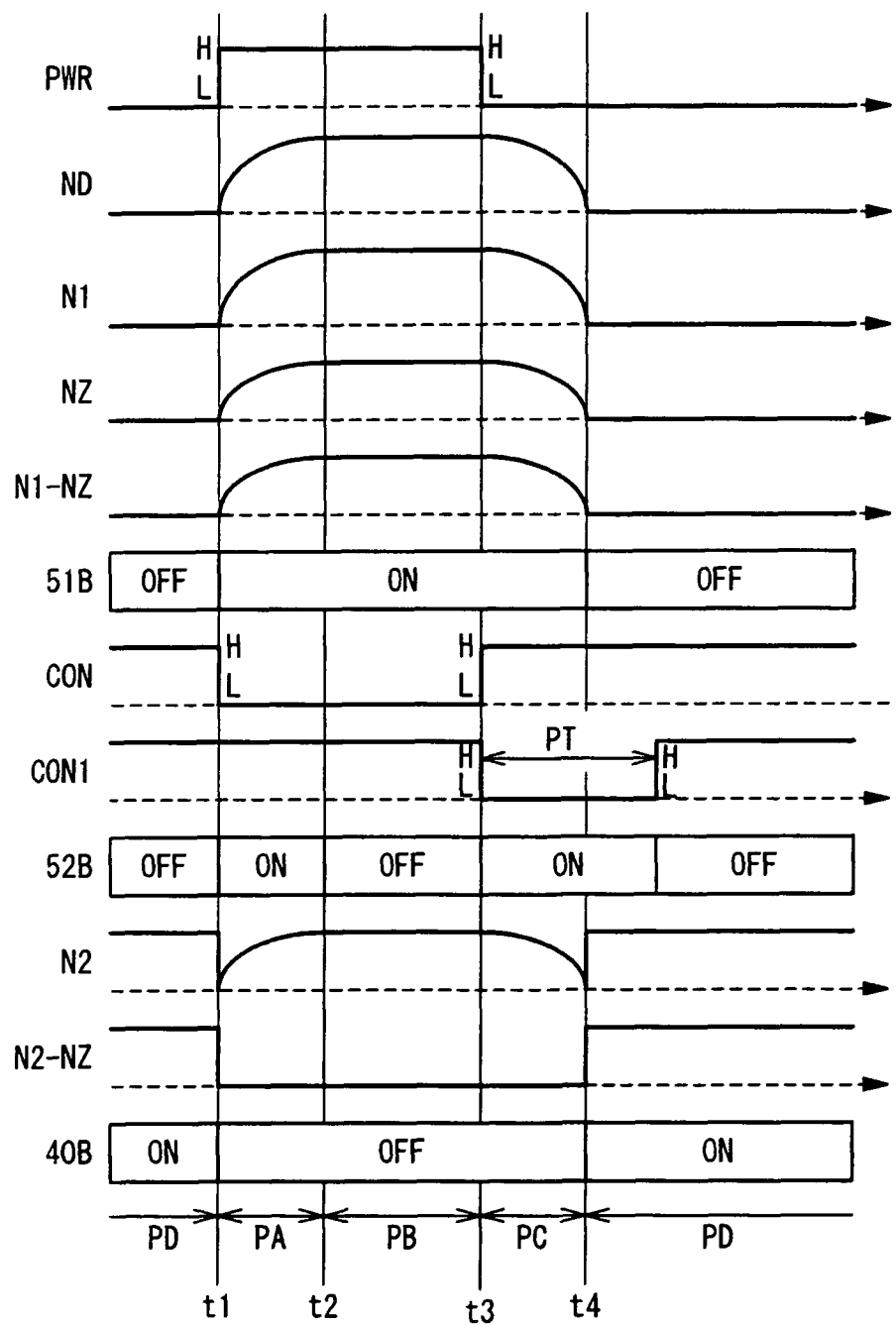
FIG. 22 is a timing chart showing an operation of the short control circuit according to the second embodiment of the present invention.

In this configuration, a signal at the node NA input to the first and third inverter circuits (a gate control signal for the discharge transistor 33 of the gate charge-discharge circuit)

corresponds to the control signal CON shown in FIGS. 21 and 22. Hereinafter, an operation of the short control circuit 50B according to the present example will be described with reference to FIGS. 22 and 23.

In the turn-ON period PA and the ON period PB, the signal of the node NA (control signal CON) is at the Low-level. In this case, the P-channel MOSFETs 61B and 67B are turned ON and thus the third node N3 and the node NE are pulled up. As a result, the N-channel MOSFET 64B and the N-channel MOSFET 52B (second switch) are turned ON and the second node N2 and the output node NZ are electrically connected with each other. Therefore, the short transistor 40B is turned OFF.

The voltage of the output node NZ is increased. When a voltage difference between the third node N3 and the output node NZ becomes lower than a threshold voltage of the N-channel MOSFET 64B, the N-channel MOSFET 64B is turned OFF. Also, when a voltage difference between the node NE and the output node NZ becomes lower than a threshold voltage of the N-channel MOSFET 52B, the N-channel MOSFET 52B is turned OFF. In this case, the second node N2 is pulled up by the N-channel MOSFET 63B.

It should be noted that the depletion-type N-channel MOSFET 63B also plays a role of preventing the second node N2 from becoming a floating state after the N-channel MOSFETs 52B and 64B are turned OFF. As a result, noise tolerance with respect to the second node N2 is enhanced.

In the turn-OFF period PC and the OFF period PD, the signal of the node NA (control signal CON) is at the High-level. In this case, the P-channel MOSFETs 61B and 67B and the N-channel MOSFET 64B are turned OFF.

Meanwhile, the timer circuit 100 sets the first control signal CON1 to the Low-level for the predetermined timer period PT from the start of the turn-OFF period PC. Accordingly, the P-channel MOSFET 69B is turned ON and the node NE is pulled up. As a result, the N-channel MOSFET 52B (second switch) is turned ON. That is, the electrical connection between the second node N2 and the output node NZ are maintained through the first switch 51B and the second switch 52B, also in the turn-OFF period PC. Therefore, the short transistor 40B is maintained in the OFF-state.

In the OFF period PD, the N-channel MOSFET 51B (first switch) is turned OFF, as described above. Accordingly, the electrical connection between the second node N2 and the output node NZ is cut off. Since the second node N2 is pulled up by the N-channel MOSFET 63B, the short transistor 40B is turned ON.

It should be noted that, in the middle of the OFF period PD, the predetermined timer period PT ends and the timer circuit 100 sets the first control signal CON1 to the High-level. Accordingly, the P-channel MOSFET 69B is turned OFF and the node NE is pulled down. As a result, the N-channel MOSFET 52B (second switch 52B) also is turned OFF.

In the OFF period PD, the P-channel MOSFETs 61B, 67B and 69B and the N-channel MOSFETs 51B and 64B are turned OFF. Therefore, no current flows from the power-supply terminal TV to the output terminal TO through the short control circuit 50B. That is, consumption current during the OFF period is not caused.

It should be noted that back gates of the respective N-channel MOSFETs included in the short control circuit 50B are directly connected to the output node NZ. Therefore, the back gates are prevented from becoming high-impedance in the OFF period PD. Accordingly, in the OFF period PD, parasitic bipolar transistors of the N-channel MOSFETs are prevented from operating due to application of dump surge.

2-2. Second Example

Figure 24:
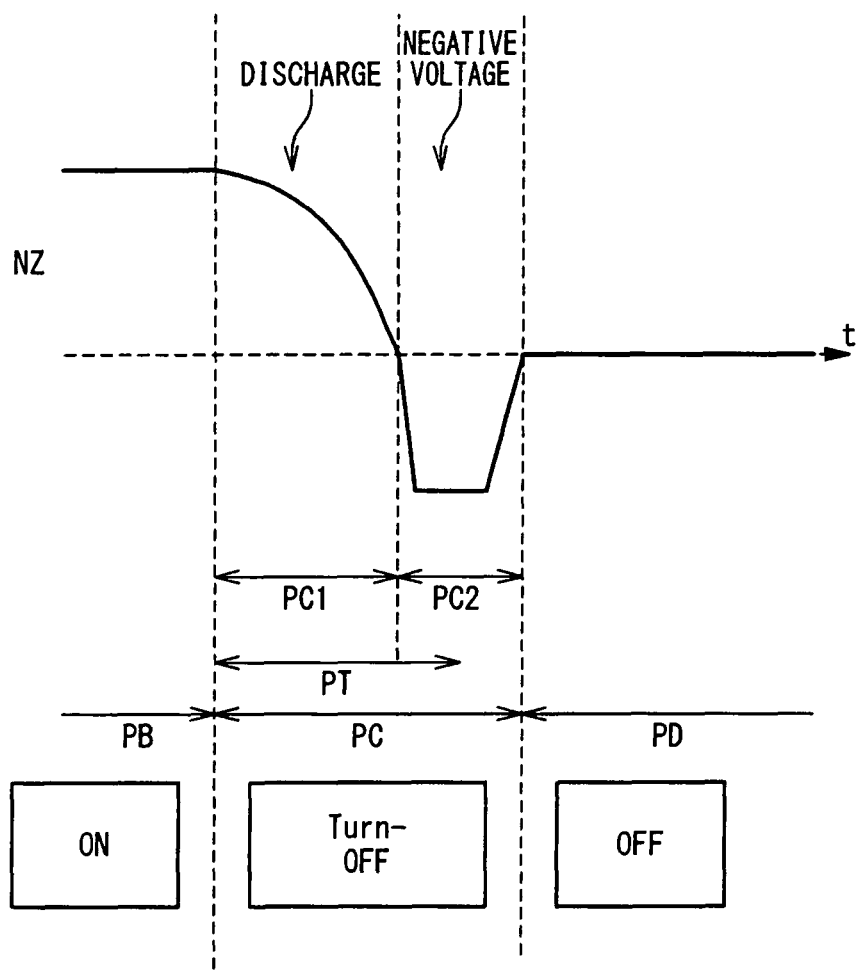
FIG. 24 is a conceptual diagram for explaining a case where a turn-OFF period includes a discharge period and a negative voltage period.

In a case where the load 20 connected to the output terminal TO is an inductive load, counter electromotive force (negative voltage) may be applied to the output terminal TO at the time of turning OFF. The similar phenomenon can be caused by an inductance component of an interconnection used for connecting the load 20. In this case, as shown in FIG. 24, the turn-OFF period PC includes not only a "discharge period PC1" when the first node N1 and the output node NZ are discharged but also a subsequent "negative voltage period PC2" when a negative voltage is applied to the output terminal TO (output node NZ).

In the foregoing example, the turn-OFF period PC includes only the discharge period PC1. In the discharge period PC1, the first switch 51B and the second switch 52B both are turned ON and thereby the second node N2 and the output node NZ are electrically connected with each other. As a result, the short transistor 40B is maintained in the OFF-state in the discharge period PC1. However, the first switch 51B and the second switch 52B are not necessarily turned ON also in the negative voltage period PC2. Therefore, according to the second example, a third switch 53B that is connected between the second node N2 and the output node NZ and is turned ON in the negative voltage period PC2 is added.

Figure 25:
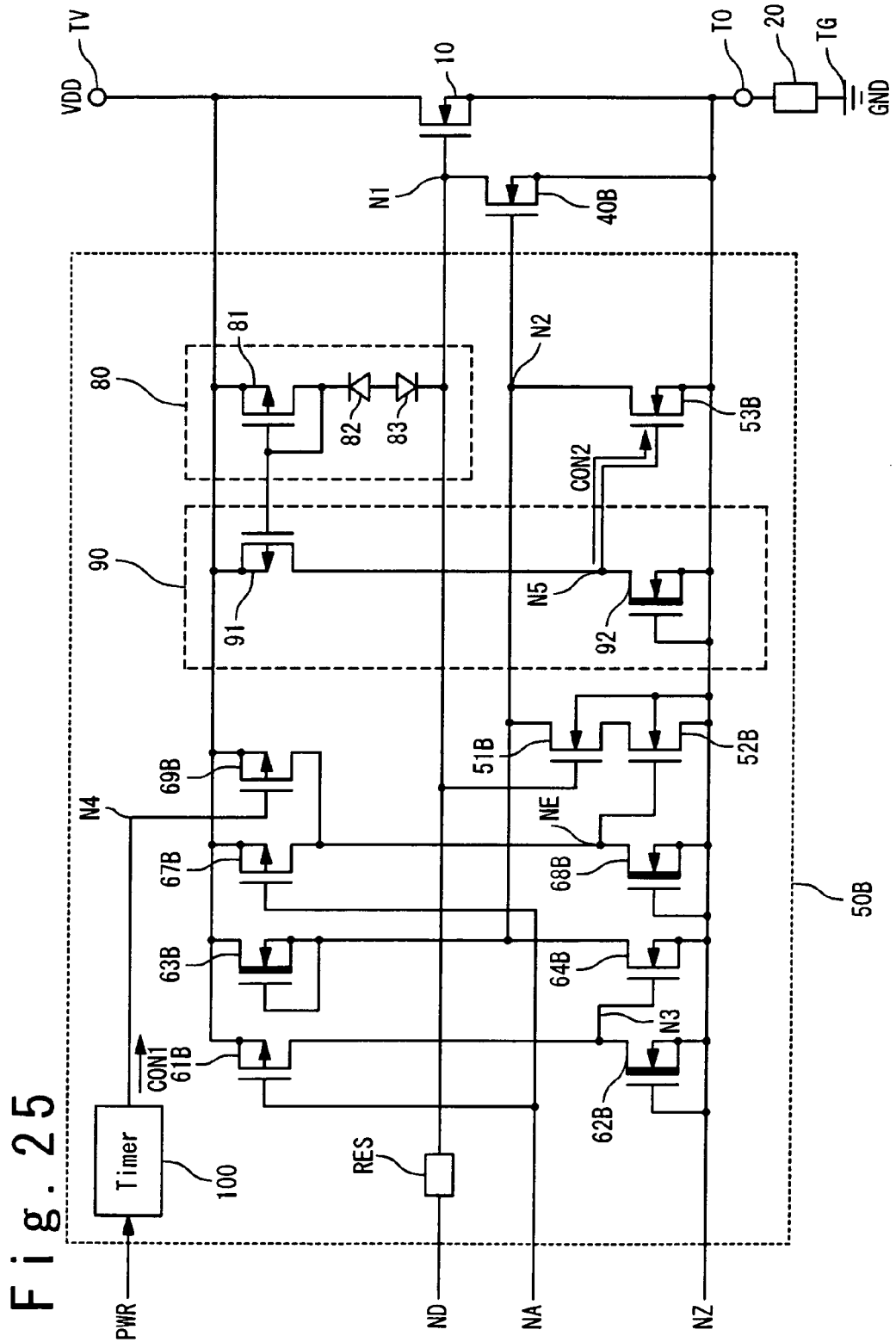
FIG. 25 is a circuit diagram showing a second example of a configuration of the short control circuit according to the second embodiment of the present invention.

FIG. 25 is a circuit diagram showing the second example. In the second example, an overvoltage protection circuit 80, a control circuit 90 and the third switch 53B are further added to the circuit configuration shown in FIG. 23.

The overvoltage protection circuit 80 (dynamic clamp circuit) is connected between the power-supply terminal TV and the first node N1. More specifically, the overvoltage protection circuit 80 has a P-channel MOSFET 81 and diodes 82 and 83. A source of the P-channel MOSFET 81 is connected to the power-supply terminal TV. A gate and a drain of the P-channel MOSFET 81 are connected to a cathode of the diode 82. An anode of the diode 82 is connected to an anode of the diode 83. A cathode of the diode 83 is connected to the first node N1. The overvoltage protection circuit 80 operates in the negative voltage period PC2.

The control circuit 90 has a P-channel MOSFET 91 and a depletion-type N-channel MOSFET 92. A gate, a source and a drain of the P-channel MOSFET 91 are respectively connected to the gate of the P-channel MOSFET 81, the power-supply terminal TV and a fifth node N5. A drain of the N-channel MOSFET 92 is connected to the fifth node N5 and a source and a gate thereof are connected to the output node NZ.

The P-channel MOSFETs 81 and 91 form a current mirror circuit. When the overvoltage protection circuit 80 operates, the fifth node N5 is charged and its voltage becomes the High-level. When the overvoltage protection circuit 80 is not operating, the voltage of the fifth node N5 is equivalent to the voltage of the output node NZ. The voltage of the fifth node N5 is used as a second control signal CON2 for ON/OFF controlling the third switch 53B. That is, the control circuit 90 activates the second control signal CON2 (CON2=High-level) only when the overvoltage protection circuit 80 is in operation.

The third switch 53B is connected between the second node N2 and the output node NZ. In particular, the third switch 53B is so connected as to be in parallel to the above-mentioned first switch 51B and second switch 52B. The third switch 53B is turned ON when the second control signal CON2 is activated (CON2=High-level) and is turned OFF when it is deactivated. For example, the third switch 53B is an N-channel MOSFET and its gate, source and drain are respectively connected to the fifth node N5, the output node NZ and the second node N2. When the second control signal CON2 is activated to be High-level, the N-channel MOSFET 53B is turned ON. As a result, the second node N2 and the output node NZ are electrically connected with each other.

Figure 26:
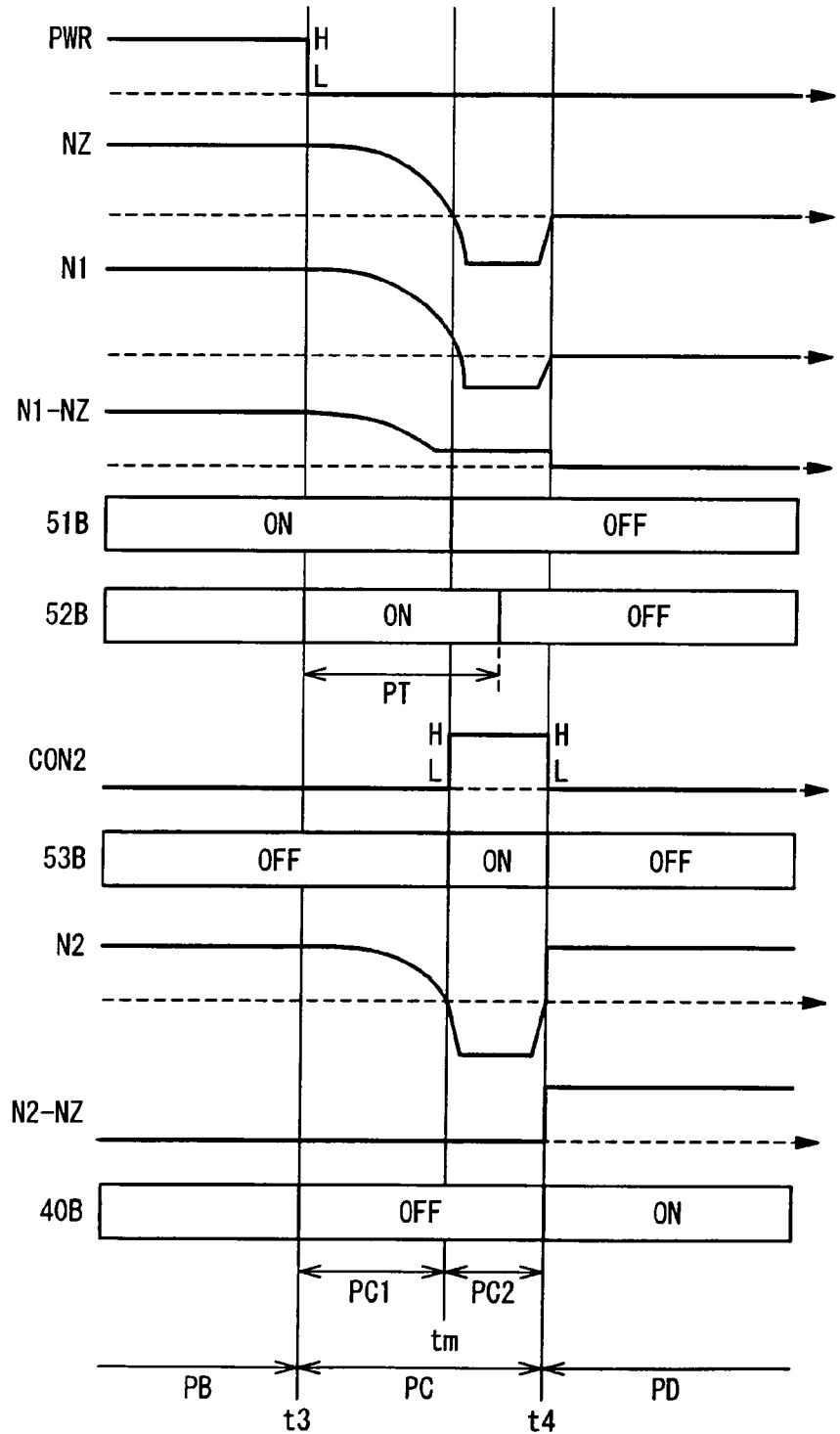
FIG. 26 is a timing chart showing an operation of the short control circuit shown in FIG. 25.

The turn-OFF period PC in the present example will be described with reference to FIGS. 25 and 26. The turn-OFF period PC includes the discharge period PC1 and the negative voltage period PC2.

(Discharge Period PC1: from Time t3 to tm)

As in the case of the foregoing example, the first switch 51B and the second switch 52B both are turned ON. Therefore, the second node N2 and the output node NZ are electrically connected with each other and thus the short transistor 40B is maintained in the OFF-state.

(Negative Voltage Period PC2: from Time tm to t4)

In order to normally operate the overvoltage protection circuit 80 in the negative voltage period PC2, it is necessary to turn ON the output transistor 10 with a low gate-source voltage. Therefore, it is not desirable that the short transistor 40B is turned ON and the first node N1 and the output node NZ are short-circuited. That is, it is necessary to maintain the short transistor 40B in the OFF-state also in the negative voltage period PC2. However, the first switch 51B or the second switch 52B may be turned OFF in the negative voltage period PC2. Therefore, the third switch 53B is provided for use in the negative voltage period PC2.

More specifically, when the negative voltage is applied to the output terminal TO, a current path is formed from the P-channel MOSFET 81 of the overvoltage protection circuit 80 to the output terminal TO through the diodes 82 and 83, the resistance element RES and the discharge transistor 33 of the gate charge-discharge circuit 30. Accordingly, a drain-source voltage of the output transistor 10 is clamped to a clamp voltage of the overvoltage protection circuit 80. When the overvoltage protection circuit 80 operates in this manner, the control circuit 90 activates the second control signal CON2 (CON2=High-level) as described above. In response to that, the third switch 53B is turned ON and thus the second node N2 and the output node NZ are electrically connected with each other. As a result, the short transistor 40B is maintained in the OFF-state.

When the negative voltage period PC2 is ended, the third switch 53B is turned OFF.

As described above, the short transistor 40B and the short control circuit 50B according to the second embodiment have no impact also on characteristics (e.g. overvoltage protection) relating to the negative voltage period PC2.

2-3. Third Example

Figure 27:
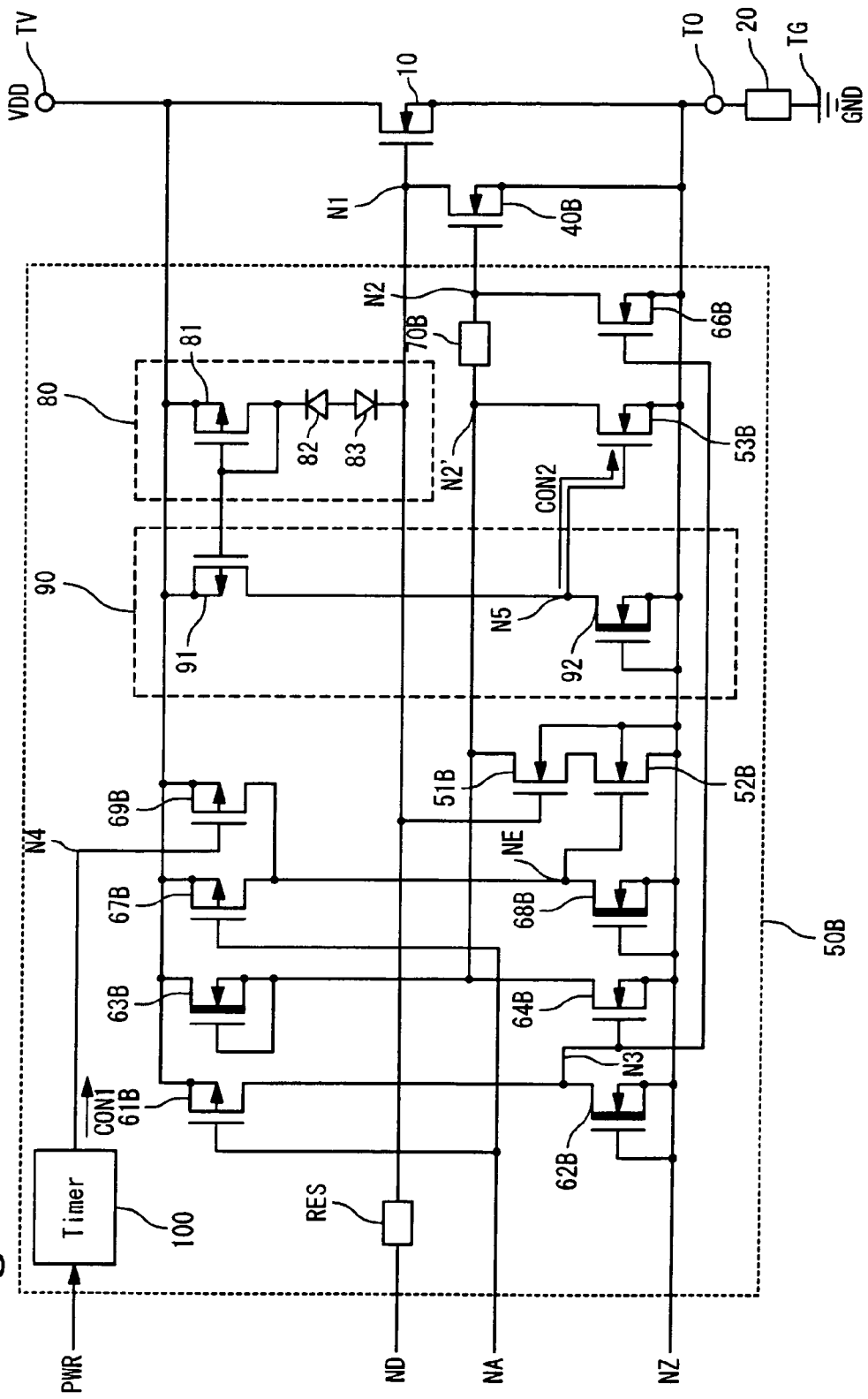
FIG. 27 is a circuit diagram showing a third example of a configuration of the short control circuit according to the second embodiment of the present invention.

FIG. 27 is a circuit diagram showing a third example. In the third example, a delay circuit 70B and a supplementary switch 66B are further added to the circuit configuration shown in FIG. 25. The drain of the N-channel MOSFET as the third switch 53B is connected to a node N2' instead of the second node N2. The node N2' is connected to the second node N2 through the delay circuit 70B.

Figure 28:
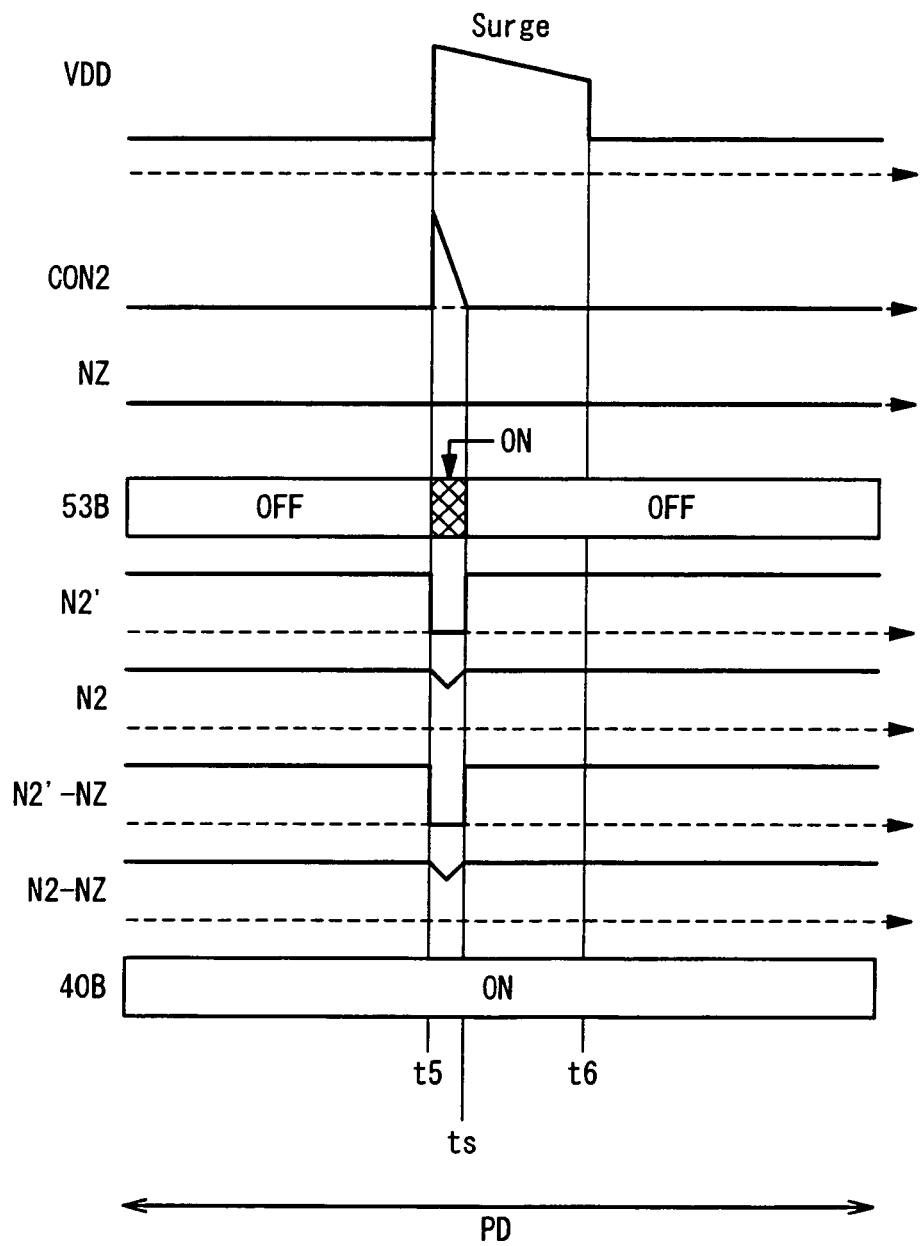
FIG. 28 is a timing chart showing an operation of the short control circuit shown in FIG. 27.

With reference to FIGS. 27 and 28, let us consider a case where dump surge is applied to the power-supply terminal TV during the OFF period PD. When the dump surge is applied to the power-supply terminal TV, a gate voltage of the P-channel MOSFET 81 of the overvoltage protection circuit 80 may be momentarily decreased to the Low-level. In this case, the second control signal CON2 is activated and the OFF state of the third switch 53B is cancelled. In the example shown in FIG. 28, the third switch 53B is turned ON and the node N2' is discharged for a short period from time t5 to ts. If the delay circuit 70B does not exist, the second node N2 connected to the gate of the short transistor 40B also is discharged and the short transistor 40B is turned OFF. This means cancellation of the short between the gate and the source of the output transistor 10, which is not preferable.

Whereas, according to the present example, the delay circuit 70B is provided between the node N2' and the second node N2. Therefore, even if the node N2' is discharged, the voltage level of the second node N2 is maintained at the High-level for a certain period of time. In other words, the short transistor 40B is maintained in the ON-state in the period from time t5 to ts. In this manner, the short between the gate and the source of the output transistor 10 is prevented from being cancelled during the OFF period PD.

Figure 29A:
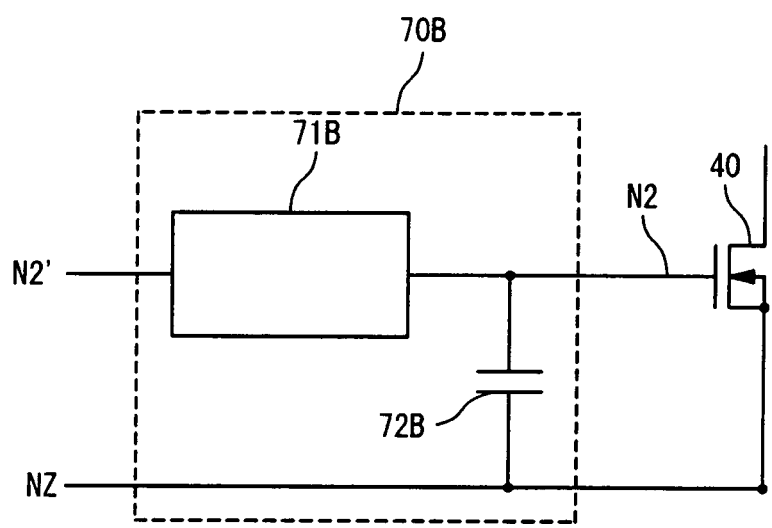
FIG. 29A is a circuit diagram showing a configuration example of a delay circuit in the short control circuit shown in FIG. 27.
Figure 29B:
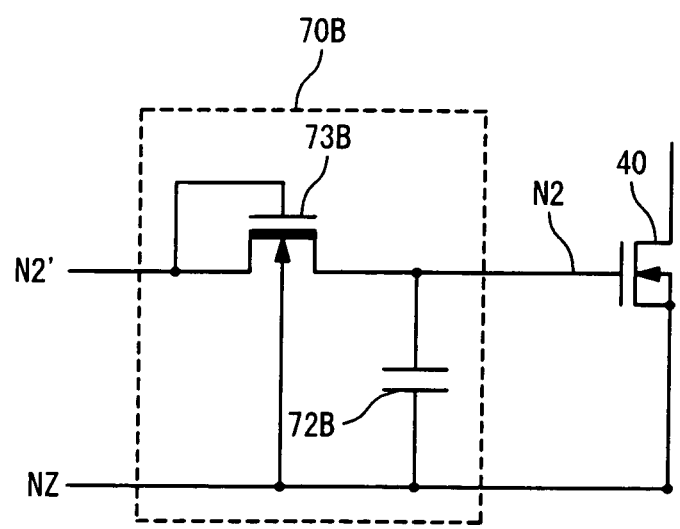
FIG. 29B is a circuit diagram showing another configuration example of a delay circuit in the short control circuit shown in FIG. 27.

FIGS. 29A and 29B show configuration examples of the delay circuit 70B. In the example shown in FIG. 29A, a resistance element 71B and a capacitance element 72B form the delay circuit 70B. In the example shown in FIG. 29B, a depletion-type N-channel MOSFET 73B serving as a constant current source and a capacitance element 72B form the delay circuit 70B. In the OFF period PD, the capacitance element 72B of the delay circuit 70B is charged to the power-supply voltage VDD. Even in the case where the node N2' is discharged due to the above-mentioned reason, the voltage level of the second node N2 can be maintained at the High-level until the capacitance element 72B of the delay circuit 70B is discharged. Note that an electric discharge time constant of the delay circuit 70B is designed to be larger than an electric discharge time constant of the node N2'.

Meanwhile, it is required to rapidly discharge the second node N2 to turn OFF the short transistor 40B at the start (time t1: refer to FIG. 22) of the turn-ON period PA. In the present example, however, the delay circuit 70B is provided between the node N2' and the second node N2 and hence discharging through the N-channel MOSFET 64B is delayed. The supplementary switch 66B is added in order to remove such the influence of the delay circuit 70B. The supplementary switch 66B is connected between the second node N2 and the output node NZ and is turned ON in the turn-ON period PA. As a result, at the start of the turn-ON period PA, the second node N2 is rapidly discharged through the supplementary switch 66B. That is, the influence of the delay circuit 70B on the turn-ON period PA is removed.

For example, the supplementary switch 66B is an N-channel MOSFET and its gate, source and drain are respectively connected to the third node N3, the output node NZ and the second node N2. In the turn-ON period PA, the power-supply voltage VDD is applied to the third node N3. The N-channel MOSFET 66B is turned ON until a voltage difference (N3−NZ) between the third node N3 and the output node NZ becomes lower than its threshold voltage. The N-channel MOSFET 66B is turned OFF in the period other than the turn-ON period PA. Accordingly, the above-mentioned purpose is achieved.

2-4. Fourth Example

In the foregoing examples, care should be taken for an initial operation in the turn-OFF period PC. At the start of the turn-OFF period, as described above, the first control signal CON1 is changed to the Low-level and the node NE is pulled up to the power-supply voltage VDD. However, at an early stage when the voltage of the output node NZ is close to the power-supply voltage VDD, a gate-source voltage of the N-channel MOSFET 52B is likely to be lower than its threshold voltage and the N-channel MOSFET 52B (second switch) may be maintained in the OFF-state. In this case, the second node N2 is pulled up by the N-channel MOSFET 63B and thereby the short transistor 40B may be turned ON. That is, at the early stage of the turn-OFF period PC, the short transistor 40B may be momentarily turned ON and hence a discharge path may be formed from the first node N1 to the output node NZ through the short transistor 40B.

In order to prevent such the phenomenon, the N-channel MOSFET 52B (second switch) just needs to be turned ON earlier than the short transistor 40B. That is to say, the threshold voltage of the N-channel MOSFET 52B just needs to be designed to be lower than the threshold voltage of the short transistor 40B.

Alternatively, a configuration shown in FIG. 30 also is effective. In the example shown in FIG. 30, another short transistor 41B (N-channel MOSFET) as a component of the short switch circuit 4 is further added to the circuit configuration shown in FIG. 23. The short transistors 40B and 41B are connected in series between the first node N1 and the output node NZ. In FIG. 30, a gate, a source and a drain of the short transistor 41B are respectively connected to the fourth node N4, the output node NZ and the first node N1 side. In the timer period PT, the first control signal CON1 is at the Low-level and the short transistor 41B is turned OFF. In the other periods, the first control signal CON1 is at the High-level and the short transistor 41B is turned ON.

At the early stage of the turn-OFF period PC, the voltage of the output node NZ is close to the power-supply voltage VDD. Meanwhile, the first control signal CON1 of the Low-level is applied to the fourth node N4. Therefore, the short transistor 41B is completely turned OFF. Even if the short transistor 40B is momentarily turned ON at the early stage of the turn-OFF period PC, no discharge path is formed from the first node N1 to the output node NZ through the short transistors 40B and 41B. In the periods other than the timer period PT, the short transistor 41B is turned ON and the same operation as in the cases of the foregoing examples can be achieved.

2-5. Fifth Example

Figure 31:
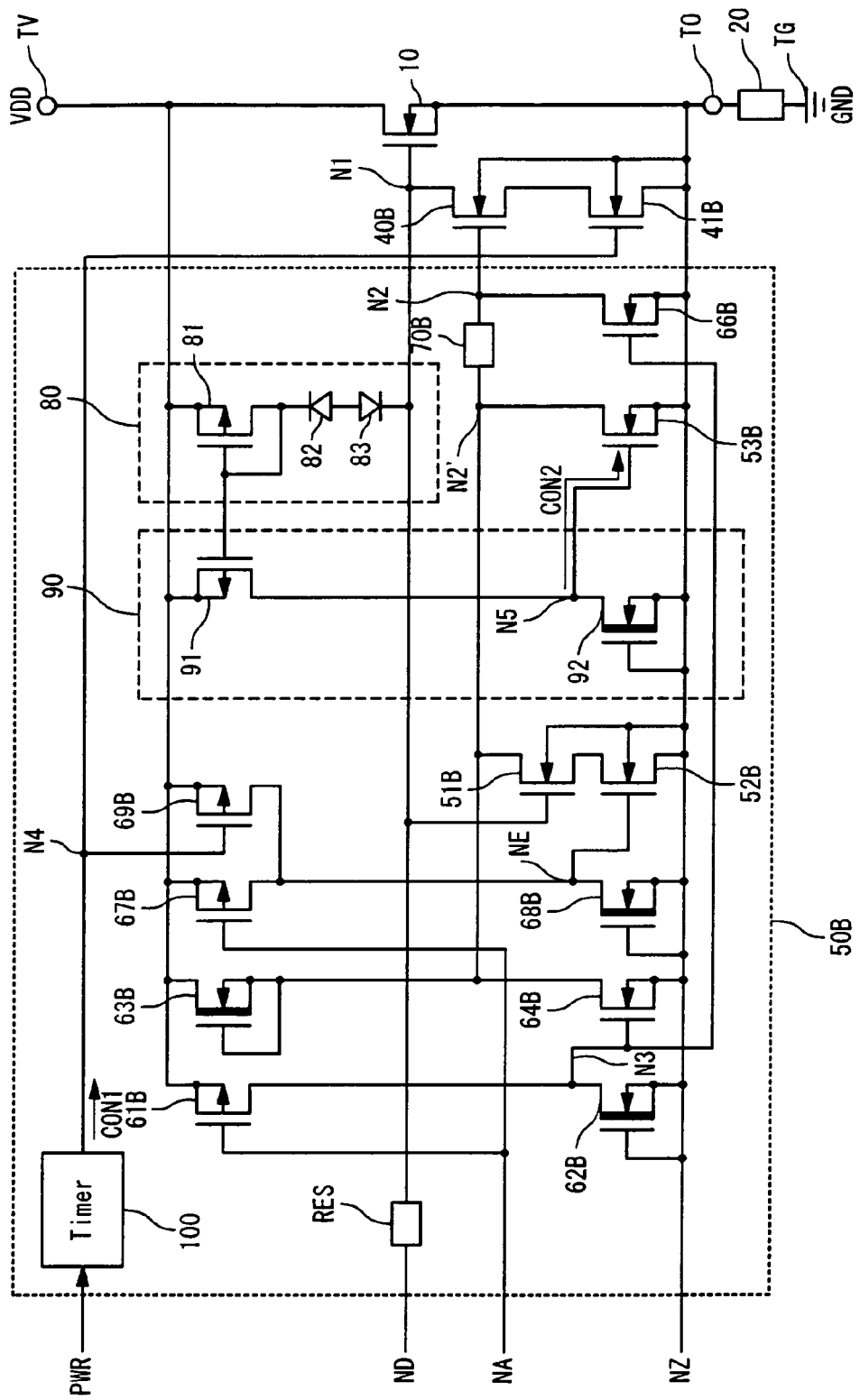
FIG. 31 is a circuit diagram showing a fifth example of a configuration of the short control circuit according to the second embodiment of the present invention.

Some of the above-described examples can be combined together. FIG. 31 shows a circuit configuration in a case where all of the first to fourth examples are combined together.

2-6. Timer Circuit

The timer circuit 100 according to the present embodiment outputs the first control signal CON1 of the Low-level to the fourth node N4 only for the predetermined timer period PT after the power-ON signal PWR is changed from the High-level to the Low-level. In the other periods, the timer circuit 100 outputs the first control signal CON1 of the High-level to the fourth node N4. An example of the timer circuit 100 will be described below.

Figure 32:
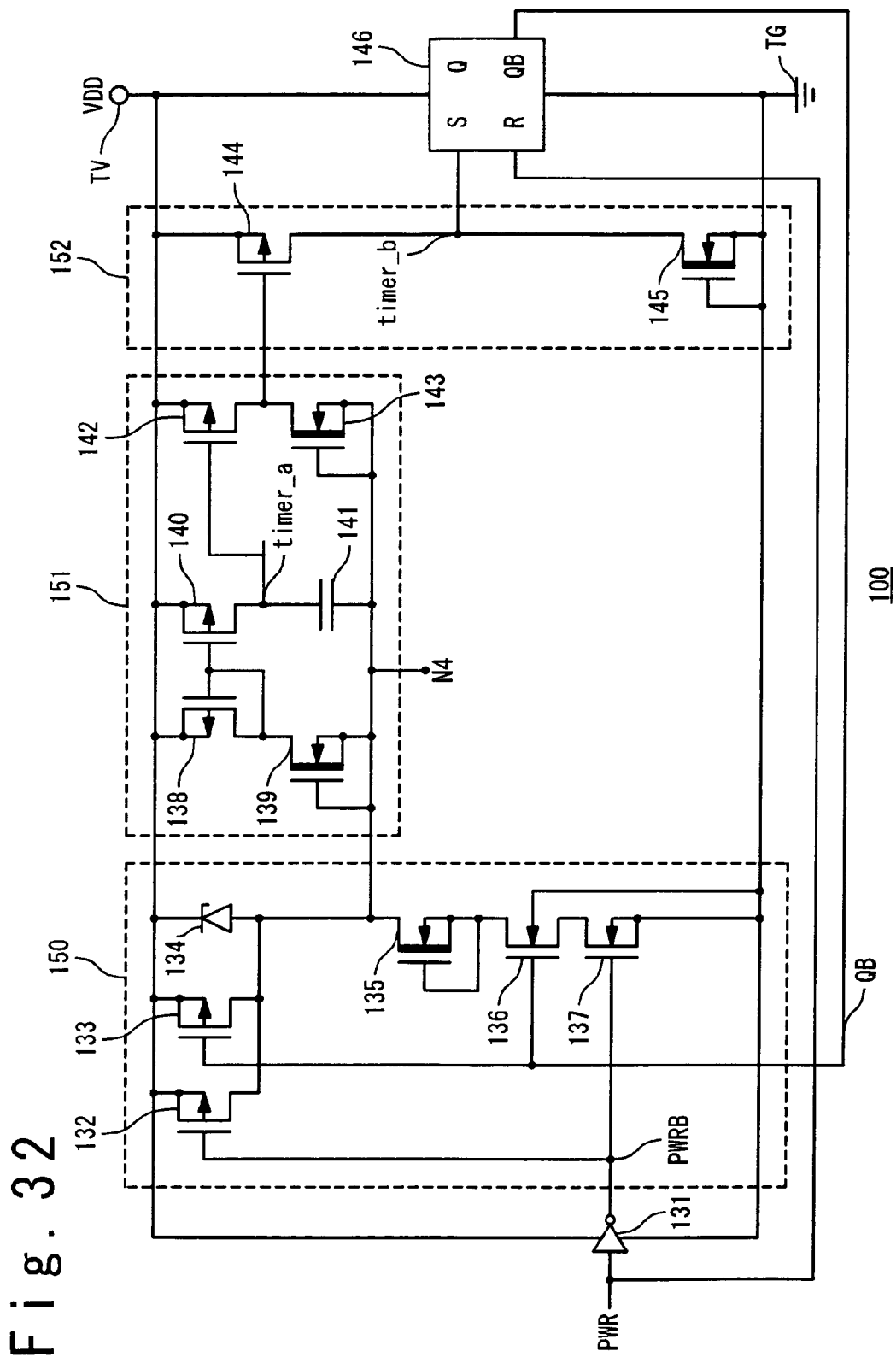
FIG. 32 is a circuit diagram showing a configuration example of a timer circuit in the embodiment of the present invention.

FIG. 32 is a circuit diagram showing a configuration example of the timer circuit 100. The timer circuit 100 has an inverter circuit 131, an internal voltage control circuit 150, a delay generation circuit 151, a level shift circuit 152 and an RS flip-flop circuit 146.

The inverter circuit 131 is connected between the power-supply terminal TV and a ground terminal TG. The inverter circuit 131 receives the power-ON signal PWR and outputs an inversion signal PWRB thereof.

The internal voltage control circuit 150 controls a voltage of the fourth node N4 depending on the inversion signal PWRB and an output signal of the RS flip-flop circuit 146. The internal voltage control circuit 150 has P-channel MOSFETs 132 and 133, a Zener diode 134 and N-channel MOSFETs 135, 136 and 137. Sources of the P-channel MOSFETs 132 and 133 are connected to the power-supply terminal TV and drains thereof are connected to the fourth node N4. The inversion signal PWRB is input to a gate of the P-channel MOSFET 132. A gate of the P-channel MOSFET 133 is connected to an output terminal QB of the RS flip-flop circuit 146. A cathode and an anode of the Zener diode 134 are respectively connected to the power-supply terminal TV and the fourth node N4. A drain of the depletion-type N-channel MOSFET 135 is connected to the fourth node N4 and a source and a gate thereof are connected to a drain of the N-channel MOSFET 136. A source and a gate of the N-channel MOSFET 136 are respectively connected to a drain of the N-channel MOSFET 137 and the output terminal QB of the RS flip-flop circuit 146. A source of the N-channel MOSFET 137 is connected to the ground terminal TG and the inversion signal PWRB is input to a gate thereof.

The delay generation circuit 151 has P-channel MOSFETs 138, 140 and 142, N-channel MOSFETs 139 and 143 and a capacitance element 141. A source of the P-channel MOSFET 138 is connected to the power-supply terminal TV, and a drain and a gate thereof are connected to a drain of the N-channel MOSFET 139. A source, a drain and a gate of the P-channel MOSFET 140 are respectively connected to the power-supply terminal TV, one end of the capacitance element 141 (timer_a) and the gate of the P-channel MOSFET 138. The P-channel MOSFETs 138 and 140 form a current mirror circuit. A source and a gate of the depletion-type N-channel MOSFET 139 are connected to the fourth node N4. The N-channel MOSFET 139 serves as a reference current source for the current mirror circuit consisting of the P-channel MOSFETs 138 and 140. Another end of the capacitance element 141 is connected to the fourth node N4. The capacitance element 141 charges a constant current from the P-channel MOSFET 140 to generate a delay time. A source, a drain and a gate of the P-channel MOSFET 142 are respectively connected to the power-supply terminal TV, a drain of the N-channel MOSFET 143 and one end of the capacitance element 141 (timer_a). A source and a gate of the depletion-type N-channel MOSFET 143 are connected to the fourth node N4. The P-channel MOSFET 142 and the N-channel MOSFET 143 form an inverter circuit and, when a charge voltage of the capacitance element 141 (i.e. a voltage of the timer_a) exceeds a logical threshold value, outputs a delay time signal.

The level shift circuit 152 performs level-shifting for the delay time signal output from the delay generation circuit 151. The level shift circuit 152 is provided with a P-channel MOSFET 144 and a depletion-type N-channel MOSFET 145. A source, a drain and a gate of the P-channel MOSFET 144 are respectively connected to the power-supply terminal TV, an output terminal timer_b and an output terminal of the inverter circuit in the delay generation circuit 151. A source and a gate of the N-channel MOSFET 145 are connected to the ground terminal TG and a drain thereof is connected to the output terminal timer_b. The output terminal timer_b of the level shift circuit 152 is connected to a set terminal S of the RS flip-flop circuit 146.

The RS flip-flop circuit 146 outputs output signals Q and QB depending on the power-ON signal PWR and the output signal (timer_b) of the level shift circuit 152 to control the internal voltage control circuit 150. The RS flip-flop circuit 146 is of a set priority type. The RS flip-flop circuit 146 is connected between the power-supply terminal TV and the ground terminal TG. The set terminal S of the RS flip-flop circuit 146 is connected to the output terminal timer_b of the level shift circuit 152 and a reset terminal R thereof is connected to the input terminal TI.

Figure 33:
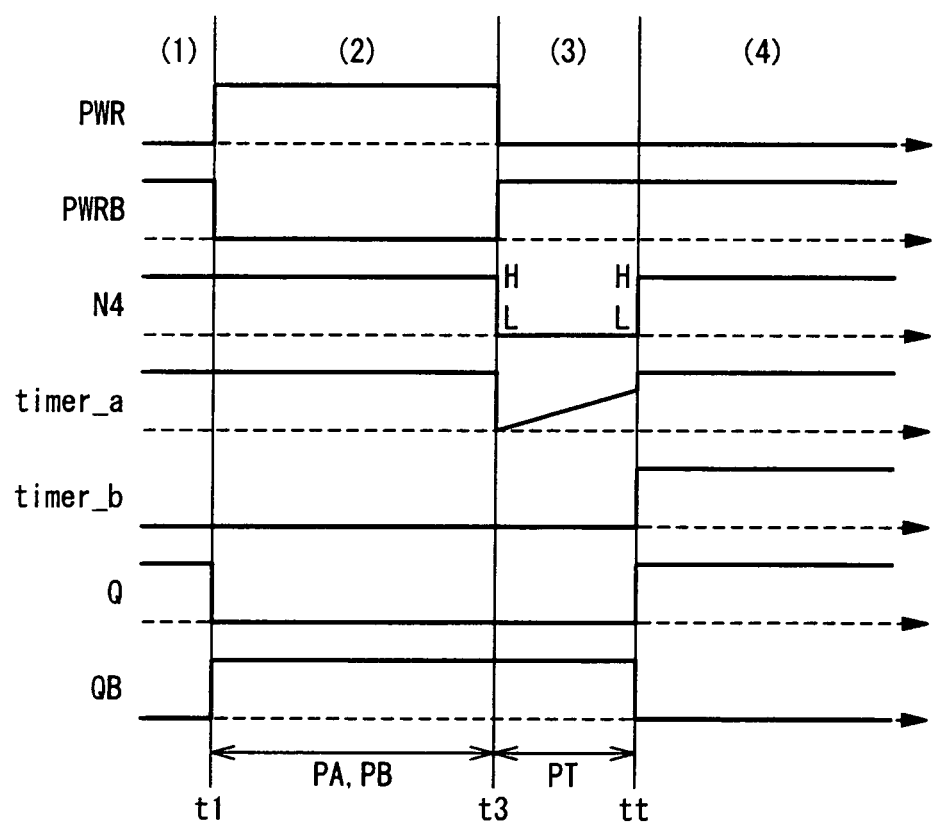
FIG. 33 is a timing chart showing an operation of the timer circuit shown in FIG. 32.

FIG. 33 is a timing chart showing an operation of the timer circuit 100 shown in FIG. 32.

A status (1) corresponds to the OFF period PD. In the status (1), the inversion signal QB is at the Low-level because the RS flip-flop circuit 146 is of the set priority type. Therefore, the N-channel MOSFET 136 of the internal voltage control circuit 150 is turned OFF and electrical connection between the fourth node N4 and the ground terminal TG is cut off. On the other hand, the P-channel MOSFET 133 is turned ON and thus the fourth node N4 is pulled up to the power-supply voltage VDD.

A status (2) corresponds to the turn-ON period PA and the ON period PB. Since the power-ON signal PWR changes to the High-level, the RS flip-flop circuit 146 is reset and the inversion signal QB becomes the High-level. As a result, the N-channel MOSFET 136 is turned ON and the P-channel MOSFET 133 is turned OFF. On the other hand, since the inversion signal PWRB of the power-ON signal PWR is at the Low-level, the N-channel MOSFET 137 is turned OFF and the P-channel MOSFET 132 is turned ON. Therefore, the electrical connection between the fourth node N4 and the ground terminal TG is cut off and thus the fourth node N4 is pulled up to the power-supply voltage VDD.

A status (3) corresponds to the timer period PT. Although the reset of the RS flip-flop circuit 146 is cancelled because the power-ON signal PWR is changed to the Low-level, the state of the RS flip-flop circuit 146 does not change. Therefore, the inversion signal QB is maintained at the High-level. Meanwhile, since the inversion signal PWRB of the power-ON signal PWR is changed to the High-level, the P-channel MOSFET 132 is turned OFF and the N-channel MOSFET 137 is turned ON. As a result, the fourth node N4 is electrically connected to the ground terminal TG.

Here, due to the Zener diode 134, the voltage of the fourth node N4 becomes a voltage lower than the power-supply voltage VDD by a Zener breakdown voltage. The depletion-type N-channel MOSFET 135 plays a role of limiting a current flowing through the Zener diode 134.

When the voltage of the fourth node N4 becomes lower than the power-supply voltage VDD, the delay generation circuit 151 becomes active and starts to generate a delay time. More specifically, the current mirror circuit of the delay generation circuit 151 supplies a constant current to the capacitance element 141 to charge the capacitance element 141. That is, a voltage of the node timer_a monotonically increases with time. The output terminal timer_b of the level shift circuit 152 is maintained at the Low-level until the voltage of the node timer_a exceeds a logical threshold value of the next-stage inverter circuit consisting of the P-channel MOSFET 142 and the N-channel MOSFET 143.

When the voltage of the node timer_a exceeds the logical threshold value of the next-stage inverter circuit, the output terminal timer_b of the level shift circuit 152 becomes at the High-level. That is, a High-level signal (set signal) is given to the set terminal S of the RS flip-flop circuit 146 and hence the inversion signal QB output from the RS flip-flop circuit 146 is changed to the Low-level. This status (4) corresponds to the OFF period PD after the timer period PT.

3. Third Embodiment

<Basic Configuration>

Figure 34:
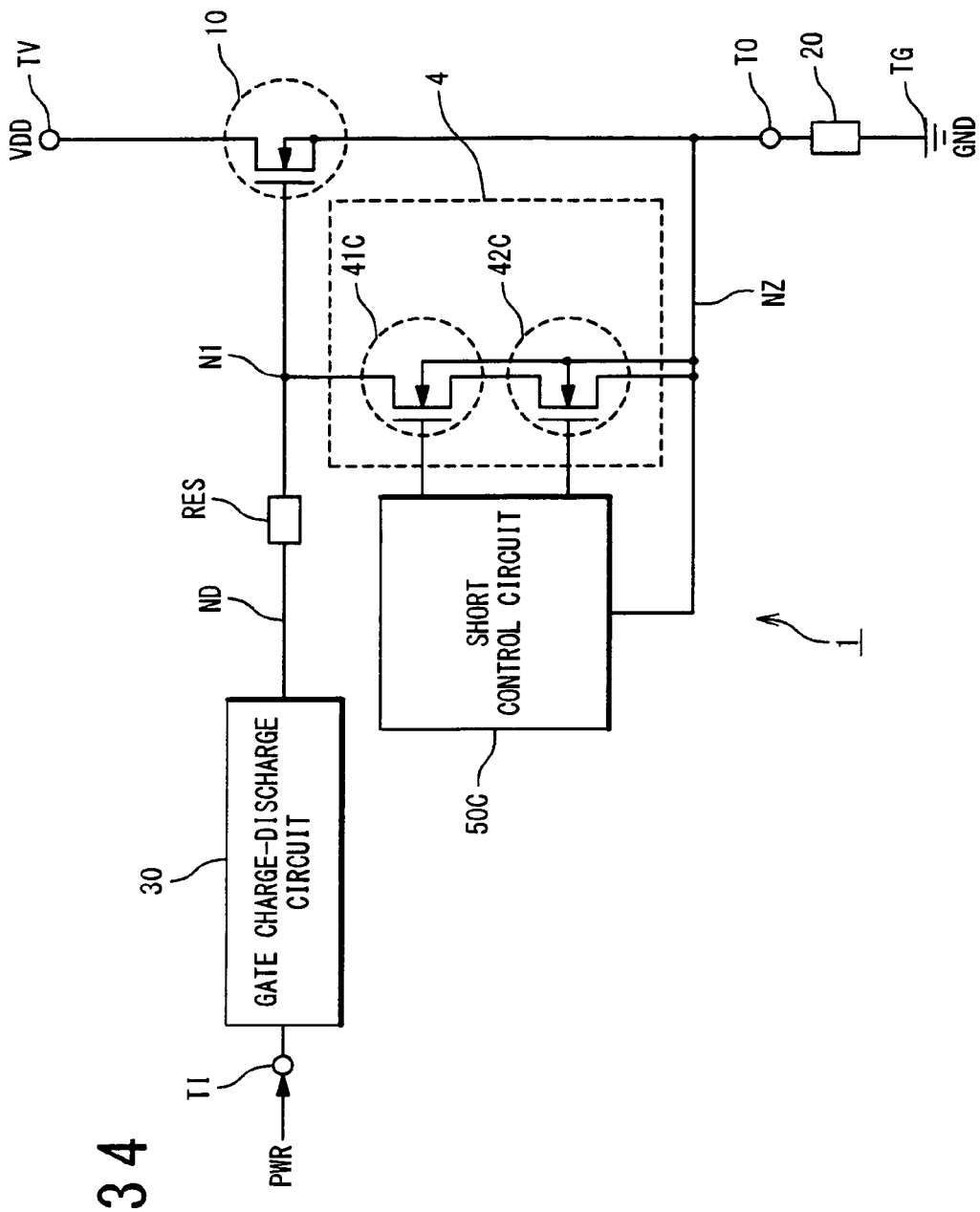
FIG. 34 is a block diagram schematically showing a configuration of a power semiconductor device according to a third embodiment of the present invention.

FIG. 34 is a block diagram schematically showing a configuration of the power semiconductor device 1 according to a third embodiment. In the third embodiment, the short switch circuit 4 includes a first short switch 41C and a second short switch 42C that are connected in series between the first node N1 and the output node NZ. The short control circuit 50 in the present embodiment is referred to as a short control circuit 50C. The short control circuit 50C can turn ON/OFF the electrical connection between the first node N1 and the output node NZ through the short switch circuit 4 by ON/OFF controlling the first short switch 41C and the second short switch 42C.

<Basic Operation>

Figure 35:
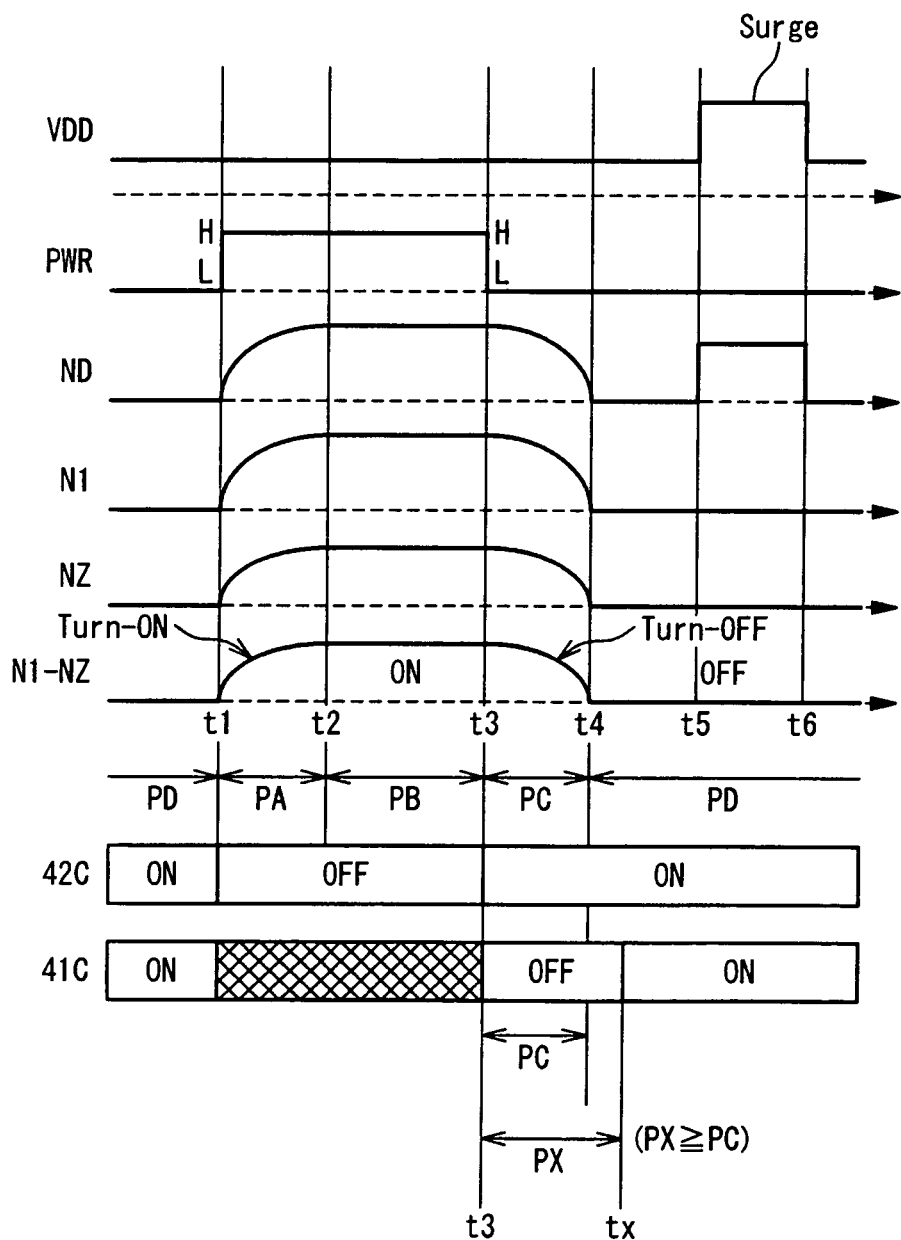
FIG. 35 is a timing chart showing an operation of the power semiconductor device according to the third embodiment of the present invention.

FIG. 35 is a timing chart showing an operation of the power semiconductor device 1 according to the third embodiment. A basic operation of the power semiconductor device 1 will be described hereinafter with reference to FIGS. 34 and 35. In describing the operation, let us consider four periods (phases): a turn-ON period PA, an ON period PB, a turn-OFF period PC and an OFF period PD.

The turn-ON period PA and the ON period PB are periods when the power-ON signal PWR is being activated (PWR=High-level). When the power-ON signal PWR is activated, the first node N1 is charged, the output transistor 10 is turned ON and the output node NZ also is charged. The ON period PB is a period when voltages of the first node N1 and the output node NZ are stable and the output transistor 10 is stably in an ON-state. On the other hand, the turn-ON period PA is a period from the activation timing of the power-ON signal PWR to the ON period PB. In other words, the turn-ON period PA is a transition period from the OFF period PD to the ON period PB.

The turn-OFF period PC and the OFF period PD are periods when the power-ON signal PWR is being deactivated (PWR=Low-level). When the power-ON signal PWR is deactivated, the first node N1 is discharged, the output transistor 10 is turned OFF and the output node NZ also is discharged. The OFF period PD is a period when voltages of the first node N1 and the output node NZ are stable and the output transistor 10 is stably in an OFF-state. On the other hand, the turn-OFF period PC is a period from the deactivation timing of the power-ON signal PWR to the OFF period PD. In other words, the turn-OFF period PC is a transition period from the ON period PB to the OFF period PD.

Furthermore, in the third embodiment, a "control period PX" is used in the description. The control period PX starts concurrently with timing when the power-ON signal PWR is deactivated, namely, the start of the turn-OFF period PC. A length of the control period PX is equal to or larger than a length of the turn-OFF period PC. The control period PX and the turn-OFF period PC may be equal to each other. In the control period PX, at least one of the first short switch 41C and the second short switch 42C is turned OFF, which will be described in detail later.

(Turn-ON Period PA: from Time t1 to t2)

At a time t1, the power-ON signal PWR is activated and changed from the Low-level to the High-level. In response to that, the gate charge-discharge circuit 30 starts to charge the node ND and the first node N1. In the turn-ON period PA, the short control circuit 50C turns OFF at least one of the first short switch 41C and the second short switch 42C. In the example shown in FIG. 35, the short control circuit 50C turns OFF the second short switch 42C. Therefore, the first node N1 and the output node NZ are not short-circuited, namely, the gate and the source of the output transistor 10 are not short-circuited. The output transistor 10 is turned ON and thus a voltage of the output node NZ is increased gradually. It should be noted that in the turn-ON period PA, the first node N1 is charged to a high voltage higher than the power-supply voltage VDD.

(ON Period PB: from Time t2 to t3)

In the ON period PB, the short control circuit 50C maintains the second short switch 42C in the OFF-state. The voltage of the first node N1 is stable at the high voltage higher than the power-supply voltage VDD. The voltage of the output node NZ is stable at near the power-supply voltage VDD. The output transistor 10 is stably in the ON-state.

(Turn-OFF Period PC: from Time t3 to t4)

At a time t3, the power-ON signal PWR is deactivated and changed from the High-level to the Low-level. In response to that, the gate charge-discharge circuit 30 starts to discharge the node ND and the first node N1. Also in the turn-OFF period PC, the short control circuit 50C turns OFF at least one of the first short switch 41C and the second short switch 42C. In the example shown in FIG. 35, the short control circuit 50C turns ON the second short switch 42C in response to the deactivation of the power-ON signal PWR deactivate. On the other hand, the short control circuit 50C turns OFF the first short switch 41C for the above-mentioned control period PX (time t3 to tx). Therefore, discharging through the first short switch 41C and the second short switch 42C does not occur. That is, the discharging of the first node N1 is achieved only by the gate charge-discharge circuit 30, as in the conventional case. In response to decrease in the voltage of the first node N1, the voltage of the output node NZ also is gradually decreased and eventually becomes 0 V. The output transistor 10 is turned OFF.

(OFF Period PD: from Time t4)

In the OFF period PD, the short control circuit 50C maintains the second short switch 42C in the ON-state. Moreover, when the control period PX is ended, the short control circuit 50C turns ON the first short switch 41C. That is, in the OFF period PD after the control period PX is ended, the short control circuit 50C turns ON both the first short switch 41C and the second short switch 42C. As a result, the first node N1 and the output node NZ are short-circuited, namely, the gate and the source of the output transistor 10 are short-circuited. The output transistor 10 is stably in the OFF-state.

In this manner, the short control circuit 50C ON/OFF controls the second short switch 42C in synchronization with the power-ON signal PWR and particularly turns OFF the second short switch 42C during the power-ON signal PWR is being activated. Meanwhile, the short control circuit 50C turns OFF the first short switch 41C in the control period PX including the turn-OFF period PC. As a result, discharging of the first node N1 through the first short switch 41C and the second short switch 42C is prevented not only in the turn-ON period PA and the ON period PB but also in the turn-OFF period PC. That is, the short switches 41C and 42C and the short control circuit 50C according to the third embodiment have no impact on characteristics relating to the turning-OFF of the output transistor 10 (e.g. a time required for the turning-OFF).

<Operation at Time of Application of Dump Surge>

Next, let us consider a case where steep rise in the power-supply voltage VDD occurs in the OFF period PD after the control period PX is ended, due to application of dump surge and the like. In the example shown in FIG. 35, dump surge is applied to the power-supply terminal TV from time t5 to t6 during the OFF period PD after the control period PX is ended.

Figure 36:
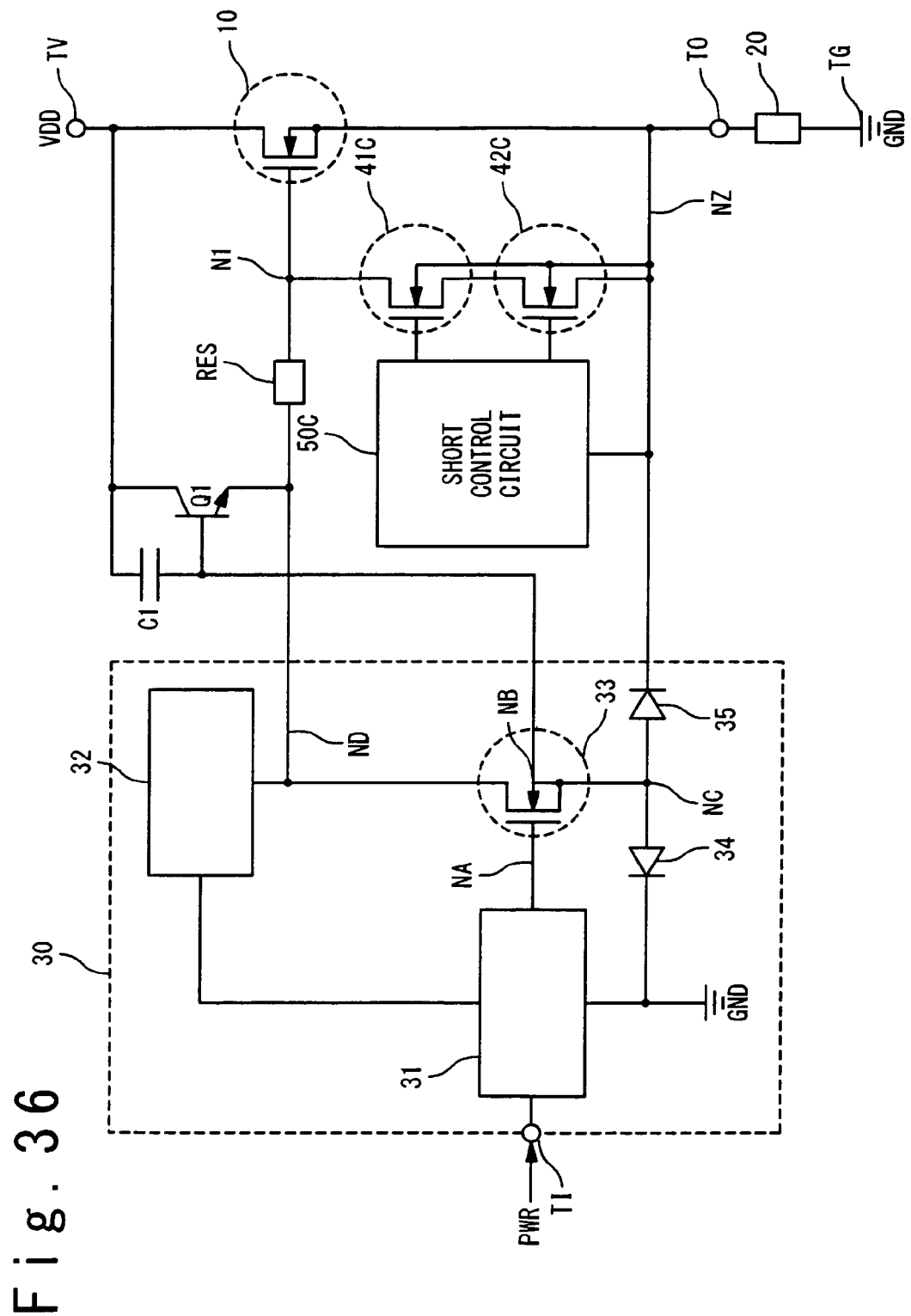
FIG. 36 is a circuit diagram for explaining an operation of the power semiconductor device at a time when dump surge is applied.

FIG. 36 shows a case where the gate charge-discharge circuit 30 has the same configuration as that shown in the foregoing FIGS. 1 and 3. The discharge transistor 33 of the gate charge-discharge circuit 30 has the parasitic bipolar transistor Q1, as described above. The collector, the emitter and the base of the parasitic bipolar transistor Q1 are respectively connected to the power-supply terminal TV, the node ND and the node NB. Moreover, the parasitic capacitor (collector-base capacitor) C1 is connected between the power-supply terminal TV and the node NB.

In the case where steep rise in the power-supply voltage VDD occurs during the OFF period PD, the parasitic bipolar transistor Q1 may be turned ON as described above. If the parasitic bipolar transistor Q1 is turned ON, the voltage of the node ND is increased. However, in the OFF period PD after the control period PX is ended, the first short switch 41C and the second short switch 42C are turned ON, and thus the first node N1 and the output node NZ are short-circuited, namely, the gate and the source of the output transistor 10 are short-circuited. Since the gate-source voltage does not exceed a threshold voltage, the output transistor 10 maintains the OFF-state without being turned ON.

It should be noted that the resistance element RES is provided between the node ND and the first node N1. If the voltage of the node ND rises, a current flows from the node ND through the resistance element RES, the first node N1 and the short switches 41C and 42C to the output node NZ. At this time, IR drop occurs at the resistance element RES and accordingly the voltage of the first node N1 is maintained at the Low-level. That is to say, using the resistance element RES makes it easier to maintain the voltage of the first node N1 at the Low-level.

<Effects>

According to the third embodiment, the first short switch 41C and the second short switch 42C connected between the first node N1 and the output node NZ are turned ON in the OFF period PD after the control period PX is ended. As a result, the first node N1 and the output node NZ are short-circuited, namely, the gate and the source of the output transistor 10 are short-circuited. Therefore, even if steep rise in the power-supply voltage VDD occurs, the output transistor 10 is prevented from being turned ON. That is, thermal breakdown of the output transistor 10 can be prevented.

Moreover, according to the third embodiment, at least one of the first short switch 41C and the second short switch 42C is maintained in the OFF-state in the turn-ON period PA, the ON period PB and the turn-OFF period PC. Therefore, in the turn-ON period PA, the ON period PB and the turn-OFF period PC, the short switches 41C and 42C and the short control circuit 50C do not affect the first node N1. In other words, the short switches 41C and 42C and the short control circuit 50C have no impact on characteristics relating to turning-ON/turning-OFF of the output transistor 10 (e.g. times required for the turning-ON/turning-OFF). That is, according to the third embodiment, it is possible to prevent the thermal breakdown of the output transistor 10 without affecting the characteristics relating to turning-ON/turning-OFF.

<Outline of Short Control Circuit>

Figure 37:
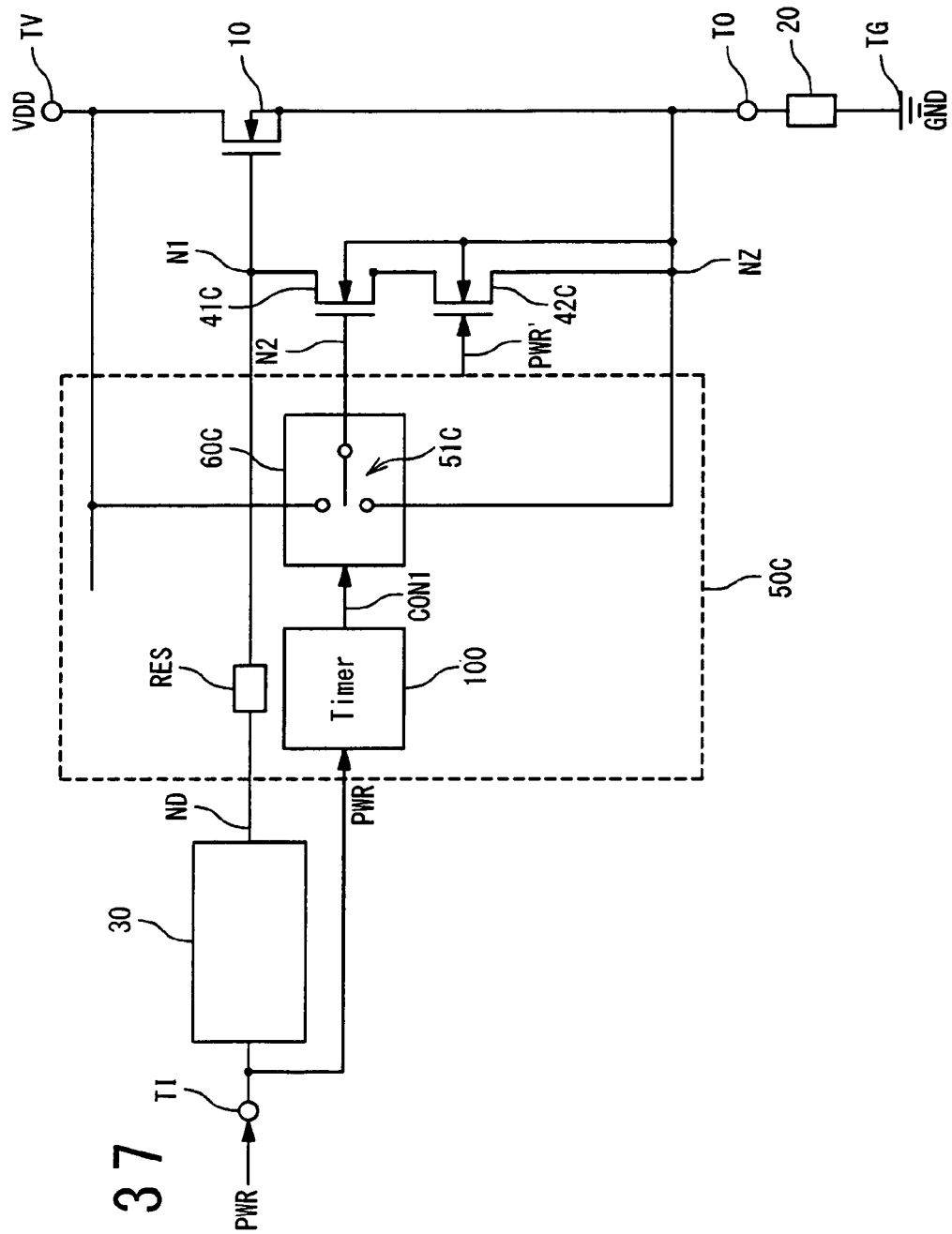
FIG. 37 is a circuit diagram schematically showing a configuration of a short control circuit according to the third embodiment of the present invention.

FIG. 37 schematically shows a configuration of the first short switch 41C, the second short switch 42C and the short control circuit 50C according to the third embodiment. For example, an N-channel MOSFET (hereinafter referred to as a "first short transistor 41C") is used as the first short switch 41C. Also for example, an N-channel MOSFET (hereinafter referred to as a "second short transistor 42C") is used as the second short switch 42C. A source, a drain and a gate of the first short transistor 41C are respectively connected to a drain of the second short transistor 42C, the first node N1 and a second node N2. A source and a drain of the second short transistor 42C are respectively connected to the output node NZ and the source of the first short transistor 41C.

A gate of the second short transistor 42C is supplied with a control signal PWR'. The short control circuit 50C ON/OFF controls the second short transistor 42C by supplying the control signal PWR'. For example, the control signal PWR' is an inversion signal of the power-ON signal PWR. In this case, in the turn-ON period PA and the ON period PB when the power-ON signal PWR is activated (PWR=High-level), the control signal PWR' is deactivated (PWR'=Low-level) and the second short transistor 42C is turned OFF. In the turn-OFF period PC and the OFF period PD when the power-ON signal PWR is deactivated (PWR=Low-level), the control signal PWR' is activated (PWR'=High-level) and the second short transistor 42C is turned ON.

The gate of the first short transistor 41C is connected to the second node N2. It is possible to ON/OFF control the first short transistor 41C by controlling a voltage of the second node N2. The short control circuit 50C is connected to the second node N2 and controls the voltage of the second node N2. More specifically, the short control circuit 50C has a switch section 60C and a timer circuit 100.

The switch section 60C controls electrical connection between the second node N2 and the power-supply terminal TV and electrical connection between the second node N2 and the output node NZ. More specifically, at least in the above-mentioned control period PX, the switch section 60C electrically connects the second node N2 and the output node NZ. Accordingly, the gate and the source of the first short transistor 41C are short-circuited and thus the first short transistor 41C is turned OFF. Moreover, in the OFF period PD after the control period PX is ended, the switch section 60C cuts off the electrical connection between the second node N2 and the output node NZ while electrically connects the second node N2 and the power-supply terminal TV. As a result, the first short transistor 41C is turned ON.

Here, the control period PX includes a predetermined timer period PT. The predetermined timer period PT starts concurrently with timing (time t3) when the power-ON signal PWR is deactivated, namely, the start of the turn-OFF period PC. A length of the predetermined timer period PT is typically designed to be equal to or larger than a length of the turn-OFF period PC. However, if the turn-OFF period PC includes both the discharge period PC1 and the negative voltage period PC2 as will be described later in a second example (refer to FIG. 40), a length of the predetermined timer period PT just needs to be equal to or larger than a length of the discharge period PC1.

The predetermined timer period PT can be recognized based on a first control signal CON1 that is output from a timer circuit 100. Specifically, the timer circuit 100 activates the first control signal CON1 (CON1=Low-level) only for the predetermined timer period PT. In the period other than the predetermined timer period PT, the timer circuit 100 deactivates the first control signal CON1 (CON1=High-level). It should be noted that the timer circuit 100 is the same as the foregoing one shown in FIGS. 32 and 33.

An operation of the short control circuit 50C according to the third embodiment will be described with reference to FIGS. 37 and 38. As a simplest example, let us consider a case where the turn-OFF period PC includes only the discharge period PC1 and the timer period PT is equal to the control period PX. Also, the switch section 60C has a first switch 51C connected between the second node N2 and the output node NZ. An overlapping description with the foregoing FIG. 35 will be omitted as appropriate.

(Turn-ON Period PA: from Time t1 to t2)

At a time t1, the power-ON signal PWR is activated and changed from the Low-level to the High-level. In response to that, the control signal PWR' is deactivated (PWR'=Low-level) and the second short transistor 42C is turned OFF.

(ON Period PB: from Time t2 to t3)

The control signal PWR' is maintained at the Low-level, and the second short transistor 42C is maintained in the OFF-state.

(Turn-OFF Period PC: from Time t3 to t4)

At a time t3, the power-ON signal PWR is deactivated and changed from the High-level to the Low-level. In response to that, the control signal PWR' is activated (PWR'=High-level) and the second short transistor 42C is turned ON. Meanwhile, in response to the deactivation of the power-ON signal PWR, the timer circuit 100 activates the first control signal CON1 (CON1=Low-level). When the first control signal CON1 is being activated, the switch section 60C turns ON the first switch 51C to electrically connect the second node N2 and the output node NZ. As a result, the gate and the source of the first short transistor 41C are short-circuited and thus the first short transistor 41C is turned OFF.

(OFF Period PD: from Time t4)

The control signal PWR' is maintained at the High-level and the second short transistor 42C is maintained in the ON-state. At a time tt during the OFF period PD, the predetermined timer period PT is ended and the timer circuit 100 deactivates the first control signal CON1 (CON1=High-level). In the OFF period PD after the first control signal CON1 is deactivated, the switch section 60C cuts off the electrical connection between the second node N2 and the output node NZ by turning OFF the first switch 51C and electrically connects the second node N2 and the power-supply terminal TV. As a result, the first short transistor 41C is turned ON. That is, both the first short transistor 41C and the second short transistor 42C are turned ON.

In this manner, the ON/OFF control of the first short transistor 41C and the second short transistor 42C can be achieved by using the control signal PWR' and the first control signal CON1.

Hereinafter, various examples of the configuration of the short control circuit 50C according to the third embodiment will be described. It should be noted that an overlapping description with the above will be omitted as appropriate.

3-1. First Example

Figure 39:
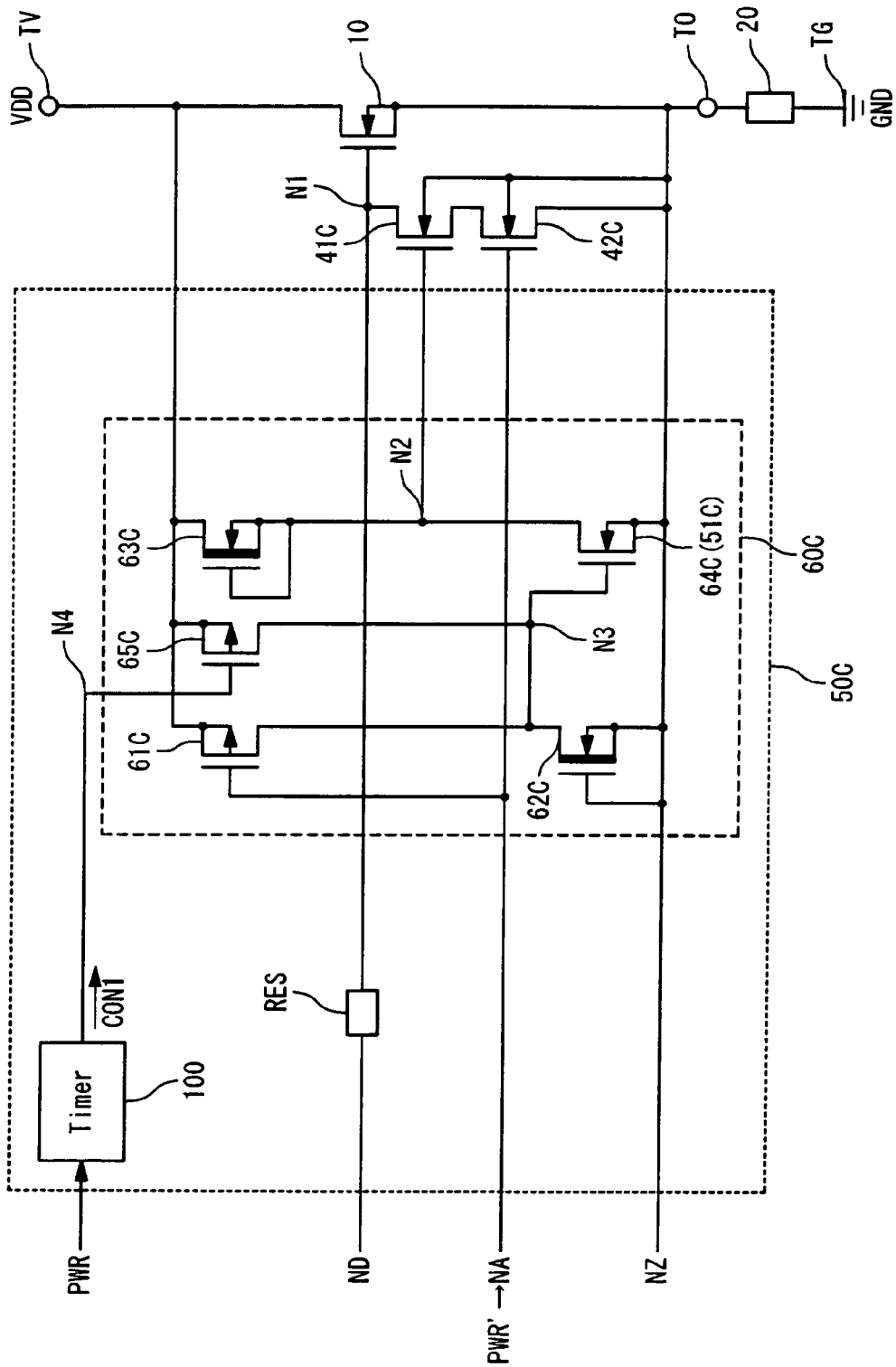
FIG. 39 is a circuit diagram showing a first example of a configuration of the short control circuit according to the third embodiment of the present invention.

FIG. 39 is a circuit diagram showing a first example. The switch section 60C has P-channel MOSFETs 61C and 65C and N-channel MOSFETs 62C, 63C and 64C.

The P-channel MOSFET 61C and the N-channel MOSFET 62C form a first inverter circuit. Specifically, a gate, a source and a drain of the P-channel MOSFET 61C are respectively connected to the node NA, the power-supply terminal TV and a third node N3. A gate, a source and a drain of the N-channel MOSFET 62C are respectively connected to the output node NZ, the output node NZ and the third node N3. The N-channel MOSFET 62C is of a depletion-type.

The N-channel MOSFET 63C is of a depletion-type. The N-channel MOSFETs 63C and 64C form a second inverter circuit. Specifically, a gate, a source and a drain of the N-channel MOSFET 63C are respectively connected to the second node N2, the second node N2 and the power-supply terminal TV. A gate, a source and a drain of the N-channel MOSFET 64C are respectively connected to the third node N3, the output node NZ and the second node N2.

A gate, a source and a drain of the P-channel MOSFET 65C are respectively connected to a fourth node N4, the power-supply terminal TV and the third node N3. The first control signal CON1 is supplied to the fourth node N4 from the timer circuit 100.

Figure 38:
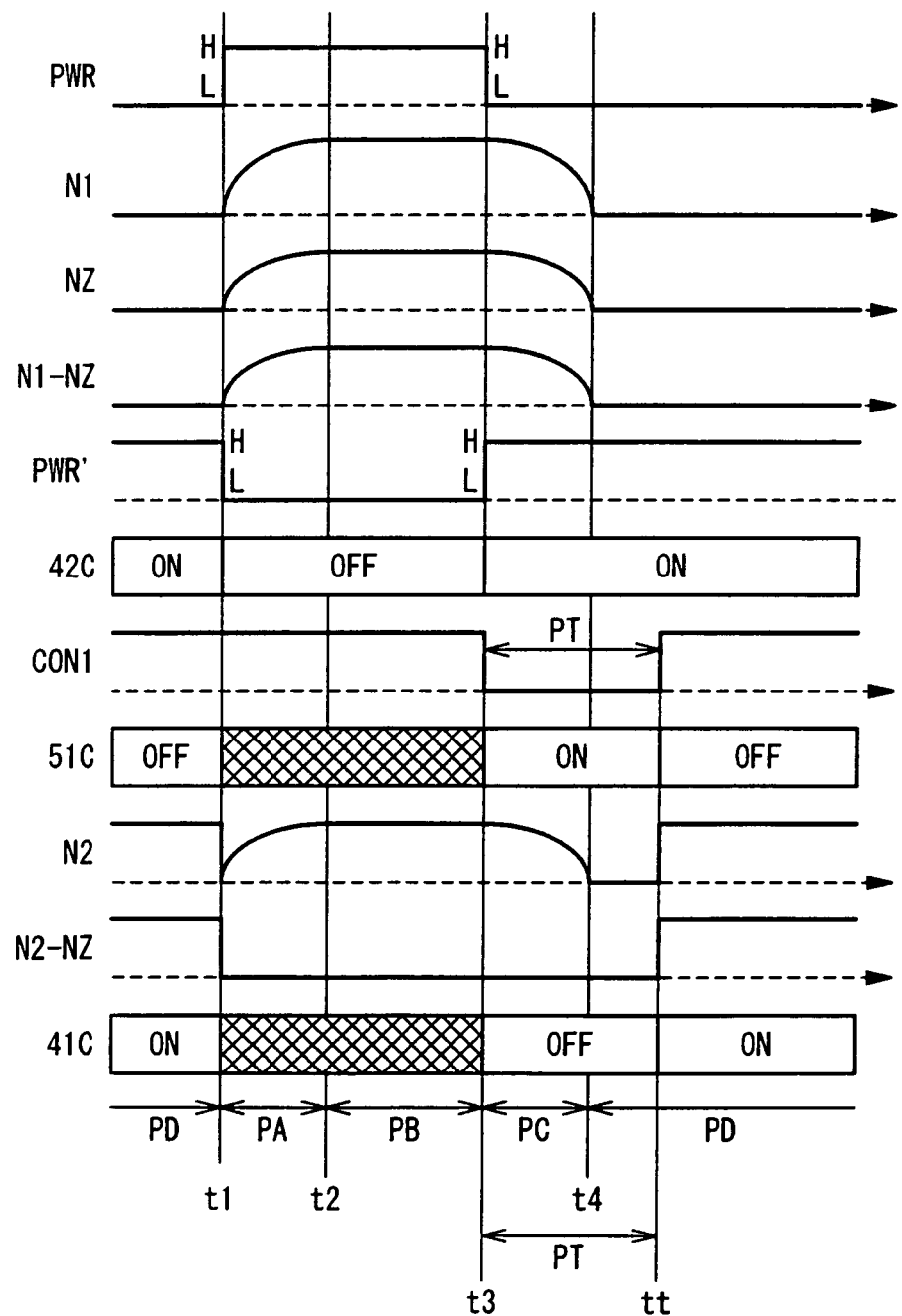
FIG. 38 is a timing chart showing an operation of the short control circuit according to the third embodiment of the present invention.

Moreover, a signal at the node NA (a gate control signal for the discharge transistor 33 of the gate charge-discharge circuit) is used as the control signal PWR' shown in FIGS. 37 and 38. Hereinafter, an operation of the short control circuit 50C according to the present example will be described with reference to FIGS. 38 and 39.

In the turn-ON period PA and the ON period PB, the signal of the node NA (control signal PWR') is at the Low-level. Therefore, the second short transistor 42C is turned OFF. Also, the P-channel MOSFET 61C whose gate is connected to the node NA is turned ON and thus the third node N3 is pulled up. During a period when the voltage of the output node NZ is relatively low, the N-channel MOSFET 64C is turned ON and thus the second node N2 and the output node NZ are electrically connected with each other. Therefore, the first short transistor 41C also is turned OFF. The voltage of the output node NZ increases and, if a voltage difference between the third node N3 and the output node NZ becomes lower than a threshold voltage of the N-channel MOSFET 64C, the N-channel MOSFET 64C is turned OFF. In this case, the second node N2 is pulled up by the N-channel MOSFET 63C. At this time, the first short transistor 41C may be turned ON. However, since the second short transistor 42C is turned OFF, the first node N1 and the output node NZ are not short-circuited.

It should be noted that the depletion-type N-channel MOSFET 63C also plays a role of preventing the second node N2 from becoming a floating state after the N-channel MOSFET 64C is turned OFF. As a result, noise tolerance with respect to the second node N2 is enhanced.

In the turn-OFF period PC and the OFF period PD, the signal of the node NA (control signal PWR') is at the High-level. Therefore, the second short transistor 42C is turned ON and the P-channel MOSFET 61C is turned OFF. Meanwhile, the timer circuit 100 sets the first control signal CON1 to the Low-level for the predetermined timer period PT from the start of the turn-OFF period PC. Accordingly, the P-channel MOSFET 65C is turned ON and the third node N3 is pulled up. As a result, the N-channel MOSFET 64C is turned ON and thus the second node N2 and the output node NZ are electrically connected with each other. This N-channel transistor 64C is equivalent to the "first switch 51C" shown in FIGS. 37 and 38. The gate and the source of the first short transistor 41C are short-circuited and thus the first short transistor 41C is turned OFF. That is, short-circuit between the first node N1 and the output node NZ is prevented during the timer period PT.

At the time tt in the OFF period PD, the predetermined timer period PT is ended and the timer circuit 100 sets the first control signal CON1 to the High-level. Accordingly, the P-channel MOSFET 65C is turned OFF and the third node N3 is pulled down. As a result, the N-channel MOSFET 64C (first switch 51C) is turned OFF and the electrical connection between the second node N2 and the output node NZ is cut off. Since the second node N2 is pulled up by the N-channel MOSFET 63C, the first short transistor 41C is turned ON. That is, both the first short transistor 41C and the second short transistor 42C are turned ON.

It should be noted that in the OFF period PD after the timer period PT, the P-channel MOSFETs 61C and 65C and the N-channel MOSFET 64C are turned OFF. Therefore, no current flows from the power-supply terminal TV to the output terminal TO through the short control circuit 50C. That is, consumption current during the OFF period is not caused.

Also, back gates of the respective N-channel MOSFETs included in the short control circuit 50C are directly connected to the output node NZ. Therefore, the back gates are prevented from becoming high-impedance in the OFF period PD. Accordingly, in the OFF period PD, parasitic bipolar transistors of the N-channel MOSFETs are prevented from operating due to application of dump surge.

3-2. Second Example

Figure 40:
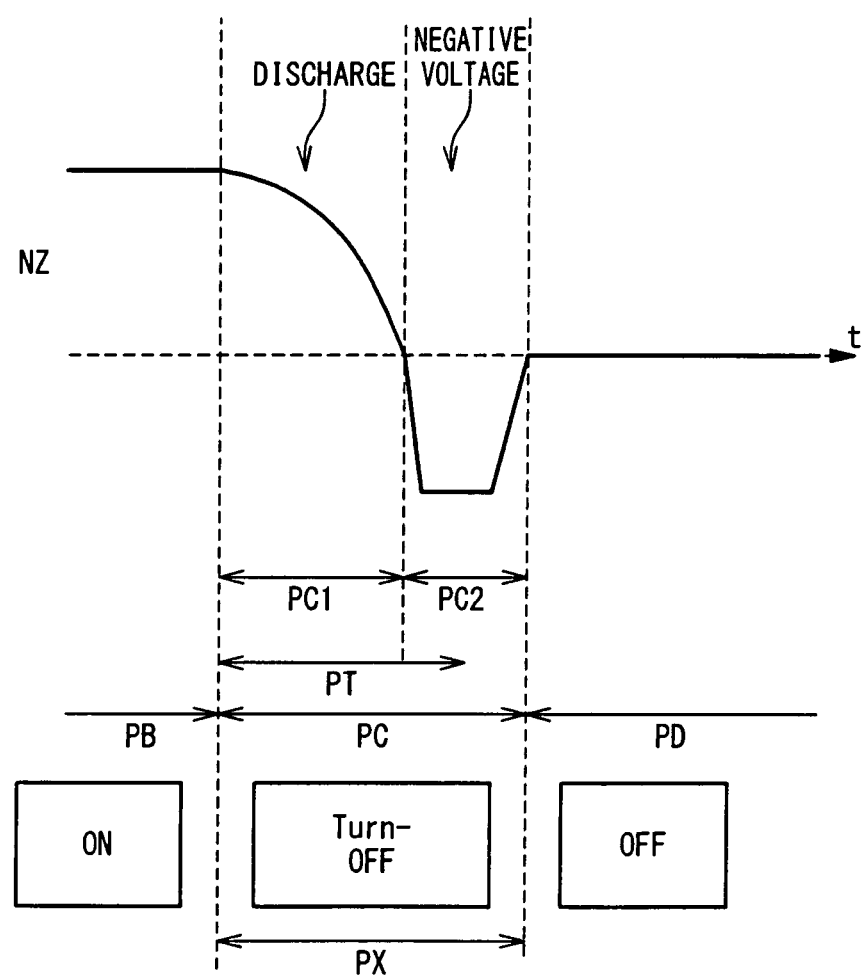
FIG. 40 is a conceptual diagram for explaining a case where a turn-OFF period includes a discharge period and a negative voltage period.

In a case where the load 20 connected to the output terminal TO is an inductive load, counter electromotive force (negative voltage) may be applied to the output terminal TO at the time of turning OFF. The similar phenomenon can be caused by an inductance component of an interconnection used for connecting the load 20. In this case, as shown in FIG. 40, the turn-OFF period PC includes not only a "discharge period PC1" when the first node N1 and the output node NZ are discharged but also a subsequent "negative voltage period PC2" when a negative voltage is applied to the output terminal TO (output node NZ).

In the foregoing example, the turn-OFF period PC includes only the discharge period PC1. In the predetermined timer period PT longer than the discharge period PC1, the first switch 51C (N-channel MOSFET 64C) is turned ON and thereby the second node N2 and the output node NZ are electrically connected with each other. As a result, the first short transistor 41C is maintained in the OFF-state in the discharge period PC1. However, the first switch 51C (N-channel MOSFET 64C) is not necessarily turned ON also in the negative voltage period PC2. Therefore, according to the second example, a second switch 52C that is connected between the second node N2 and the output node NZ and is turned ON in the negative voltage period PC2 is added.

Figure 41:
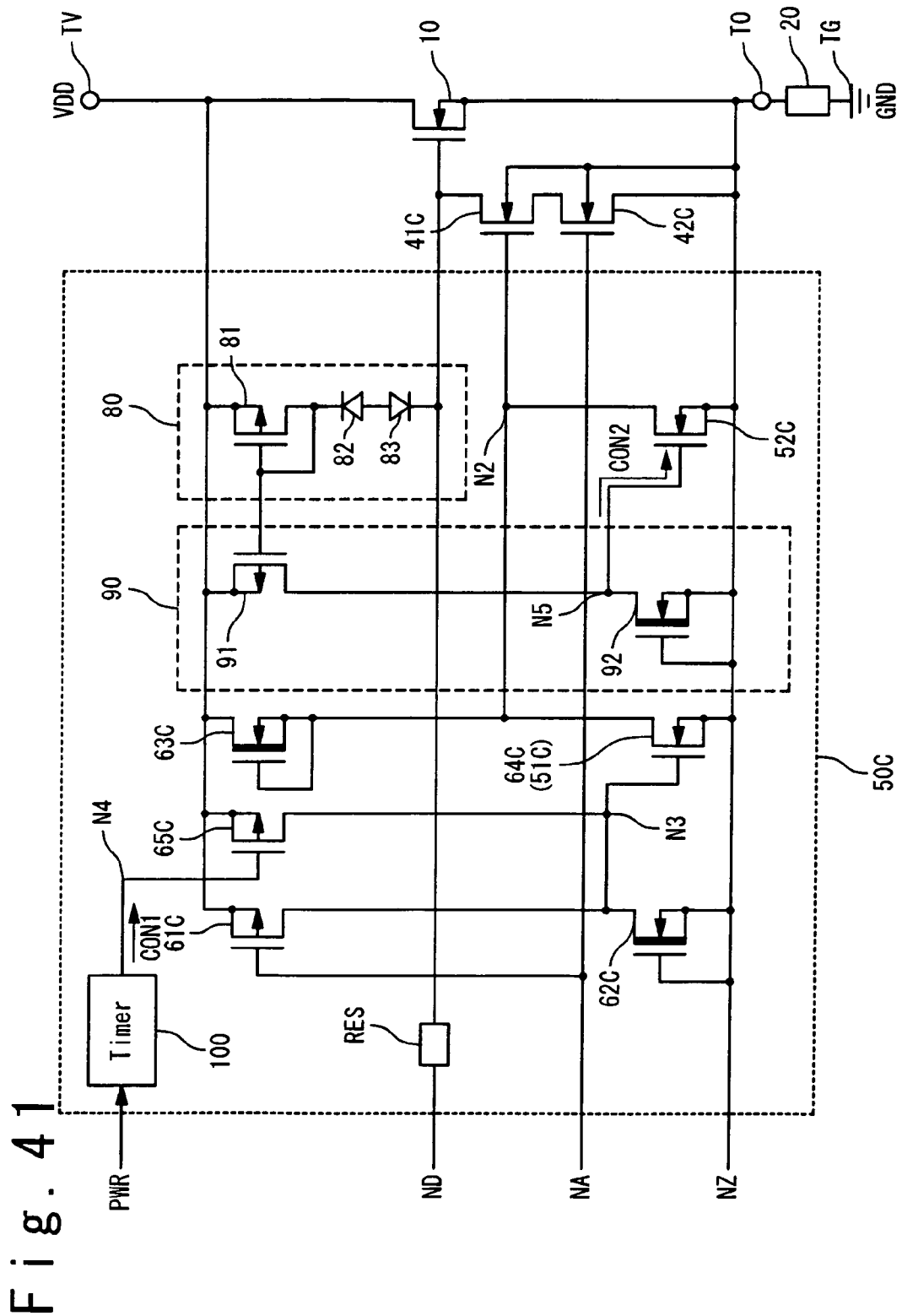
FIG. 41 is a circuit diagram showing a second example of a configuration of the short control circuit according to the third embodiment of the present invention.

FIG. 41 is a circuit diagram showing the second example. In the second example, an overvoltage protection circuit 80, a control circuit 90 and the second switch 52C are further added to the circuit configuration shown in FIG. 39.

The overvoltage protection circuit 80 (dynamic clamp circuit) is connected between the power-supply terminal TV and the first node N1. More specifically, the overvoltage protection circuit 80 has a P-channel MOSFET 81 and diodes 82 and 83. A source of the P-channel MOSFET 81 is connected to the power-supply terminal TV. A gate and a drain of the P-channel MOSFET 81 are connected to a cathode of the diode 82. An anode of the diode 82 is connected to an anode of the diode 83. A cathode of the diode 83 is connected to the first node N1. The overvoltage protection circuit 80 operates in the negative voltage period PC2.

The control circuit 90 has a P-channel MOSFET 91 and a depletion-type N-channel MOSFET 92. A gate, a source and a drain of the P-channel MOSFET 91 are respectively connected to the gate of the P-channel MOSFET 81, the power-supply terminal TV and a fifth node N5. A drain of the N-channel MOSFET 92 is connected to the fifth node N5 and a source and a gate thereof are connected to the output node NZ.

The P-channel MOSFETs 81 and 91 form a current mirror circuit. When the overvoltage protection circuit 80 operates, the fifth node N5 is charged and its voltage becomes the High-level. When the overvoltage protection circuit 80 is not operating, the voltage of the fifth node N5 is equivalent to the voltage of the output node NZ. The voltage of the fifth node N5 is used as a second control signal CON2 for ON/OFF controlling the second switch 52C. That is, the control circuit 90 activates the second control signal CON2 (CON2=High-level) only when the overvoltage protection circuit 80 is in operation.

The second switch 52C is connected between the second node N2 and the output node NZ. The second switch 52C is turned ON when the second control signal CON2 is activated (CON2=High-level) and is turned OFF when it is deactivated. For example, the second switch 52C is an N-channel MOSFET and its gate, source and drain are respectively connected to the fifth node N5, the output node NZ and the second node N2. When the second control signal CON2 is activated to be High-level, the N-channel MOSFET 52C is turned ON. As a result, the second node N2 and the output node NZ are electrically connected with each other.

Figure 42:
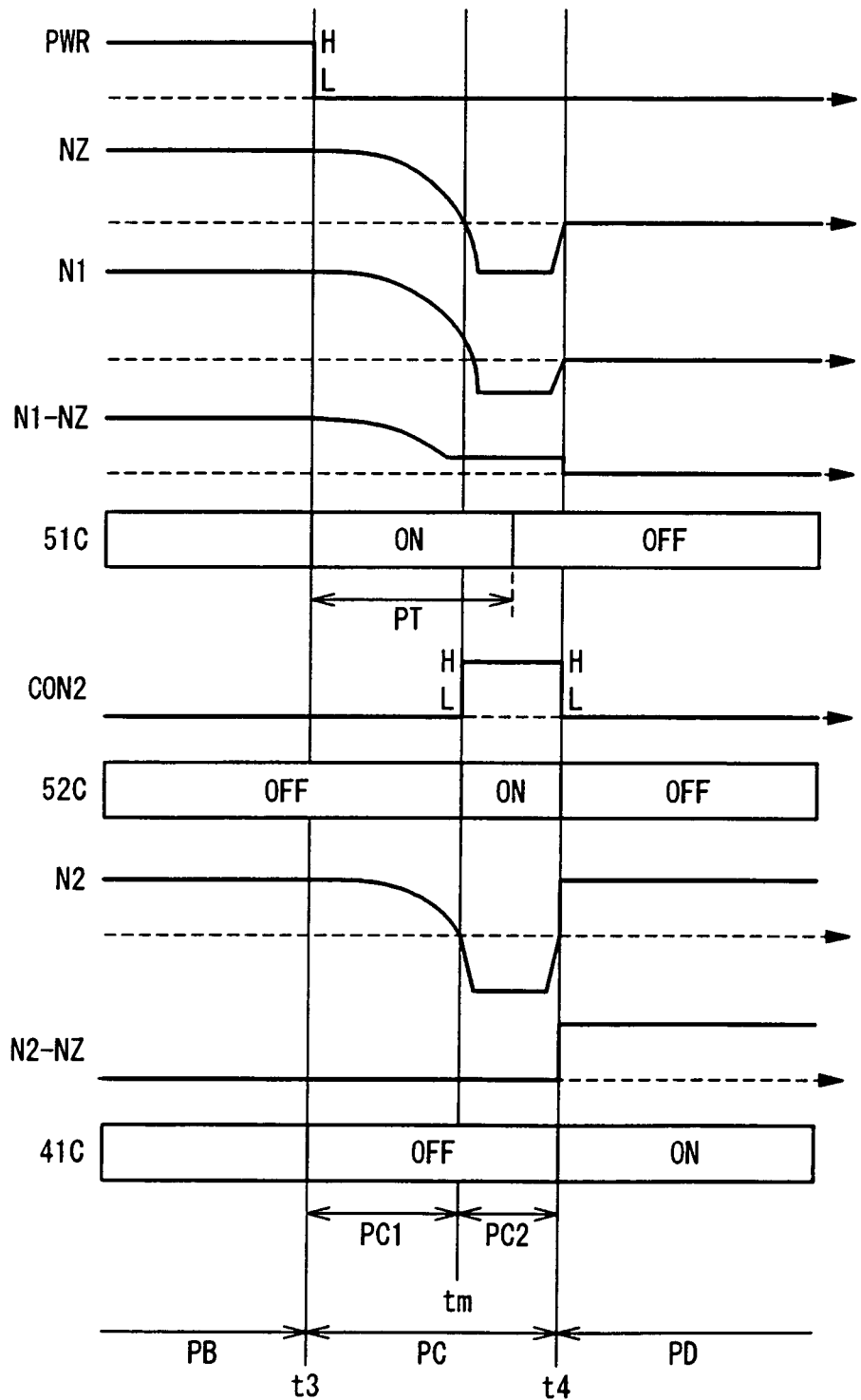
FIG. 42 is a timing chart showing an operation of the short control circuit shown in FIG. 41.

The turn-OFF period PC in the present example will be described with reference to FIGS. 41 and 42. The turn-OFF period PC includes the discharge period PC1 and the negative voltage period PC2.

(Discharge Period PC1: from Time t3 to tm)

As in the case of the foregoing example, the first switch 51C is turned ON. Therefore, the second node N2 and the output node NZ are electrically connected with each other and thus the first short transistor 41C is maintained in the OFF-state.

(Negative Voltage Period PC2: from Time tm to t4)

In order to normally operate the overvoltage protection circuit 80 in the negative voltage period PC2, it is necessary to turn ON the output transistor 10 with a low gate-source voltage. Therefore, it is not desirable that the first short transistor 41C and the second short transistor 42C both are turned ON and the first node N1 and the output node NZ are short-circuited. That is, it is necessary to maintain the first short transistor 41C in the OFF-state also in the negative voltage period PC2. However, if the timer period PT is ended during the negative voltage period PC2, the first switch 51C may be turned OFF. Therefore, the second switch 52C is provided for use in the negative voltage period PC2.

More specifically, when the negative voltage is applied to the output terminal TO, a current path is formed from the P-channel MOSFET 81 of the overvoltage protection circuit 80 to the output terminal TO through the diodes 82 and 83, the resistance element RES and the discharge transistor 33 of the gate charge-discharge circuit 30. Accordingly, a drain-source voltage of the output transistor 10 is clamped to a clamp voltage of the overvoltage protection circuit 80. When the overvoltage protection circuit 80 operates in this manner, the control circuit 90 activates the second control signal CON2 (CON2=High-level) as described above. In response to that, the second switch 52C is turned ON and thus the second node N2 and the output node NZ are electrically connected with each other. As a result, the first short transistor 41C is maintained in the OFF-state.

When the negative voltage period PC2 is ended, the second switch 52C is turned OFF.

As described above, the short transistors 41C and 42C and the short control circuit 50C according to the third embodiment have no impact also on characteristics (e.g. overvoltage protection) relating to the negative voltage period PC2.

3-3. Third Example

Figure 43:
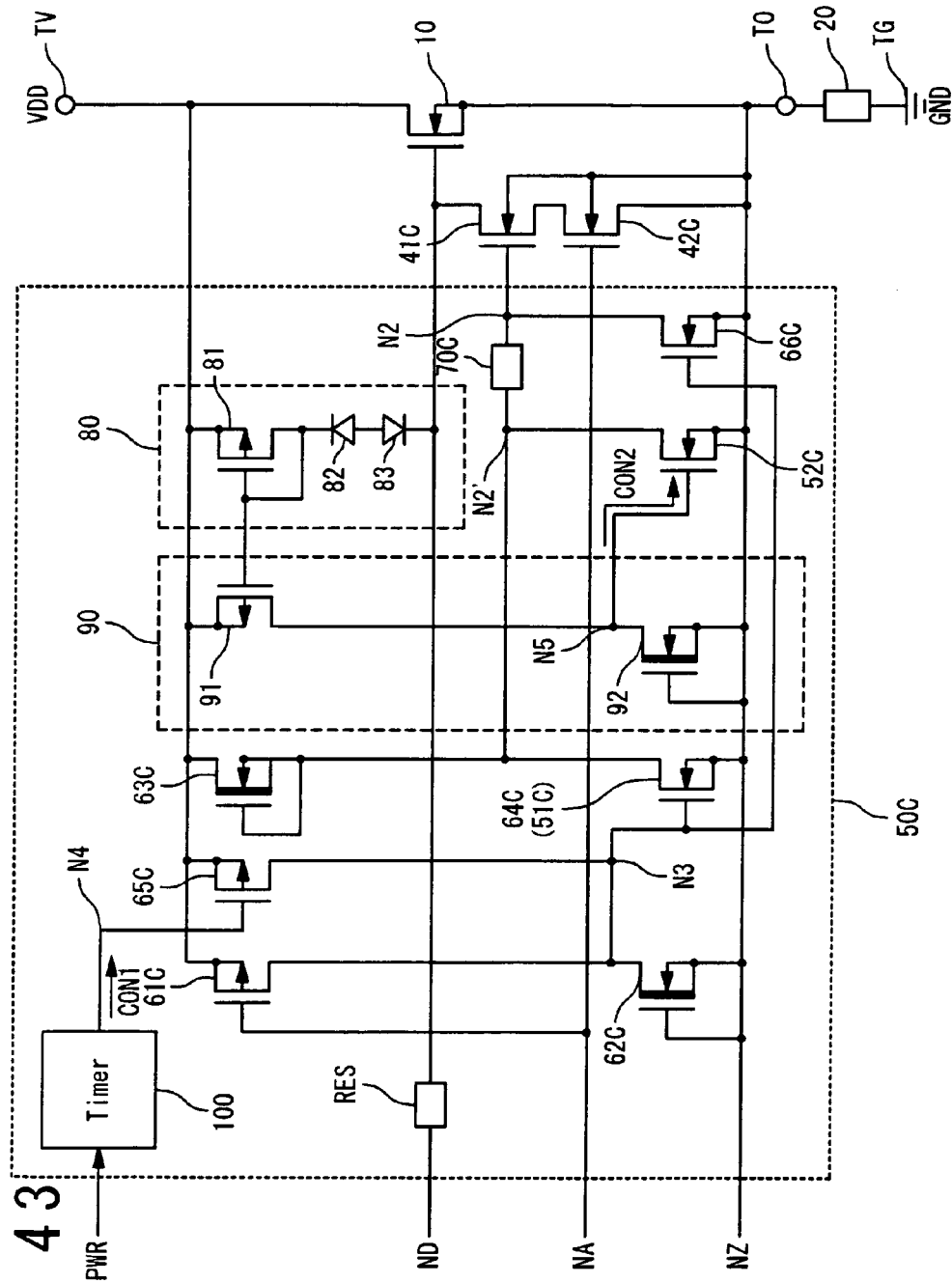
FIG. 43 is a circuit diagram showing a third example of a configuration of the short control circuit according to the third embodiment of the present invention.

FIG. 43 is a circuit diagram showing a third example. In the third example, a delay circuit 70C and a supplementary switch 66C are further added to the circuit configuration shown in FIG. 41. The drain of the N-channel MOSFET as the second switch 52C is connected to a node N2' instead of the second node N2. The node N2' is connected to the second node N2 through the delay circuit 70C.

Figure 44:
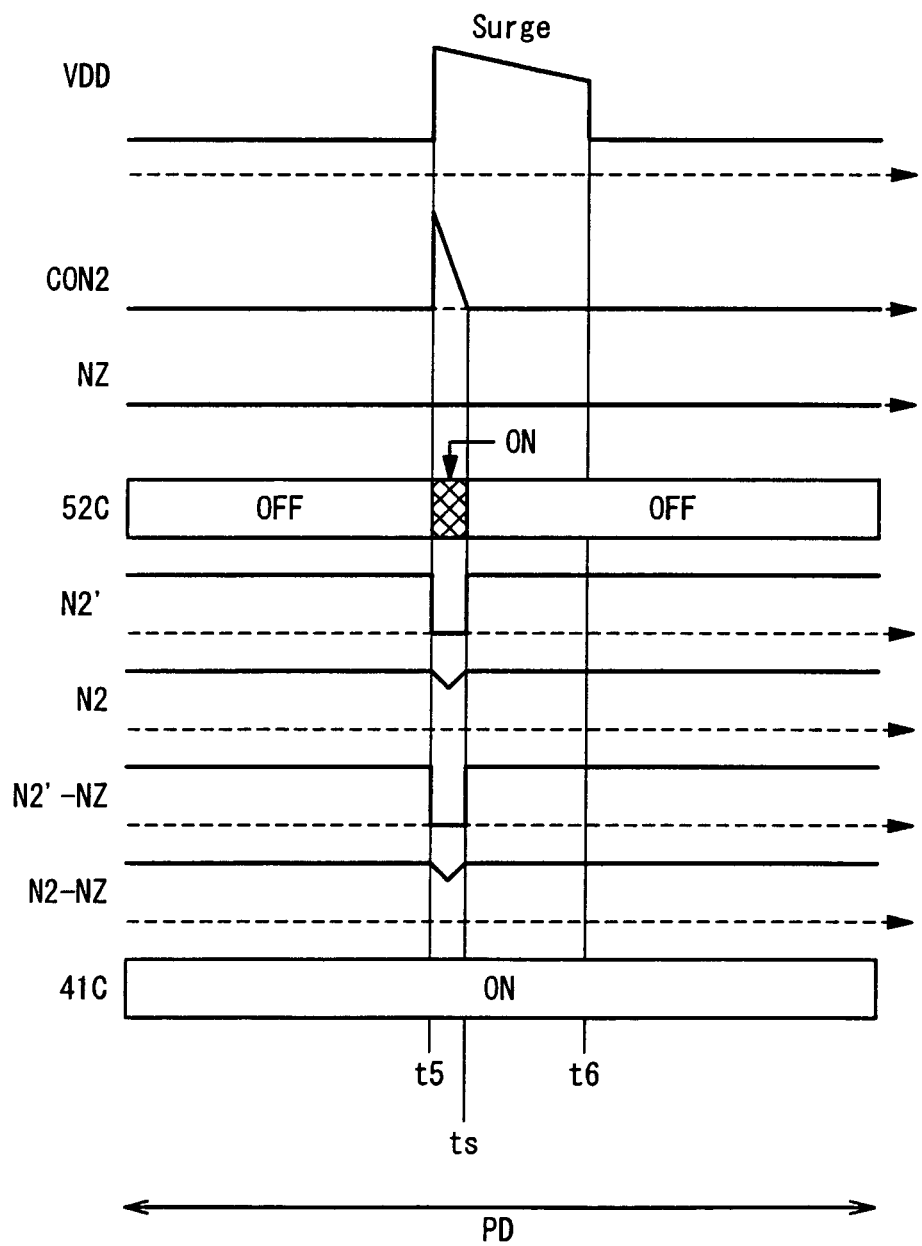
FIG. 44 is a timing chart showing an operation of the short control circuit shown in FIG. 43.

With reference to FIGS. 43 and 44, let us consider a case where dump surge is applied to the power-supply terminal TV during the OFF period PD. When the dump surge is applied to the power-supply terminal TV, a gate voltage of the P-channel MOSFET 81 of the overvoltage protection circuit 80 may be momentarily decreased to the Low-level. In this case, the second control signal CON2 is activated and the OFF state of the second switch 52C is cancelled. In the example shown in FIG. 44, the second switch 52C is turned ON and the node N2' is discharged for a short period from time t5 to ts. If the delay circuit 70C does not exist, the second node N2 connected to the gate of the first short transistor 41C also is discharged and the first short transistor 41C is turned OFF. This means cancellation of the short between the gate and the source of the output transistor 10, which is not preferable.

Whereas, according to the present example, the delay circuit 70C is provided between the node N2' and the second node N2. Therefore, even if the node N2' is discharged, the voltage level of the second node N2 is maintained at the High-level for a certain period of time. In other words, the first short transistor 41C is maintained in the ON-state in the period from time t5 to ts. In this manner, the short between the gate and the source of the output transistor 10 is prevented from being cancelled during the OFF period PD.

Figure 45A:
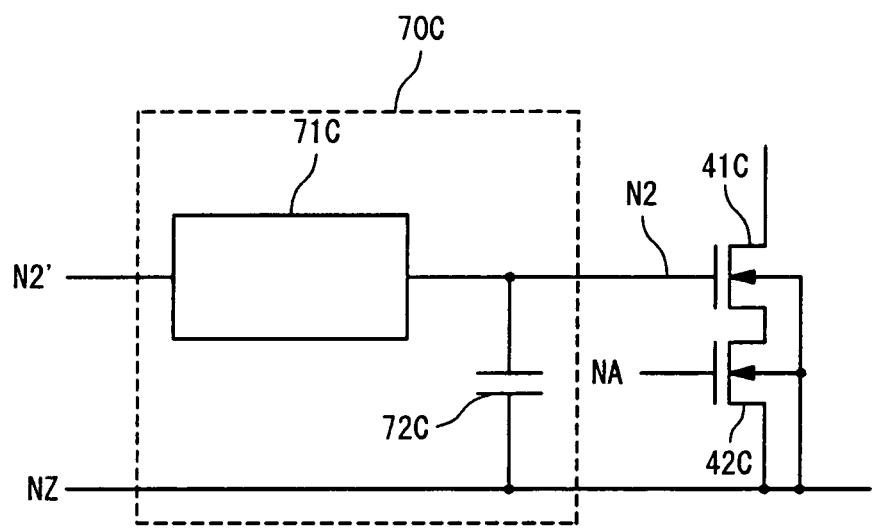
FIG. 45A is a circuit diagram showing a configuration example of a delay circuit in the short control circuit shown in FIG. 43.
Figure 45B:
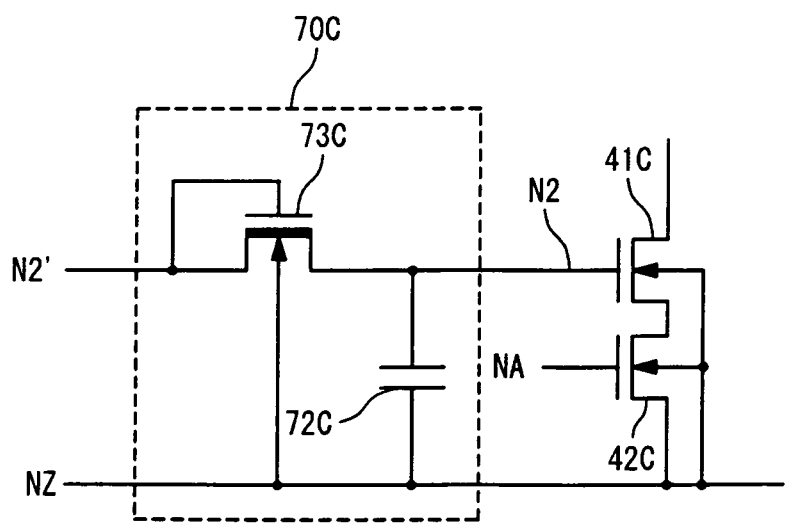
FIG. 45B is a circuit diagram showing another configuration example of a delay circuit in the short control circuit shown in FIG. 43.

FIGS. 45A and 45B show configuration examples of the delay circuit 70C. In the example shown in FIG. 45A, a resistance element 71C and a capacitance element 72C form the delay circuit 70C. In the example shown in FIG. 45B, a depletion-type N-channel MOSFET 73C serving as a constant current source and a capacitance element 72C form the delay circuit 70C. In the OFF period PD, the capacitance element 72C of the delay circuit 70C is charged to the power-supply voltage VDD. Even in the case where the node N2' is discharged due to the above-mentioned reason, the voltage level of the second node N2 can be maintained at the High-level until the capacitance element 72C of the delay circuit 70C is discharged. Note that an electric discharge time constant of the delay circuit 70C is designed to be larger than an electric discharge time constant of the node N2'.

Meanwhile, it is required to rapidly discharge the second node N2 to turn OFF the first short transistor 41C at the start (time t1: refer to FIG. 38) of the turn-ON period PA. In the present example, however, the delay circuit 70C is provided between the node N2' and the second node N2 and hence discharging through the N-channel MOSFET 64C (first switch 51C) is delayed. The supplementary switch 66C is added in order to remove such the influence of the delay circuit 70C. The supplementary switch 66C is connected between the second node N2 and the output node NZ and is turned ON in the turn-ON period PA. As a result, at the start of the turn-ON period PA, the second node N2 is rapidly discharged through the supplementary switch 66C. That is, the influence of the delay circuit 70C on the turn-ON period PA is removed.

For example, the supplementary switch 66C is an N-channel MOSFET and its gate, source and drain are respectively connected to the third node N3, the output node NZ and the second node N2. In the turn-ON period PA, the power-supply voltage VDD is applied to the third node N3. The N-channel MOSFET 66C is turned ON until a voltage difference (N3–NZ) between the third node N3 and the output node NZ becomes lower than its threshold voltage. The N-channel MOSFET 66C is turned OFF in the period other than the turn-ON period PA. Accordingly, the above-mentioned purpose is achieved.

3-4. Fourth Example

In the foregoing examples, care should be taken for an initial operation in the turn-OFF period PC. At the start of the turn-OFF period, as described above, the signal of the node NA (control signal PWR') is changed to the High-level and the second short transistor 42C is turned ON. Also, the first control signal CON1 is changed to the Low-level and the third node N3 is pulled up to the power-supply voltage VDD. However, at an early stage when the voltage of the output node NZ is close to the power-supply voltage VDD, a gate-source voltage of the N-channel MOSFET 64C is likely to be lower than its threshold voltage and the N-channel MOSFET 64C may be maintained in the OFF-state. In this case, the second node N2 is pulled up by the N-channel MOSFET 63C and thereby the first short transistor 41C may be turned ON. That is, at the early stage of the turn-OFF period PC, both the short transistors 41C and 42C may be momentarily turned ON and hence a discharge path may be formed from the first node N1 to the output node NZ through the short transistors 41C and 42C.

In order to prevent such the phenomenon, the N-channel MOSFET 64C just needs to be turned ON earlier than the first short transistor 41C. That is to say, the threshold voltage of the N-channel MOSFET 64C just needs to be designed to be lower than the threshold voltage of the first short transistor 41C.

Figure 46:
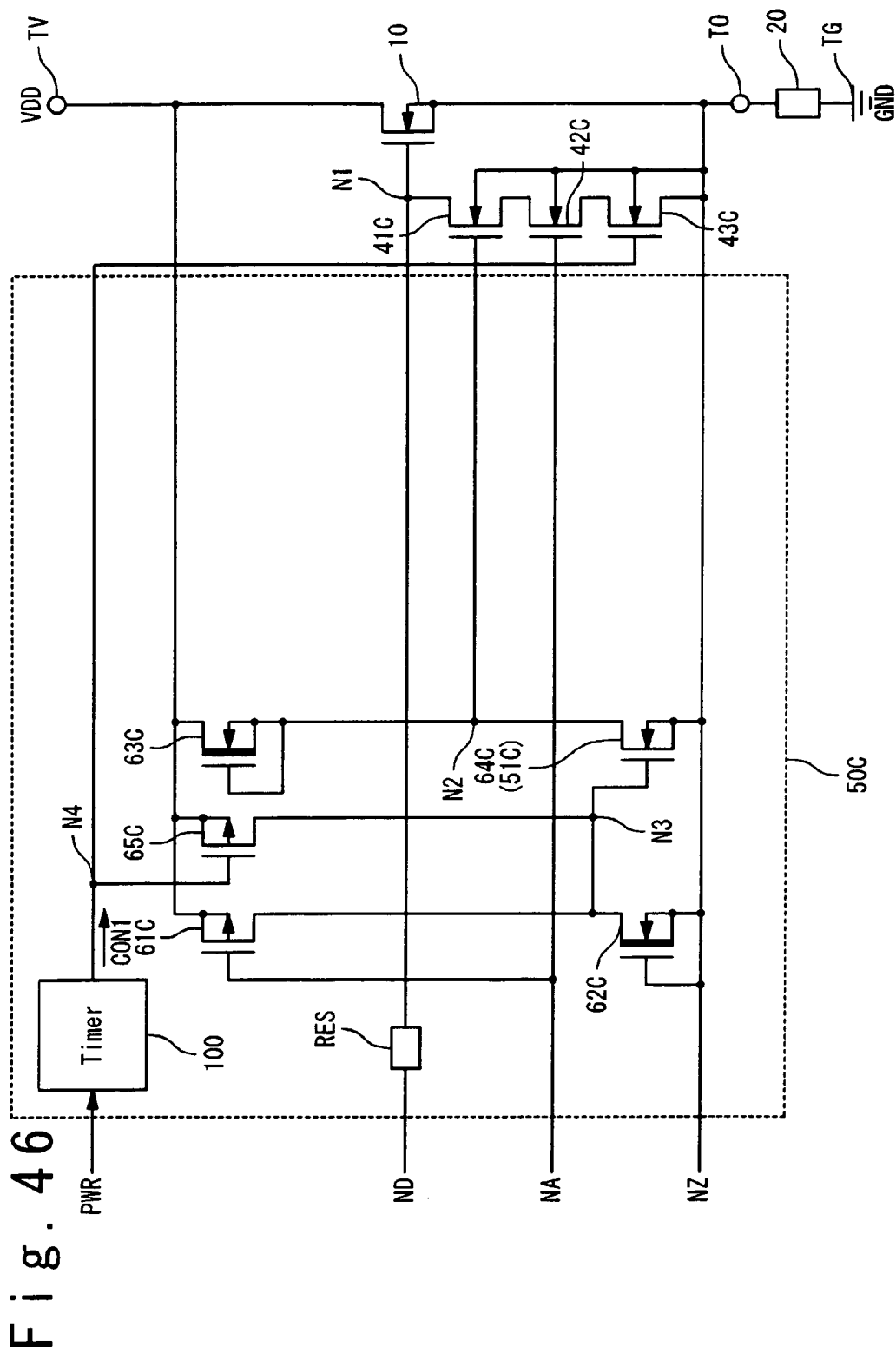
FIG. 46 is a circuit diagram showing a fourth example of a configuration of the short control circuit according to the third embodiment of the present invention.

Alternatively, a configuration shown in FIG. 46 also is effective. In the example shown in FIG. 46, a third short switch 43C as a component of the short switch circuit 4 is further added to the circuit configuration shown in FIG. 39. The first to third short switches 41C to 43C are connected in series between the first node N1 and the output node NZ. The third short switch 43C is ON/OFF controlled by the first control signal CON1. More specifically, the third short switch 43C is turned OFF in the timer period PT when the first control signal CON1 is activated. In the other periods when the first control signal CON1 is deactivated, the third short switch 43C is turned ON.

For example, an N-channel MOSFET (hereinafter referred to as a "third short transistor 43C") is used as the third short switch 43C. A gate, a source and a drain of the third short transistor 43C are respectively connected to the fourth node N4, the output node NZ and the first node N1 side. In the timer period PT, the first control signal CON1 is at the Low-level and the third short transistor 43C is turned OFF. In the other periods, the first control signal CON1 is at the High-level and the third short transistor 43C is turned ON.

At the early stage of the turn-OFF period PC, the voltage of the output node NZ is close to the power-supply voltage VDD. Meanwhile, the first control signal CON1 of the Low-level is applied to the fourth node N4. Therefore, the third short transistor 43C is completely turned OFF. Even if the first short transistor 41C is momentarily turned ON at the early stage of the turn-OFF period PC, no discharge path is formed from the first node N1 to the output node NZ through the short transistors 41C to 43C. In the periods other than the timer period PT, the third short transistor 43C is turned ON and the same operation as in the cases of the foregoing examples can be achieved.

3-5. Fifth Example

Figure 47:
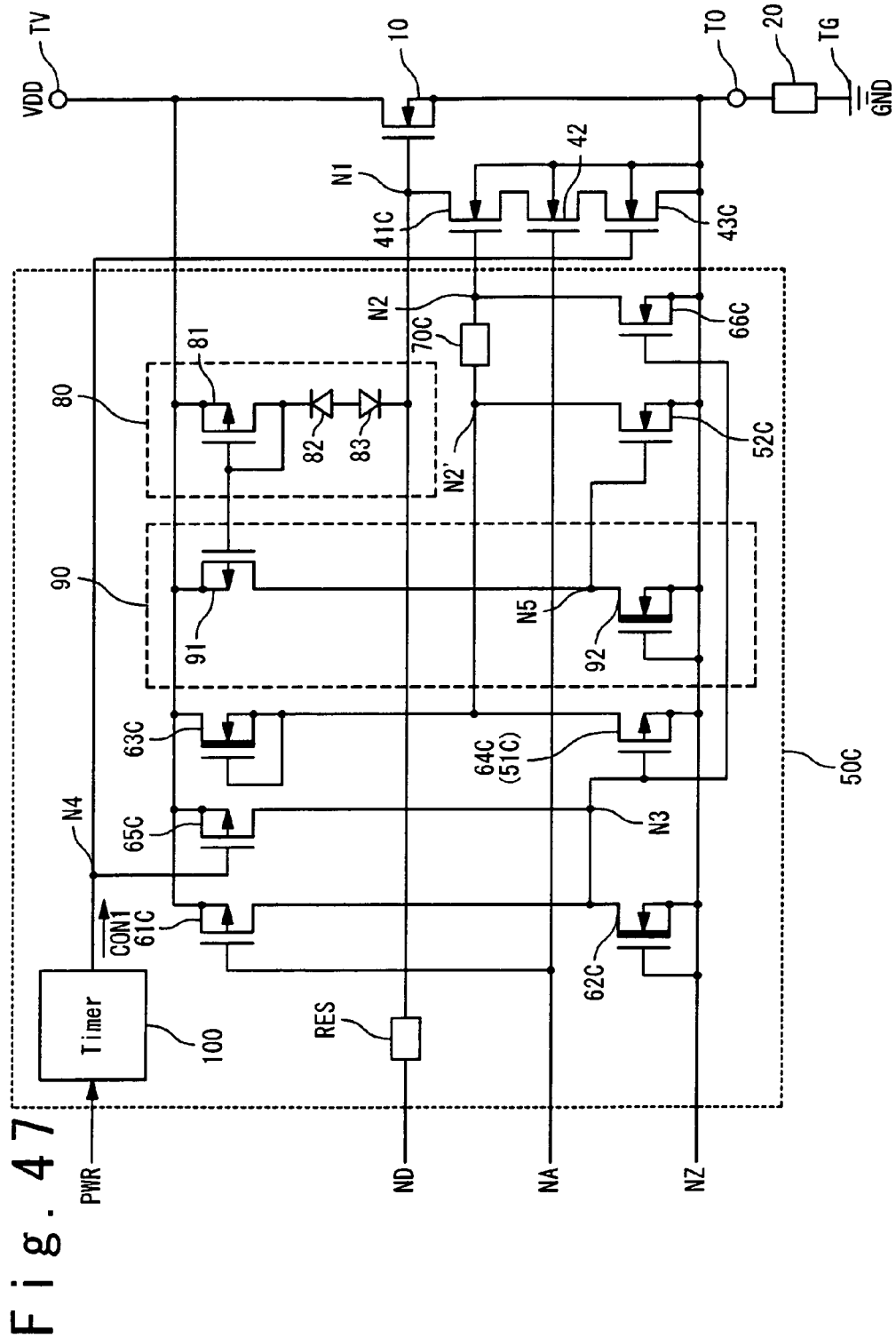
FIG. 47 is a circuit diagram showing a fifth example of a configuration of the short control circuit according to the third embodiment of the present invention.

Some of the above-described examples can be combined together. FIG. 47 shows a circuit configuration in a case where all of the first to fourth examples are combined together.

While a part of or whole of the third embodiments may be described as the following Supplementary notes, it is not limited to that.

(Supplemental Note 1)

A power semiconductor device comprising:

an output transistor connected between a power-supply terminal and an output terminal;

a gate charge-discharge circuit configured to charge and discharge a first node connected to a gate of said output transistor to ON/OFF control said output transistor;

a first short switch and a second short switch that are connected in series between said first node and said output terminal; and a short control circuit configured to ON/OFF control said first short switch and said second short switch, wherein a period when said output transistor is stably in an ON-state after said first node is charged is an ON period, a period when said output transistor is stably in an OFF-state after said first node is discharged is an OFF period, a transition period from said OFF period to said ON period is a turn-ON period, and a transition period from said ON period to said OFF period is a turn-OFF period, wherein a control period starts concurrently with said turn-OFF period and is equal to or longer than said turn-OFF period, wherein in said turn-ON period, said ON period and said control period, said short control circuit turns OFF at least one of said first short switch and said second short switch, and wherein in said OFF period after said control period is ended, said short control circuit turns ON both of said first short switch and said second short switch.

(Supplemental Note 2)

The power semiconductor device according to Supplemental note 1, wherein said short control circuit turns OFF said second short switch in said turn-ON period and said ON period and turns ON said second short switch in said turn-OFF period and said OFF period, and wherein said short control circuit turns OFF said first short switch at least in said control period and turns ON said first short switch in said OFF period after said control period is ended.

(Supplemental Note 3)

The power semiconductor device according to Supplemental note 2, wherein said first short switch is a first short transistor whose gate is connected to a second node, wherein said short control circuit comprises at least one switch connected between said second node and said output terminal, wherein at least in said control period, said short control circuit turns ON said at least one switch to electrically connect said second node and said output terminal, and wherein in said OFF period after said control period is ended, said short control circuit turns OFF said at least one switch to electrically connect said second node and said power-supply terminal.

(Supplemental Note 4)

The power semiconductor device according to Supplemental note 3, wherein said turn-OFF period includes a discharge period when said first node and said output terminal are discharged, wherein said control period includes a predetermined timer period, wherein said predetermined timer period starts concurrently with said discharge period and is equal to or longer than said discharge period, wherein said short control circuit further comprises a timer circuit configured to activate a first control signal only in said predetermined timer period, wherein said at least one switch comprises a first switch connected between said second node and said output terminal, and wherein said first switch is turned ON at least when said first control signal is activated and is turned OFF in said OFF period after said first control signal is deactivated.

(Supplemental Note 5)

The power semiconductor device according to Supplemental note 4, wherein said turn-OFF period further includes, following said discharge period, a negative voltage period when a negative voltage is applied to said output terminal, wherein said short control circuit further comprises:

an overvoltage protection circuit connected between said power-supply terminal and said first node and configured to operate in said negative voltage period; and a control circuit configured to activate a second control signal only when said overvoltage protection circuit is in operation, wherein said at least one switch further comprises a second switch connected between said second node and said output terminal, and wherein said second switch is turned ON when said second control signal is activated and is turned OFF when said second control signal is deactivated.

(Supplemental Note 6)

The power semiconductor device according to Supplemental note 5, wherein said second switch is connected to said second node through a delay circuit, wherein said short control circuit further comprises a supplementary switch connected between said second node and said output terminal, and wherein said supplementary switch is turned ON at least in said turn-ON period.

(Supplemental Note 7)

The power semiconductor device according to any one of Supplemental notes 4 to 6, further comprising a third short switch, wherein said first short switch, said second short switch and said third short switch are connected in series between said first node and said output terminal, and wherein said third short switch is turned OFF when said first control signal is activated.

(Supplemental Note 8)

The power semiconductor device according to any one of Supplemental notes 1 to 7, wherein an output of said gate charge-discharge circuit is connected to said first node through a resistance element.

(Supplemental Note 9)

The power semiconductor device according to any one of Supplemental notes 1 to 8, wherein said gate charge-discharge circuit comprises:

a booster circuit configured to charge said first node in said turn-ON period and said ON period; and a discharge transistor connected between said first node and a ground terminal, wherein said discharge transistor is turned OFF in said turn-ON period and said ON period and is turned ON in said turn-OFF period and said OFF period.

(Supplemental Note 10)

The power semiconductor device according to Supplemental note 9, wherein said discharge transistor has a parasitic bipolar transistor, and wherein a collector, an emitter and a base of said parasitic bipolar transistor are respectively connected to said power-supply terminal, said first node and a back gate of said discharge transistor.

4. Application to Electronic Control System of Vehicle

Figure 48:
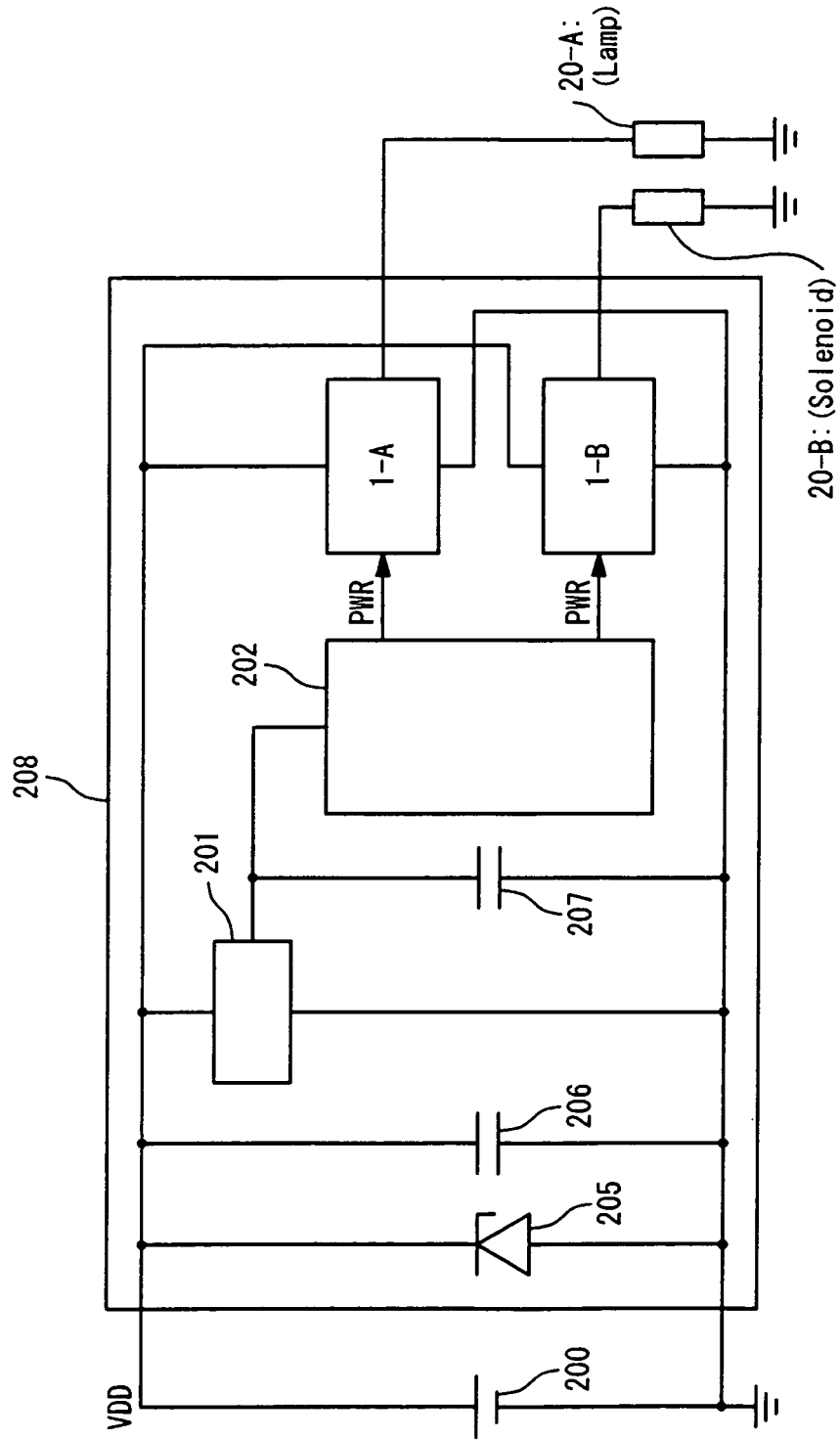
FIG. 48 is a block diagram showing an example where the power semiconductor device according to the embodiment of the present invention is applied to an electronic control system of a vehicle.

FIG. 48 shows an example where the power semiconductor device 1 according to the present embodiment is applied to an electronic control system of a vehicle. The electronic control system is provided with a battery power supply 200, an electronic control unit 208 and loads 20-A and 20-B. The electronic control unit 208 is supplied with power from the external battery power supply 200. Then, the electronic control unit 208 controls electric power supply to the load 20-A (e.g. lamp) and the load 20-B (e.g. solenoid).

The electronic control unit 208 is provided with the power semiconductor devices 1-A and 1-B, a power-supply IC 201, a microcomputer 202, a Zener diode 205 and capacitors 206 and 207. The capacitor 206 for stabilization and the Zener diode 205 for clamping voltage in response to dump surge are connected between a power-supply terminal and a ground terminal. The power-supply IC 201 and the power semiconductor devices 1-A and 1-B are supplied with the power-supply voltage VDD from the external battery power supply 200. The power-supply IC 201 generates a stabilized voltage from the power-supply voltage VDD and supplies the stabilized voltage to the microcomputer 202. The capacitor 207 for stabilization is connected between an output terminal of the power-supply IC 201 and the ground terminal.

The microcomputer 202 supplies the power-ON signal PWR to each of the power semiconductor devices 1-A and 1-B. The power semiconductor device 1-A is connected to the load 20-A and ON/OFF controls electric power supply to the load 20-A depending on the power-ON signal PWR input from the microcomputer 202. Similarly, the power semiconductor device 1-B is connected to the load 20-B and ON/OFF controls electric power supply to the load 20-B depending on the power-ON signal PWR input from the microcomputer 202.

When a vehicle is running, an alternator (not shown) generates electricity and charges the battery power supply 200. If disconnection between the alternator and the battery power supply 200 occurs, change in load of the alternator is caused and thus counter electromotive force is generated. This counter electromotive force is called the dump surge voltage. According to the present embodiment, thermal breakdown of the output transistors 10 of the power semiconductor devices 1-A and 1-B can be prevented even if such the dump surge voltage is generated.

While the exemplary embodiments of the present invention have been described above with reference to the attached drawings, the present invention is not limited to these exemplary embodiments and can be modified as appropriate by those skilled in the art without departing from the spirit and scope of the present invention.

What is claimed is:

1. A power semiconductor device comprising:
an output transistor connected between a power-supply terminal and an output terminal;
a gate charge-discharge circuit configured to charge and discharge a first node connected to a gate of said output transistor to ON/OFF control said output transistor;
a short switch circuit connected between said first node and said output terminal; and
a short control circuit configured to control said short switch circuit,
wherein a period when said output transistor is stably in an ON-state after said first node is charged is an ON period,
a period when said output transistor is stably in an OFF-state after said first node is discharged is an OFF period,
a transition period from said OFF period to said ON period is a turn-ON period, and
a transition period from said ON period to said OFF period is a turn-OFF period,
wherein in said turn-ON period, said ON period and said turn-OFF period, said short control circuit cuts off electrical connection between said first node and said output terminal through said short switch circuit, and
wherein in said OFF period, said short control circuit electrically connects said first node and said output terminal through said short switch circuit.

2. The power semiconductor device according to claim 1,
wherein said short switch circuit comprises a short transistor whose source, drain and gate are respectively connected to said output terminal, said first node and a second node,
wherein in said turn-ON period, said ON period and said turn-OFF period, said short control circuit turns OFF said short transistor, and
wherein in said OFF period, said short control circuit turns ON said short transistor.

3. The power semiconductor device according to claim 2,
wherein said short control circuit comprises at least one switch connected between said second node and said output terminal,
wherein in said turn-ON period, said ON period and said turn-OFF period, said short control circuit turns ON said at least one switch to electrically connect said second node and said output terminal, and
wherein in said OFF period, said short control circuit turns OFF said at least one switch to electrically connect said second node and said power-supply terminal.

4. The power semiconductor device according to claim 3,
wherein said at least one switch includes a first switch connected between said second node and said output terminal,
wherein said turn-OFF period includes a discharge period when said first node and said output terminal are discharged, and
wherein said first switch is turned ON in said turn-ON period, said ON period and said discharge period.

5. The power semiconductor device according to claim 4,
wherein said first switch is a N-channel transistor whose gate, source and drain are respectively connected to said first node, said output terminal and said second node.

6. The power semiconductor device according to claim 5,
wherein said drain of said N-channel transistor is connected to said second node through a delay circuit,
wherein said short control circuit further comprises a supplementary switch connected between said second node and said output terminal, and
wherein said supplementary switch is turned ON in said turn-ON period.

7. The power semiconductor device according to claim 4,
wherein said turn-OFF period further includes, following said discharge period, a negative voltage period when a negative voltage is applied to said output terminal,
wherein said short control circuit further comprises:
an overvoltage protection circuit connected between said power-supply terminal and said first node and configured to operate in said negative voltage period; and
a control circuit configured to activate a control signal only when said overvoltage protection circuit is in operation,
wherein said at least one switch further includes a second switch connected between said second node and said output terminal, and
wherein said second switch is turned ON when said control signal is activated and is turned OFF when said control signal is deactivated.

8. The power semiconductor device according to claim 1,
wherein said short switch circuit comprises a short transistor connected between said first node and said output terminal,
wherein a gate of said short transistor is connected to a second node,
wherein said short control circuit comprises a plurality of switches connected between said second node and said output terminal,
wherein in said turn-ON period, said ON period and said turn-OFF period, said short control circuit electrically connects said second node and said output terminal to turn OFF said short transistor, and
wherein in said OFF period, said short control circuit turns OFF at least a part of said plurality of switches to cut off electrical connection between said second node and said output terminal and electrically connects said second node and said power-supply terminal to turn ON said short transistor.

9. The power semiconductor device according to claim 8,
wherein said plurality of switches comprise a first switch and a second switch that are connected in series between said second node and said output terminal,
wherein said turn-OFF period includes a discharge period when said first node and said output terminal are discharged,
wherein a predetermined timer period starts concurrently with said discharge period and is equal to or longer than said discharge period,
wherein in said discharge period, said short control circuit turns ON said first switch,
wherein in said predetermined timer period, said short control circuit turns ON said second switch, and
wherein in said OFF period after said predetermined timer period is ended, said short control circuit turns OFF said second switch.

10. The power semiconductor device according to claim 9,
wherein said first switch is a N-channel transistor whose gate, source and drain are respectively connected to said first node, said output terminal and said second node.

11. The power semiconductor device according to claim 9,
wherein said short control circuit further comprises a timer circuit configured to activate a first control signal only in said predetermined timer period, and
wherein said second switch is turned ON at least when said first control signal is activated and is turned OFF in said OFF period after said first control signal is deactivated.

12. The power semiconductor device according to claim 11,
wherein said turn-OFF period further includes, following said discharge period, a negative voltage period when a negative voltage is applied to said output terminal,
wherein said short control circuit further comprises:
an overvoltage protection circuit connected between said power-supply terminal and said first node and configured to operate in said negative voltage period; and
a control circuit configured to activate a second control signal only when said overvoltage protection circuit is in operation,
wherein said plurality of switches further comprise a third switch that is connected in parallel to said first switch and said second switch between said second node and said output terminal, and
wherein said third switch is turned ON when said second control signal is activated and is turned OFF when said second control signal is deactivated.

13. The power semiconductor device according to claim 12,
wherein said third switch is connected to said second node through a delay circuit,
wherein said short control circuit further comprises a supplementary switch connected between said second node and said output terminal, and
wherein said supplementary switch is turned ON in said turn-ON period.

14. The power semiconductor device according to claim 11,
wherein said short switch circuit further comprises another short transistor,
wherein said short transistor and said another short transistor are connected in series between said first node and said output terminal, and
said another short transistor is turned OFF when said first control signal is activated.

15. The power semiconductor device according to claim 1,
wherein said short switch circuit comprises a first short switch and a second short switch that are connected in series between said first node and said output terminal,
wherein a control period starts concurrently with said turn-OFF period and is equal to or longer than said turn-OFF period,
wherein in said turn-ON period, said ON period and said control period, said short control circuit turns OFF at least one of said first short switch and said second short switch, and
wherein in said OFF period after said control period is ended, said short control circuit turns ON both of said first short switch and said second short switch.

16. The power semiconductor device according to claim 15,
wherein said short control circuit turns OFF said second short switch in said turn-ON period and said ON period and turns ON said second short switch in said turn-OFF period and said OFF period, and
wherein said short control circuit turns OFF said first short switch at least in said control period and turns ON said first short switch in said OFF period after said control period is ended.

17. The power semiconductor device according to claim 16,
wherein said first short switch is a first short transistor whose gate is connected to a second node,
wherein said short control circuit comprises at least one switch connected between said second node and said output terminal,
wherein at least in said control period, said short control circuit turns ON said at least one switch to electrically connect said second node and said output terminal, and
wherein in said OFF period after said control period is ended, said short control circuit turns OFF said at least one switch to electrically connect said second node and said power-supply terminal.

18. The power semiconductor device according to claim 17,
wherein said turn-OFF period includes a discharge period when said first node and said output terminal are discharged,
wherein said control period includes a predetermined timer period,
wherein said predetermined timer period starts concurrently with said discharge period and is equal to or longer than said discharge period,
wherein said short control circuit further comprises a timer circuit configured to activate a first control signal only in said predetermined timer period,
wherein said at least one switch comprises a first switch connected between said second node and said output terminal, and
wherein said first switch is turned ON at least when said first control signal is activated and is turned OFF in said OFF period after said first control signal is deactivated.

19. The power semiconductor device according to claim 1,
wherein said gate charge-discharge circuit comprises:
a booster circuit configured to charge said first node in said turn-ON period and said ON period; and
a discharge transistor connected between said first node and a ground terminal,
wherein said discharge transistor is turned OFF in said turn-ON period and said ON period and is turned ON in said turn-OFF period and said OFF period.

20. The power semiconductor device according to claim 19,
wherein said discharge transistor has a parasitic bipolar transistor, and
wherein a collector, an emitter and a base of said parasitic bipolar transistor are respectively connected to said power-supply terminal, said first node and a back gate of said discharge transistor.

* * * * *